United States Patent
Watanabe et al.

(10) Patent No.: US 11,309,181 B2
(45) Date of Patent: Apr. 19, 2022

(54) SPUTTERING APPARATUS, SPUTTERING TARGET, AND METHOD FOR FORMING SEMICONDUCTOR FILM WITH THE SPUTTERING APPARATUS

(71) Applicant: Semiconductor Energy Laboratory Co., Ltd., Atsugi (JP)

(72) Inventors: Masahiro Watanabe, Tochigi (JP); Takuya Handa, Tochigi (JP); Yasuharu Hosaka, Tochigi (JP); Kenichi Okazaki, Tochigi (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 658 days.

(21) Appl. No.: 15/609,148

(22) Filed: May 31, 2017

(65) Prior Publication Data
US 2017/0352540 A1   Dec. 7, 2017

(30) Foreign Application Priority Data

Jun. 6, 2016   (JP) .............................. JP2016-113023
Feb. 3, 2017   (JP) .............................. JP2017-018825

(51) Int. Cl.
*C23C 14/08* (2006.01)
*H01L 21/02* (2006.01)
(Continued)

(52) U.S. Cl.
CPC ...... *H01L 21/02631* (2013.01); *C23C 14/086* (2013.01); *C23C 14/3407* (2013.01);
(Continued)

(58) Field of Classification Search
None
See application file for complete search history.

(56) References Cited

U.S. PATENT DOCUMENTS 6,074,279 A * 6/2000 Yoshimura ............... B24C 1/08
                                                           451/37
8,293,595 B2   10/2012 Yamazaki et al.
(Continued)

FOREIGN PATENT DOCUMENTS

JP   07-335046 A    12/1995
JP   2011-066070 A   3/2011
(Continued)

OTHER PUBLICATIONS

Wager.J, "Oxide TFTs: A Progress Report", Information Display, 2016, vol. 32, No. 1, pp. 16-21.
(Continued)

*Primary Examiner* — Jason Berman
(74) *Attorney, Agent, or Firm* — Fish & Richardson P.C.

(57) ABSTRACT

To provide a sputtering apparatus capable of forming a semiconductor film in which impurities such as hydrogen or water are reduced. The sputtering apparatus is capable of forming a semiconductor film and includes a deposition chamber, a gas supply device connected to the deposition chamber, a gas refining device connected to the gas supply device, a vacuum pump for evacuating the deposition chamber, a target disposed in the deposition chamber, and a cathode disposed to face the target. The gas supply device is configured to supply at least one of an argon gas, an oxygen gas, and a nitrogen gas. The partial pressure of hydrogen molecules is lower than or equal to 0.01 Pa and the partial pressure of water molecules is lower than or equal to 0.0001 Pa in the deposition chamber.

20 Claims, 37 Drawing Sheets

(51) Int. Cl.

| | |
|---|---|
| *C23C 14/34* | (2006.01) |
| *H01J 37/34* | (2006.01) |
| *H01L 29/786* | (2006.01) |
| *H01L 29/66* | (2006.01) |
| *H01L 21/67* | (2006.01) |
| *C23C 14/54* | (2006.01) |
| *C23C 14/56* | (2006.01) |
| *H01L 21/687* | (2006.01) |
| *H01L 27/32* | (2006.01) |
| *G02F 1/1343* | (2006.01) |
| *G02F 1/1368* | (2006.01) |
| *G02F 1/13* | (2006.01) |

(52) U.S. Cl.
CPC .......... *C23C 14/3457* (2013.01); *C23C 14/54* (2013.01); *C23C 14/564* (2013.01); *C23C 14/566* (2013.01); *H01J 37/3426* (2013.01); *H01L 21/02565* (2013.01); *H01L 21/67017* (2013.01); *H01L 21/6719* (2013.01); *H01L 21/67196* (2013.01); *H01L 21/67201* (2013.01); *H01L 21/67207* (2013.01); *H01L 21/68764* (2013.01); *H01L 29/66969* (2013.01); *H01L 29/7869* (2013.01); *H01L 29/78633* (2013.01); *H01L 29/78648* (2013.01); *G02F 1/1303* (2013.01); *G02F 1/1368* (2013.01); *G02F 1/134309* (2013.01); *H01L 27/3262* (2013.01)

(56) References Cited

U.S. PATENT DOCUMENTS

| | | | |
|---|---|---|---|
| 8,709,864 B2 | 4/2014 | Yamazaki et al. | |
| 8,772,160 B2 | 7/2014 | Yamazaki et al. | |
| 8,858,844 B2 | 10/2014 | Yano et al. | |
| 9,331,156 B2 | 5/2016 | Yamazaki et al. | |
| 9,496,408 B2 | 11/2016 | Yamazaki et al. | |
| 9,647,128 B2 | 5/2017 | Yamazaki et al. | |
| 2011/0111558 A1 | 5/2011 | Yamazaki et al. | |
| 2011/0114999 A1 | 5/2011 | Yamazaki et al. | |
| 2011/0212605 A1 | 9/2011 | Yamazaki et al. | |
| 2011/0306165 A1* | 12/2011 | Ikisawa | H01L 29/7869 438/104 |
| 2012/0043198 A1 | 2/2012 | Yamazaki | |
| 2012/0064665 A1 | 3/2012 | Yamazaki | |
| 2012/0118726 A1* | 5/2012 | Yano | C04B 35/6261 204/192.25 |
| 2012/0132904 A1 | 5/2012 | Yamazaki | |
| 2012/0261657 A1* | 10/2012 | Takahashi | H01L 29/045 257/43 |
| 2013/0153889 A1 | 6/2013 | Yamazaki et al. | |
| 2013/0320338 A1 | 12/2013 | Ono et al. | |
| 2014/0241978 A1* | 8/2014 | Yamazaki | C30B 1/04 423/594.14 |
| 2014/0290569 A1 | 10/2014 | Yamazaki et al. | |
| 2014/0299873 A1 | 10/2014 | Yamazaki | |
| 2015/0318171 A1 | 11/2015 | Yamazaki | |
| 2015/0318359 A1 | 11/2015 | Shimomura et al. | |
| 2016/0079089 A1 | 3/2016 | Koezuka et al. | |
| 2016/0204271 A1 | 7/2016 | Yamazaki et al. | |
| 2016/0343589 A1 | 11/2016 | Yamazaki | |
| 2017/0256572 A1 | 9/2017 | Yamazaki | |
| 2017/0263773 A1 | 9/2017 | Yamazaki | |
| 2017/0338108 A1 | 11/2017 | Yamazaki et al. | |

FOREIGN PATENT DOCUMENTS

| | | |
|---|---|---|
| JP | 2011-105995 A | 6/2011 |
| JP | 2011-119720 A | 6/2011 |
| JP | 2011-195924 A | 10/2011 |
| JP | 2012-084861 A | 4/2012 |
| JP | 2012-134469 A | 7/2012 |
| JP | 2012-191072 A | 10/2012 |
| JP | 2013-001592 A | 1/2013 |
| JP | 2013-049884 A | 3/2013 |
| JP | 2013-084725 A | 5/2013 |
| JP | 2013-145876 A | 7/2013 |
| JP | 2014-007399 A | 1/2014 |
| JP | 2014-210702 A | 11/2014 |
| JP | 2016-026382 A | 2/2016 |
| JP | 2014/112363 | 1/2017 |
| JP | 2014/112376 | 1/2017 |
| KR | 2012-0093952 A | 8/2012 |
| KR | 2013-0009978 A | 1/2013 |
| KR | 2014-0006901 A | 1/2014 |
| KR | 2015-0028760 A | 3/2015 |
| TW | 201135849 | 10/2011 |
| TW | 201203364 | 1/2012 |
| TW | 201230195 | 7/2012 |
| TW | 201239989 | 10/2012 |
| TW | 201338156 | 9/2013 |
| TW | 201435118 | 9/2014 |
| TW | 201439027 | 10/2014 |
| WO | WO-2011/055769 | 5/2011 |
| WO | WO-2011/105183 | 9/2011 |
| WO | WO-2012/124444 | 9/2012 |
| WO | WO-2013/089115 | 6/2013 |
| WO | WO-2014/112363 | 7/2014 |
| WO | WO-2014/112376 | 7/2014 |

OTHER PUBLICATIONS

Ga—In/Ga—Zn, Binary Alloy Phase Diagrams, Second Edition, Plus Updates (on CD-ROM) version 1.0/Windows, ASM International.

International Search Report (Application No. PCT/IB2017/053076) dated Aug. 8, 2017.

Written Opinion (Application No. PCT/IB2017/053076) dated Aug. 8, 2017.

* cited by examiner

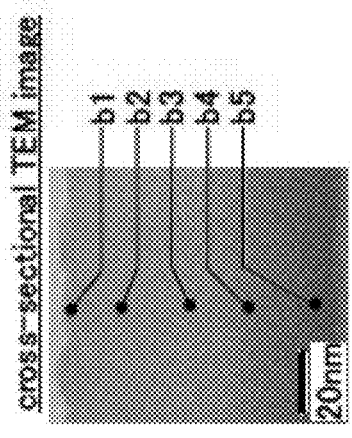
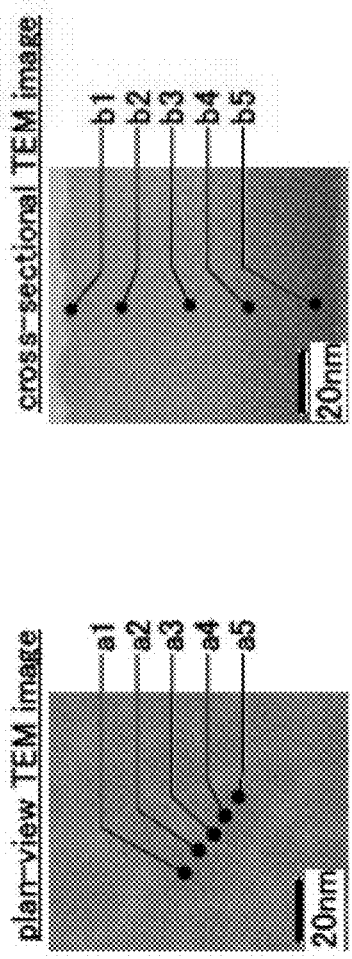
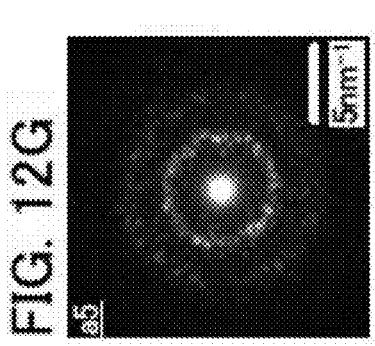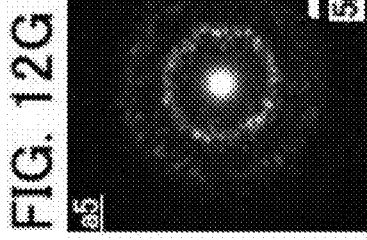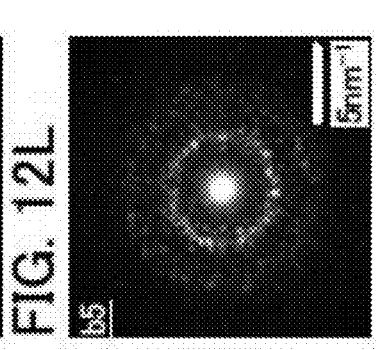
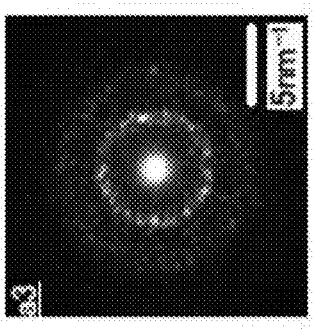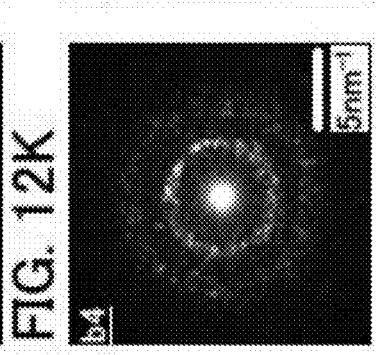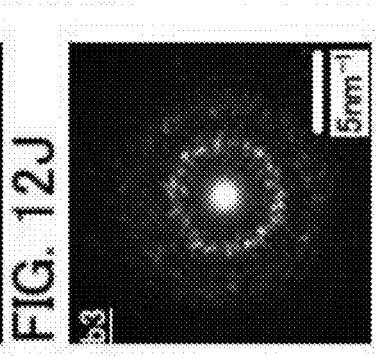
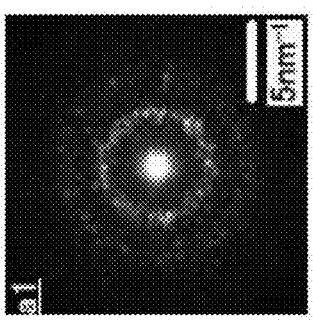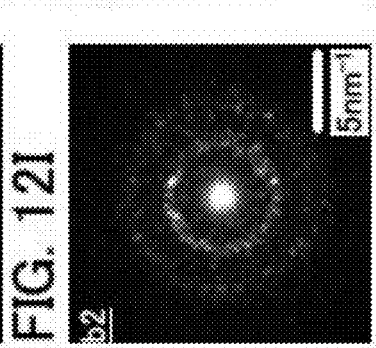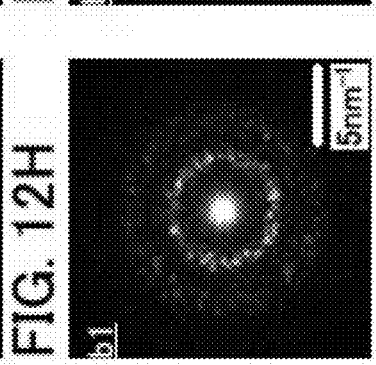

600

FIG. 36 Ga-In equilibrium diagram

SPUTTERING APPARATUS, SPUTTERING TARGET, AND METHOD FOR FORMING SEMICONDUCTOR FILM WITH THE SPUTTERING APPARATUS

TECHNICAL FIELD

One embodiment of the present invention relates to a sputtering apparatus and a method for forming a semiconductor film with use of the sputtering apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, the term "semiconductor device" means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

BACKGROUND ART

As a semiconductor material that can be used in a transistor, an oxide semiconductor has attracted attention. For example, Patent Document 1 discloses a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium.

Patent Document 2 proposes a sputtering apparatus for depositing IGZO, which is an oxide semiconductor. With the apparatus, partial pressures of a reaction gas at surfaces of a plurality of targets are set equal in order to sputter the targets at the same speed.

Non-Patent Document 1 discusses a structure including an oxide semiconductor with a two-layer stacked structure of an indium zinc oxide and IGZO as an active layer of a transistor.

REFERENCE

Patent Document

[Patent Document 1] Japanese Published Patent Application No. 2014-007399
[Patent Document 2] Japanese Published Patent Application No. 2013-049884

Non-Patent Document

[Non-Patent Document 1] John F. Wager, "Oxide TFTs: A Progress Report", Information Display 1/16, SID 2016, January/February 2016, Vol. 32, No. 1, pp. 16-21

DISCLOSURE OF INVENTION

In Non-Patent Document 1, a channel-protective bottom-gate transistor achieves high field-effect mobility ($\mu$=62 $cm^2V^{-1}s^{-1}$). An active layer of the transistor has a two-layer stacked structure of an indium zinc oxide and IGZO, and the thickness of the indium zinc oxide where a channel is formed is 10 nm. However, the S value (the subthreshold swing (SS)), which is one of transistor characteristics, is as large as 0.41 V/decade. Moreover, the threshold voltage ($V_{th}$), which is also one of transistor characteristics, is -2.9 V, which means that the transistor has a normally-on characteristic.

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and a current flows through the transistor.

Furthermore, in a transistor that uses an oxide semiconductor film in a channel region, oxygen vacancies which are formed in the oxide semiconductor film adversely affect the transistor characteristics. For example, oxygen vacancies formed in the oxide semiconductor film are bonded with hydrogen to serve as a carrier supply source. The carrier supply source generated in the oxide semiconductor film causes a change in the electrical characteristics, typically, shift in the threshold voltage, of the transistor including the oxide semiconductor film. For this reason, it is preferable that hydrogen, water, or the like contained in the oxide semiconductor film be as little as possible.

Note that in Patent Document 2, although the partial pressures of a reaction gas during sputtering and the like are described, impurities (e.g., hydrogen or water) during the sputtering are not particularly mentioned.

In view of the above, an object of one embodiment of the present invention is to provide a sputtering apparatus capable of forming a semiconductor film in which impurities such as hydrogen or water are reduced. Another object of one embodiment of the present invention is to provide a sputtering apparatus capable of forming an oxide semiconductor film in which impurities such as hydrogen or water are reduced. Another object of one embodiment of the present invention is to provide a method for forming a semiconductor film with use of the sputtering apparatus. Another object of one embodiment of the present invention is to provide a novel semiconductor device. Another object of one embodiment of the present invention is to provide a method for manufacturing a novel semiconductor device.

Note that the description of the above object does not disturb the existence of other objects. In one embodiment of the present invention, there is no need to achieve all of these objects. Objects other than the above objects will be apparent from and can be derived from the description of the specification and the like.

One embodiment of the present invention is a sputtering apparatus capable of forming a semiconductor film, including a deposition chamber; a gas supply device connected to the deposition chamber; a gas refining device connected to the gas supply device; a vacuum pump for evacuating the deposition chamber; a target disposed in the deposition chamber; and a cathode disposed to face the target. The gas supply device is configured to supply at least one of an argon gas, an oxygen gas, and a nitrogen gas. The partial pressure of hydrogen molecules is lower than or equal to $1\times10^{-2}$ Pa and the partial pressure of water molecules is lower than or equal to $1\times10^{-4}$ Pa in the deposition chamber.

In the above embodiment, the argon gas supplied to the deposition chamber through the gas refining device preferably has a dew point of lower than or equal to −120° C., a water molecule content of less than or equal to 0.05 ppb, and a hydrogen molecule content of less than or equal to 0.5 ppb.

In the above embodiment, the oxygen gas supplied to the deposition chamber through the gas refining device preferably has a dew point of lower than or equal to −120° C., a water molecule content of less than or equal to 0.1 ppb, and a hydrogen molecule content of less than or equal to 0.5 ppb.

In the above embodiment, the nitrogen gas supplied to the deposition chamber through the gas refining device preferably has a dew point of lower than or equal to −120° C., a water molecule content of less than or equal to 0.04 ppb, and a hydrogen molecule content of less than or equal to 0.09 ppb.

In the above embodiment, the target is preferably a metal oxide or a metal nitride oxide. In the above embodiment, the target preferably includes at least one of In, Ga, Zn, Al, Si, Y, B, Ti, Fe, Ni, Ge, Zr, Mo, La, Ce, Nd, Hf, Ta, W, Mg, V, Be, and Cu. In the above embodiment, the target preferably includes In, Ga, and Zn.

In the above embodiment, the vacuum pump is preferably configured to at least adsorb a water molecule. In the above embodiment, the vacuum pump preferably includes at least one of a turbo molecular pump, a cryotrap, and a cryopump.

In the above embodiment, the cathode is preferably configured to oscillate.

In the above embodiment, the pressure in the deposition chamber in a standby state is preferably less than or equal to $8.0\times10^{-5}$ Pa.

Another embodiment of the present invention is a sputtering target used for forming a semiconductor film. Particulate structure bodies are formed on a surface of the sputtering target. The sputtering target preferably includes In, Ga, and Zn, and the atomic ratio of Ga in the structure body is preferably higher than the atomic proportion of Ga in the whole sputtering target.

Another embodiment of the present invention is a method for forming a semiconductor film with a sputtering apparatus. The sputtering apparatus includes a deposition chamber, a gas supply device connected to the deposition chamber, a gas refining device connected to the gas supply device, a vacuum pump for evacuating the deposition chamber, a target disposed in the deposition chamber, and a cathode disposed to face the target. The method includes a first step of transferring a substrate to the deposition chamber; a second step of introducing at least one of an argon gas and an oxygen gas to the deposition chamber; and a third step of depositing a sputtered particle on the substrate from the target. In the first to third steps, the partial pressure of hydrogen molecules is lower than or equal to $1\times10^{-2}$ Pa and the partial pressure of water molecules is lower than or equal to $1\times10^{-4}$ Pa in the deposition chamber. In the second step, the proportion of the oxygen gas in total gases is higher than or equal to 0% and lower than or equal to 30%.

Another embodiment of the present invention is a method for forming a semiconductor film with a sputtering apparatus. The sputtering apparatus includes a deposition chamber, a gas supply device connected to the deposition chamber, a gas refining device connected to the gas supply device, a vacuum pump for evacuating the deposition chamber, a target disposed in the deposition chamber, and a cathode disposed to face the target. The method includes a first step of transferring a substrate to the deposition chamber; a second step of introducing at least one of an argon gas and a nitrogen gas to the deposition chamber; and a third step of depositing a sputtered particle on the substrate from the target. In the first to third steps, the partial pressure of hydrogen molecules is lower than or equal to $1\times10^{-2}$ Pa and the partial pressure of water molecules is lower than or equal to $1\times10^{-4}$ Pa in the deposition chamber. In the second step, the proportion of the nitrogen gas in total gases is higher than or equal to 10% and lower than or equal to 100%.

In the above embodiment, the first to third steps are preferably performed at a temperature lower than 200° C. In the above embodiment, the first to third steps are preferably performed at a temperature without intentional heating.

According to one embodiment of the present invention, a sputtering apparatus capable of forming a semiconductor film in which impurities such as hydrogen or water are reduced can be provided. According to one embodiment of the present invention, a sputtering apparatus capable of forming an oxide semiconductor film in which impurities such as hydrogen or water are reduced can be provided. According to one embodiment of the present invention, a method for forming a semiconductor film with use of the sputtering apparatus can be provided. According to one embodiment of the present invention, a novel semiconductor device can be provided. According to one embodiment of the present invention, a method for manufacturing a novel semiconductor device can be provided.

Note that the description of these effects does not disturb the existence of other effects. One embodiment of the present invention does not necessarily achieve all the effects. Other effects will be apparent from and can be derived from the description of the specification, the drawings, the claims, and the like.

BRIEF DESCRIPTION OF DRAWINGS

FIGS. 12A and 12B are TEM images of samples and FIGS. 12C to 12L are electron diffraction patterns thereof.

BEST MODE FOR CARRYING OUT THE INVENTION

Figure 1:
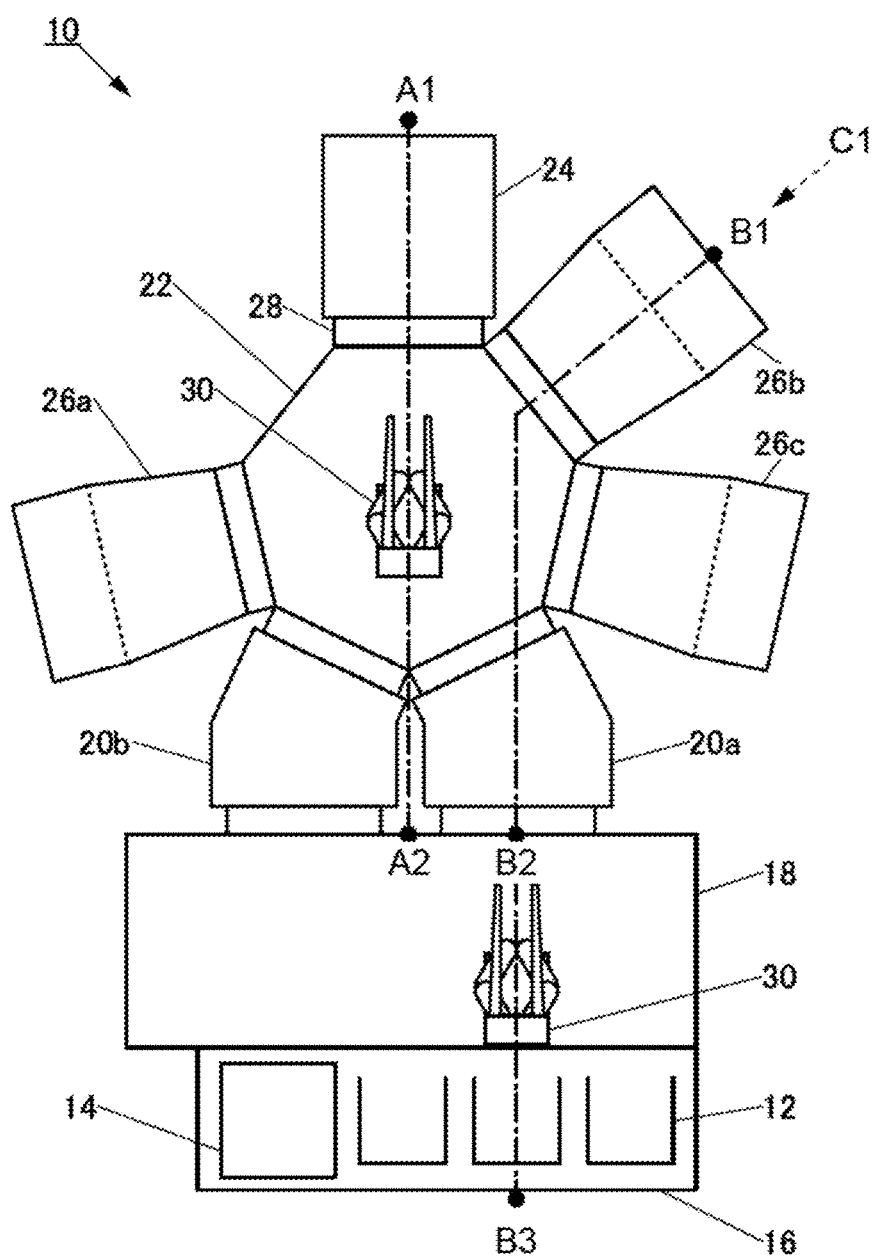
FIG. 1 is a top view illustrating a sputtering apparatus.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Ordinal numbers such as "first," "second," and "third" in this specification are used in order to avoid confusion among components, and the terms do not limit the components numerically.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made as appropriate depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow between the source and the drain through the channel region. Note that in this specification and the like, a channel region refers to a region through which current mainly flows.

Functions of a "source" and a "drain" are sometimes interchanged with each other when a transistor of opposite polarity is used or when the direction of current flow is changed in circuit operation, for example. Therefore, the terms "source" and "drain" can be interchanged with each other in this specification and the like.

In this specification and the like, the term "electrically connected" includes the case where components are connected through an "object having any electric function." There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean that "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

In this specification and the like, a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

In this specification and the like, In:Ga:Zn=4:2:3 or a neighborhood of In:Ga:Zn=4:2:3 refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4 ($2 \leq Zn \leq 4$). In:Ga:Zn=5:1:6 or a neighborhood of In:Ga:Zn=5:1:6 refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). In:Ga:Zn=1:1:1 or a neighborhood of In:Ga:Zn=1:1:1 refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

Embodiment 1

In this embodiment, a sputtering apparatus and a method for forming a semiconductor film with use of the sputtering apparatus, which are embodiments of the present invention, will be described with reference to FIG. 1 to FIG. 8.

<1-1. Structural Example of Sputtering Apparatus>

One embodiment of the present invention is a sputtering apparatus capable of forming a semiconductor film. The sputtering apparatus includes a deposition chamber, a gas supply device connected to the deposition chamber, a gas refining device connected to the gas supply device, a vacuum pump for evacuating the deposition chamber, a target disposed in the deposition chamber, and a cathode disposed to face the target.

With use of the sputtering apparatus of one embodiment of the present invention, a high-purity semiconductor film in which the concentration of impurities (in particular, hydrogen or water) is low can be formed.

A typical example of the semiconductor film is an oxide semiconductor film. Using an oxide semiconductor film with a low impurity concentration and low density of defect states is preferred, in which case a transistor with excellent electrical characteristics can be fabricated. Here, the state in which impurity concentration is low and density of defect states is low (the number of oxygen vacancies is small) is referred to as "highly purified intrinsic" or "substantially highly purified intrinsic". Note that impurities in an oxide semiconductor film are typically water, hydrogen, and the like. In this specification and the like, reducing or removing water and hydrogen from the oxide semiconductor film is referred to as dehydration or dehydrogenation in some cases. Moreover, adding oxygen to the oxide semiconductor film is referred to as oxygen addition in some cases, and a state in which oxygen in excess of the stoichiometric composition is contained due to the oxygen addition is referred to as an oxygen-excess state in some cases.

A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V.

First, details of a structural example of the sputtering apparatus of one embodiment of the present invention, which is capable of forming a semiconductor film, will be described with reference to FIG. 1 to FIGS. 3A and 3B. With the sputtering apparatus illustrated in FIG. 1 to FIGS. 3A and 3B, entry of impurities (in particular, hydrogen or water) into the semiconductor film can be inhibited.

FIG. 1 is a schematic top view of a single wafer multi-chamber sputtering apparatus 10.

The sputtering apparatus 10 includes an atmosphere-side substrate supply chamber 16 including a cassette port 12 for storing substrates and an alignment port 14 for performing alignment of substrates, an atmosphere-side substrate transfer chamber 18 through which a substrate is transferred from the atmosphere-side substrate supply chamber 16, a load lock chamber 20a where a substrate is carried in and the pressure is switched between reduced pressure and atmospheric pressure, an unload lock chamber 20b where a substrate is carried out and the pressure is switched between reduced pressure and atmospheric pressure, a transfer chamber 22 where a substrate is transferred in a vacuum, a substrate heating chamber 24 where a substrate is heated, and deposition chambers 26a, 26b, and 26c in each of which a sputtering target is set for deposition.

Note that a plurality of cassette ports 12 may be provided as illustrated in FIG. 1 (in FIG. 1, three cassette ports 12 are provided).

The atmosphere-side substrate transfer chamber 18 is connected to the load lock chamber 20a and the unload lock chamber 20b, the load lock chamber 20a and the unload lock chamber 20b are connected to the transfer chamber 22, and the transfer chamber 22 is connected to the substrate heating chamber 24 and the deposition chambers 26a, 26b, and 26c.

Gate valves 28 are provided for connecting portions between chambers so that each chamber except the atmosphere-side substrate supply chamber 16 and the atmosphere-side substrate transfer chamber 18 can be independently kept under vacuum. In each of the atmosphere-side substrate transfer chamber 18 and the transfer chamber 22, a transfer robot 30 is provided, which is capable of transferring glass substrates.

It is preferable that the substrate heating chamber 24 also serve as a plasma treatment chamber. In the sputtering apparatus 10, it is possible to transfer a substrate without being exposed to the air between treatment and treatment; therefore, adsorption of impurities on a substrate can be suppressed. In addition, the order of deposition, heat treatment, and the like can be freely determined. Note that the number of transfer chambers, the number of deposition chambers, the number of load lock chambers, the number of unload lock chambers, and the number of substrate heating chambers are not limited to the above, and the numbers thereof can be set as appropriate depending on the space for placement or the process conditions.

Figure 2A:
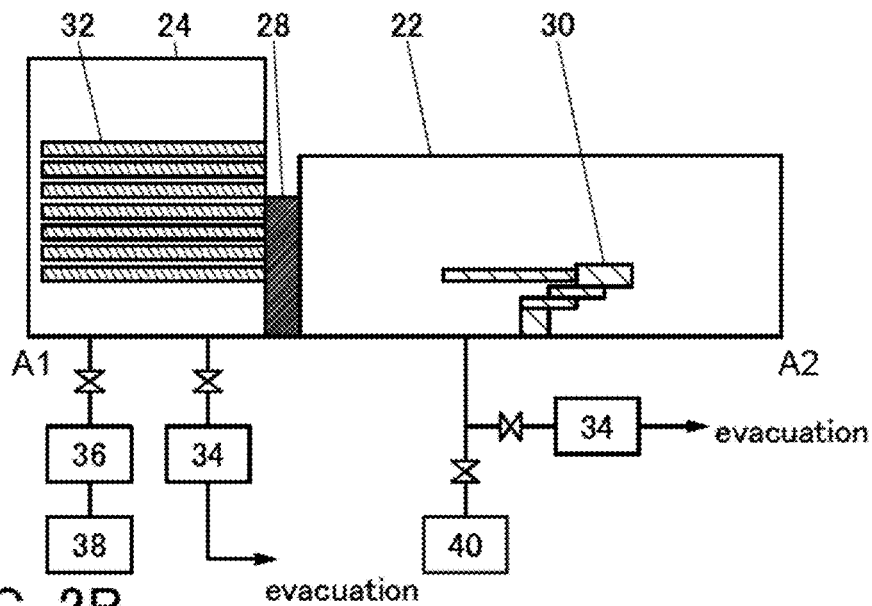
FIGS. 2A to 2C are cross-sectional views illustrating a sputtering apparatus.
Figure 2B:
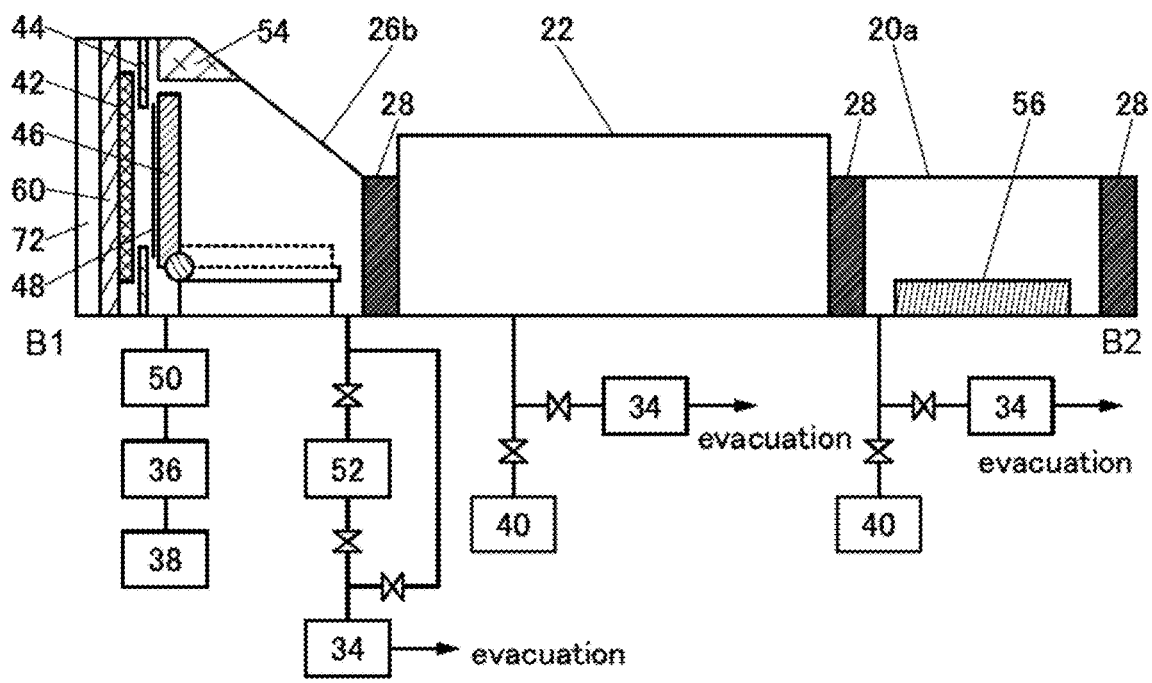
Figure 2C:
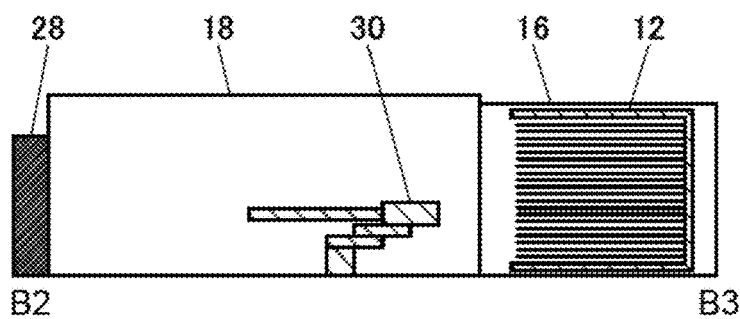

FIGS. 2A to 2C are cross-sectional views of the sputtering apparatus 10 illustrated in FIG. 1 which are taken along dashed-dotted lines A1-A2, B1-B2, and B2-B3, respectively.

FIG. 2A is a cross-sectional view of the substrate heating chamber 24 and the transfer chamber 22. The substrate heating chamber 24 illustrated in FIG. 2A includes a plurality of heating stages 32 which can hold substrates.

Note that although the substrate heating chamber 24 including the seven heating stages 32 is illustrated in FIG. 2A, one embodiment of the present invention is not limited to such a structure. The number of heating stages 32 may be greater than or equal to one and less than seven. Alternatively, the number of heating stages 32 may be greater than or equal to eight. It is preferable to increase the number of heating stages 32 because a plurality of substrates can be subjected to heat treatment at the same time, which leads to an increase in productivity. Furthermore, the substrate heating chamber 24 is connected to a vacuum pump 34 through a valve. As the vacuum pump 34, a dry pump and a mechanical booster pump can be used, for example.

As a heating mechanism which can be used for the substrate heating chamber 24, a resistance heater or the like may be used for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas.

The substrate heating chamber 24 is connected to a gas refining device 38 through a gas supply device 36. Note that although the number of gas supply devices 36 and the number of gas refining devices 38 are the same as the number of kinds of gases, the figure illustrates only one gas supply device 36 and one gas refining device 38 for simplicity. As the gases introduced into the substrate heating chamber 24, a gas whose dew point is −80° C. or lower, preferably −100° C. or lower, more preferably −120° C. or lower can be used; for example, an oxygen gas, a nitrogen gas, and a rare gas (e.g., an argon gas) can be used.

The transfer chamber 22 includes the transfer robot 30. The transfer robot 30 includes a plurality of movable portions and an arm for holding a substrate, and can transfer a substrate to each chamber. Furthermore, the transfer chamber 22 is connected to a vacuum pump 34 and a cryopump 40 through valves. With such a structure, evacuation is performed inside the transfer chamber 22 using the vacuum pump 34 from the atmospheric pressure to a low or medium vacuum (approximately several hundred pascals to 0.1 pascals) and then the valves are switched and evacuation is performed using the cryopump 40 from the medium vacuum to a high or ultrahigh vacuum (approximately 0.1 Pa to $1×10^{-7}$ Pa).

Alternatively, two or more cryopumps 40 may be connected in parallel to the transfer chamber 22. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 2B is a cross-sectional view of the deposition chamber 26b, the transfer chamber 22, and the load lock chamber 20a. Details of the deposition chamber (also referred to as a sputtering chamber or a film-formation chamber) are described with reference to FIG. 2B.

In the deposition chamber 26b illustrated in FIG. 2B, a target 42, a backing plate 60 connected to the target 42, a cathode 72 on the opposite side of the backing plate 60 from the target 42, a deposition shield 44, and a substrate stage 46 are provided.

Note that here, a substrate 48 is placed on the substrate stage 46. Although not illustrated, the substrate stage 46 may include a substrate holding mechanism which holds the substrate 48, a rear heater which heats the substrate 48 from the back surface, or the like.

Note that the substrate stage 46 is held substantially perpendicular to a floor during deposition and is held substantially parallel to the floor when the substrate is delivered. In FIG. 2B, the position where the substrate stage 46 is held when the substrate is delivered is denoted by a dashed line. With such a structure, the probability that dust or a particle which might be mixed into the film during deposition is attached to the substrate 48 can be lowered as compared to the case where the substrate stage 46 is held parallel to the floor. However, there is a possibility that the substrate 48 falls when the substrate stage 46 is held vertically (90°) to the floor; therefore, the angle of the substrate stage 46 to the floor is preferably greater than or equal to 80° and less than 90°.

The deposition shield 44 can suppress deposition of a particle which is sputtered from the target 42 on a region where deposition is not needed. Moreover, the deposition shield 44 is preferably processed to prevent accumulated sputtered particles from being separated. For example, blasting treatment which increases surface roughness may be performed, or roughness may be formed on the surface of the deposition shield 44.

For the target 42, a metal oxide or a metal nitride oxide is preferably used. When a metal oxide, for example, is used for the target 42, an oxide semiconductor film can be formed with the sputtering apparatus 10. Furthermore, when a metal nitride oxide, for example, is used for the target 42, an oxynitride semiconductor film can be formed with the sputtering apparatus 10. Note that even when a metal oxide is used for the target 42, an oxynitride semiconductor film can be formed by using a nitrogen gas as the deposition gas.

Note that the target 42 preferably includes one or a plurality of In, Ga, Zn, Al, Si, Y, B, Ti, Fe, Ni, Ge, Zr, Mo, La, Ce, Nd, Hf, Ta, W, Mg, V, Be, and Cu. In particular, the target 42 preferably includes In, Ga, and Zn.

The deposition chamber 26b is connected to the gas supply device 36 through a gas heating mechanism 50. The gas heating mechanism 50 is connected to the gas refining device 38 through the gas supply device 36. With the gas heating mechanism 50, gases to be introduced into the deposition chamber 26b can be heated to a temperature higher than or equal to 40° C. and lower than or equal to 400° C., preferably higher than or equal to 50° C. and lower than or equal to 200° C. Note that although the number of provided gas heating mechanisms 50, the number of provided gas supply devices 36, and the number of provided gas refining devices 38 are the same as the number of kinds of gases, the figure illustrates one gas heating mechanism 50, one gas supply device 36, and one gas refining device 38 for simplicity. FIG. 2B illustrates a structure provided with the gas heating mechanism 50, but one embodiment of the present invention is not limited to this structure. The gas heating mechanism 50 is not necessarily provided.

The gas supply device 36 has a function of supplying one or a plurality of an argon gas, an oxygen gas, and a nitrogen gas.

The argon gas supplied to the deposition chamber 26b through the gas refining device 38 preferably has a dew point of lower than or equal to −120° C., a water molecule content of less than or equal to 0.05 ppb, and a hydrogen molecule content of less than or equal to 0.5 ppb. The oxygen gas supplied to the deposition chamber 26b through the gas refining device 38 preferably has a dew point of lower than or equal to −120° C., a water molecule content of less than or equal to 0.1 ppb, and a hydrogen molecule content of less than or equal to 0.5 ppb. The nitrogen gas supplied to the deposition chamber 26b through the gas refining device 38 preferably has a dew point of −120° C. or lower, a water molecule content of less than or equal to 0.04 ppb, and a hydrogen molecule content of less than or equal to 0.09 ppb.

The semiconductor film of one embodiment of the present invention can be formed using, for example, an argon gas, a nitrogen gas, an oxygen gas, a combination of an argon gas and an oxygen gas, a combination of an argon gas and a nitrogen gas, or a combination of an argon gas, a nitrogen gas, and an oxygen gas.

The deposition chamber 26b is connected to a turbo molecular pump 52 and a vacuum pump 34 through valves.

The deposition chamber 26b is provided with a cryotrap 54.

The cryotrap 54 is a mechanism which can adsorb a molecule (or an atom) having a relatively high melting point, such as water. The turbo molecular pump 52 is capable of stably evacuating a large-sized molecule (or atom), needs low frequency of maintenance, and thus enables high productivity, whereas it has a low capability in evacuating hydrogen and water. Hence, the cryotrap 54 is connected to the deposition chamber 26b so as to have a high capability in evacuating water or the like. The temperature of a refrigerator of the cryotrap 54 is set to be lower than or equal to 100 K, preferably lower than or equal to 80 K. In the case where the cryotrap 54 includes a plurality of refrigerators, it is preferable to set the temperature of each refrigerator at a different temperature because efficient evacuation is possible. For example, the temperatures of a first-stage refrigerator and a second-stage refrigerator may be set at 100 K or lower and 20 K or lower, respectively.

Note that the evacuation method of the deposition chamber 26b is not limited to this, and a structure similar to that in the evacuation method described above for the transfer chamber 22 (the evacuation method using the cryopump and the vacuum pump) may be employed. Needless to say, the evacuation method of the transfer chamber 22 may have a structure similar to that of the deposition chamber 26b (the evacuation method using the turbo molecular pump and the vacuum pump). The evacuation method of the deposition chamber 26b may have a structure (not illustrated) using a vacuum pump and a cryotrap in a combination. In other words, the evacuation method provided for the deposition chamber 26b preferably has at least a function of adsorbing water molecules.

In the deposition chamber 26b, the partial pressure of hydrogen molecules is preferably lower than or equal to $1 \times 10^{-2}$ Pa, and the partial pressure of water molecules is preferably lower than or equal to $1 \times 10^{-4}$ Pa. In the deposition chamber 26b in a standby state, the pressure is lower than or equal to $8.0 \times 10^{-5}$ Pa, preferably lower than or equal to $5.0 \times 10^{-5}$ Pa, more preferably lower than or equal to $1.0 \times 10^{-5}$ Pa. The above values of the partial pressure of hydrogen molecules and the partial pressure of water molecules do not vary either in a standby state or in a deposition state (a plasma discharge state) of the deposition chamber of the sputtering apparatus.

Note that a total pressure and partial pressures in the deposition chamber 26b can be measured using a mass analyzer. For example, Qulee CGM-051, a quadrupole mass analyzer (also referred to as Q-mass) manufactured by ULVAC, Inc. may be used.

The partial pressure of hydrogen molecules in the deposition chamber 26b, the partial pressure of water molecules in the deposition chamber 26b, and the pressure in the deposition chamber 26b in a standby state are set to the values in above ranges, the impurity concentration of the semiconductor film can be reduced.

The backing plate 60 has a function of holding the target 42. The cathode 72 has a function of applying voltage (for example, negative voltage) to the target 42.

Next, the details of the transfer chamber 22 and the load lock chamber 20a which are illustrated in FIG. 2B and the atmosphere-side substrate transfer chamber 18 and the atmosphere-side substrate supply chamber 16 which are illustrated in FIG. 2C are described. Note that FIG. 2C is a cross-sectional view of the atmosphere-side substrate transfer chamber 18 and the atmosphere-side substrate supply chamber 16.

For the transfer chamber 22 illustrated in FIG. 2B, the description of the transfer chamber 22 illustrated in FIG. 2A can be referred to.

The load lock chamber 20a includes a substrate delivery stage 56. When a pressure in the load lock chamber 20a becomes atmospheric pressure by being increased from reduced pressure, the substrate delivery stage 56 receives a substrate from the transfer robot 30 provided in the atmosphere-side substrate transfer chamber 18. After that, the load lock chamber 20a is evacuated into vacuum so that the pressure therein becomes reduced pressure and then the transfer robot 30 provided in the transfer chamber 22 receives the substrate from the substrate delivery stage 56.

Furthermore, the load lock chamber 20a is connected to the vacuum pump 34 and the cryopump 40 through valves. For a method for connecting evacuation systems such as the vacuum pump 34 and the cryopump 40, the description of the method for connecting the transfer chamber 22 can be referred to, and the description thereof is omitted here. Note that the unload lock chamber 20b illustrated in FIG. 1 can have a structure similar to that of the load lock chamber 20a.

Since the atmosphere-side substrate transfer chamber 18 includes the transfer robot 30, delivery and receipt of a substrate between the cassette port 12 and the load lock chamber 20a can be performed using the transfer robot 30. Furthermore, a mechanism for inhibiting entry of dust or a particle, such as a high-efficiency particulate air (HEPA) filter, may be provided above the atmosphere-side substrate transfer chamber 18 and the atmosphere-side substrate supply chamber 16. The cassette port 12 can hold a plurality of substrates.

In the semiconductor film formed with the sputtering apparatus, entry of impurities can be suitably inhibited.

<1-2. Structural Example of Deposition Chamber>

Next, details of the deposition chamber 26b included in the sputtering apparatus 10 will be described with reference to FIGS. 3A and 3B.

Figure 3A:
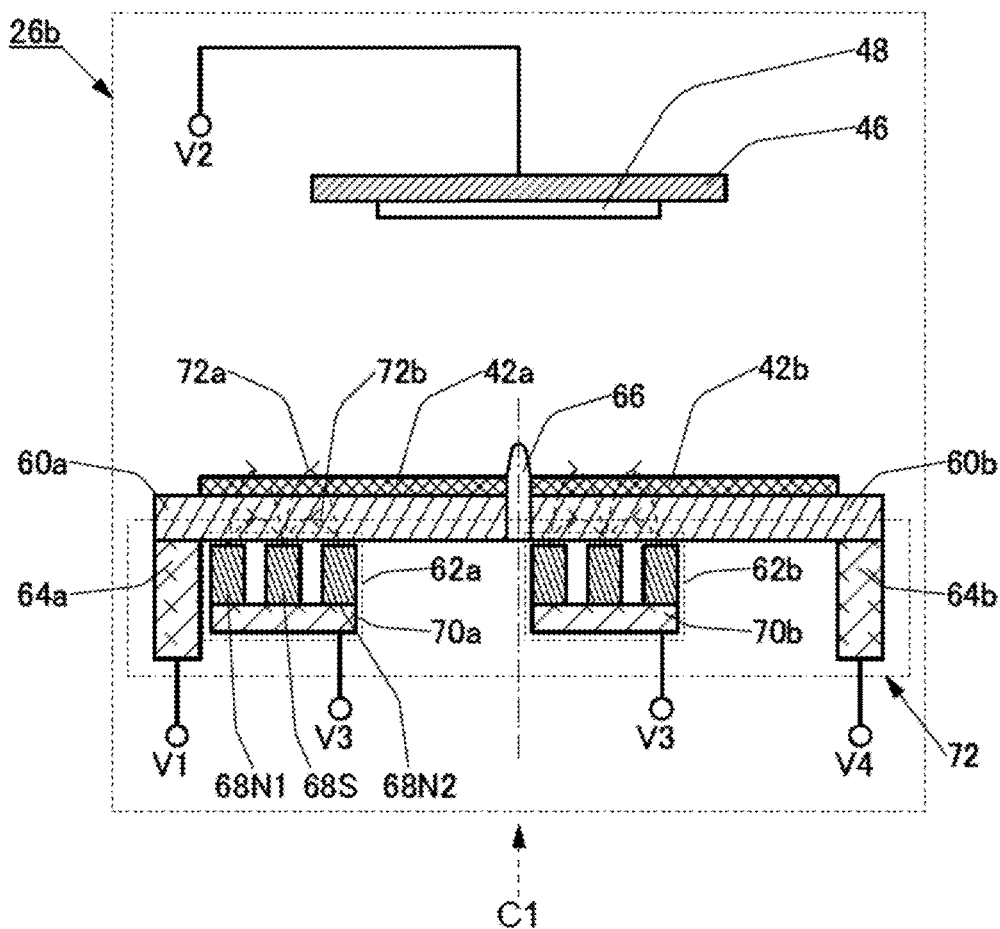
FIG. 3A is a cross-sectional view illustrating a deposition chamber in a sputtering apparatus and FIG. 3B is a plan view illustrating a magnet unit in the sputtering apparatus.

FIG. 3A is a cross-sectional view of the deposition chamber 26b of the sputtering apparatus 10. FIG. 3B is a plan view of a magnet unit 62a and a magnet unit 62b of the sputtering apparatus. Note that an arrow C1 in FIG. 3A corresponds to an arrow C1 in FIG. 1. That is, FIG. 3A is a cross-sectional view taken in the direction of the arrow C1 in FIG. 1.

FIG. 3A schematically illustrates the inside of the deposition chamber 26b. For example, the substrate stage 46, the substrate 48, a target 42a, a target 42b, a backing plate 60a, a backing plate 60b, and the cathode 72 are illustrated. The cathode 72 includes a target holder 64a, a target holder 64b, a member 66, the magnet unit 62a, and the magnet unit 62b.

Note that although FIGS. 2A to 2C illustrate one target 42 for easy understanding, the target 42 may be formed of a plurality of targets (the target 42a and the target 42b) as illustrated in FIG. 3A. The target 42 may be formed of three or more targets.

The target 42a is placed over the backing plate 60a. The backing plate 60a is placed over the target holder 64a. The magnet unit 62a is placed under the target 42a with the backing plate 60a positioned therebetween. The target 42b is placed over the backing plate 60b. The backing plate 60b is placed over the target holder 64b. The magnet unit 62b is placed under the target 42b with the backing plate 60b positioned therebetween.

Figure 3B:
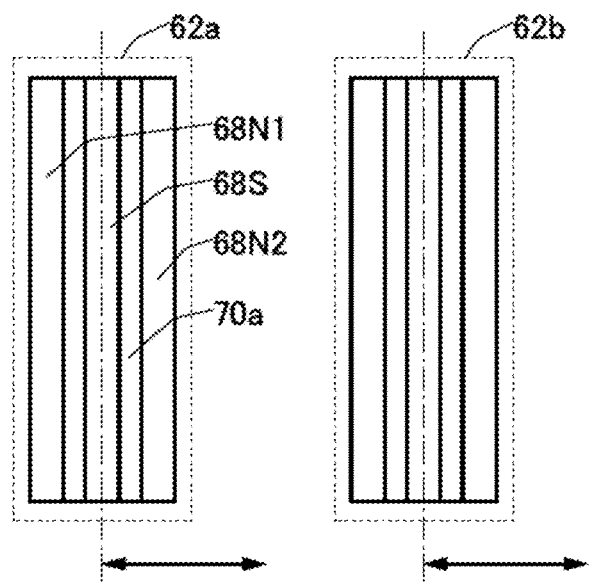

As illustrated in FIGS. 3A and 3B, the magnet unit 62a includes a magnet 68N1, a magnet 68N2, a magnet 68S, and a magnet holder 70a. Note that in the magnet unit 62a, the magnet 68N1, the magnet 68N2, and the magnet 68S are placed over the magnet holder 70a. The magnet 68N1, the magnet 68N2, and the magnet 68S are spaced. The magnet unit 62b has a structure similar to that of the magnet unit 62a. Note that when the substrate 48 is transferred to the deposition chamber 26b, the substrate 48 is placed in contact with the substrate stage 46.

The target 42a, the backing plate 60a, and the target holder 64a are separated from the target 42b, the backing plate 60b, and the target holder 64b by the member 66. Note that the member 66 is preferably an insulator. The member 66 may be a conductor or a semiconductor. The member 66 may be a conductor or a semiconductor whose surface is covered with an insulator.

The target holder 64a and the backing plate 60a are fixed to each other with a screw (e.g., a bolt) and have the same potential. The target holder 64a has a function of supporting the target 42a with the backing plate 60a positioned therebetween. The target holder 64b and the backing plate 60b are fixed to each other with a screw (e.g., a bolt) and have the same potential. The target holder 64b has a function of supporting the target 42b with the backing plate 60b positioned therebetween. The backing plate 60a has a function of fixing the target 42a. The backing plate 60b has a function of fixing the target 42b.

Lines of magnetic force 72a and 72b formed by the magnet unit 62a are illustrated in FIG. 3A.

As illustrated in FIG. 3B, the magnet unit 62a has a structure in which the magnet 68N1 having a rectangular or substantially rectangular shape, the magnet 68N2 having a rectangular or substantially rectangular shape, and the magnet 68S having a rectangular or substantially rectangular shape are fixed to the magnet holder 70a. The magnet unit 62a can be oscillated horizontally as illustrated in an arrow in FIG. 3B. For example, the magnet unit 62a may be oscillated with a beat of greater than or equal to 0.1 Hz and less than or equal to 1 kHz.

The magnetic field over the target 42a changes in accordance with oscillation of the magnet unit 62a. The region with an intense magnetic field is a high-density plasma region; thus, sputtering of the target 42a easily occurs in the vicinity of the region. The same applies to the magnet unit 62b.

Since the magnet unit 62a and the magnet unit 62b included in the cathode 72 have a function of oscillating, the uniformity of thickness or film quality of the semiconductor film can be increased. Thus, a method for forming a semiconductor film with a high yield can be provided.

<1-3. Process Flow Chart Showing Method for Forming Semiconductor Film>

Next, a method for forming a semiconductor film with use of the sputtering apparatus illustrated in FIG. 1 to FIGS. 3A and 3B will be described with reference to FIG. 2B and FIG. 4.

Figure 4:
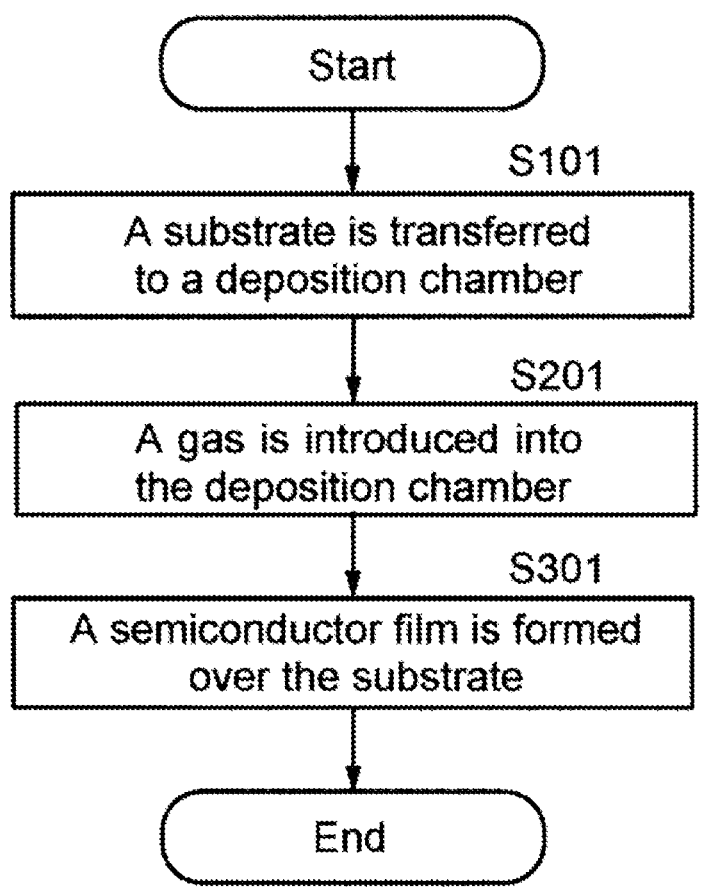
FIG. 4 is a process flow chart showing a method for forming a semiconductor.

FIG. 4 is a process flow chart showing the method for forming a semiconductor film. The semiconductor film of one embodiment of the present invention is formed through at least first to third steps.

First, a substrate is transferred to a deposition chamber (see Step S101 in FIG. 4).

The step of transferring the substrate 48 to the deposition chamber 26b in the sputtering apparatus 10 illustrated in FIG. 2B corresponds to Step S101 in FIG. 4.

The temperature of the substrate 48 in deposition influences the electrical properties of a semiconductor film. The higher the substrate temperature is, the higher the crystallinity and reliability of the semiconductor film can be. In contrast, the lower the substrate temperature is, the lower the crystallinity of the semiconductor film can be and the higher the carrier mobility thereof can be. In particular, the lower the substrate temperature in deposition is, the more the field-effect mobility at a low gate voltage (e.g., higher than 0 V and lower than or equal to 2 V) is notably increased in a transistor including the semiconductor film.

The temperature of the substrate 48 may be higher than or equal to room temperature (25° C.) and lower than 200° C., preferably higher than or equal to room temperature and lower than or equal to 150° C. (typically 130° C.). The substrate temperature in the above range is suitable for the case of using a large glass substrate. In particular, when the substrate temperature in deposition of the semiconductor film is room temperature, i.e., the substrate is not subjected to intentional heating, the substrate can be favorably prevented from being bent or warped.

The substrate 48 may be cooled with a cooling mechanism or the like provided for the substrate stage 46.

By setting the temperature of the substrate 48 to higher than or equal to 100° C. and lower than or equal to 150° C. (typically 130° C.), water in the semiconductor film can be removed. Removal of water, which serves as an impurity, in this manner improves the field-effect mobility and reliability of the transistor at the same time.

The temperature of the substrate 48 is set to higher than or equal to 100° C. and lower than or equal to 150° C. for removal of water, whereby the sputtering apparatus can be prevented from warping due to overheat. This leads to an improvement in productivity of a semiconductor device. The productivity is stabilized, so that a large-scale production apparatus is easy to employ. Thus, a large display device manufactured using a large substrate can be easily manufactured.

When deposition is performed at a temperature of the substrate 48 of higher than or equal to room temperature and lower than or equal to 150° C., the shallow defect states (sDOS) in the oxide semiconductor can be reduced.

Next, a gas is introduced into the deposition chamber (see Step S201 in FIG. 4).

The step of introducing a gas from the gas refining device 38 and the gas supply device 36 to the deposition chamber 26b in the sputtering apparatus 10 illustrated in FIG. 2B corresponds to Step S201 in FIG. 4.

As described above, the argon gas supplied to the deposition chamber 26b preferably has a dew point of lower than or equal to −120° C., a water molecule content of less than or equal to 0.05 ppb, and a hydrogen molecule content of less than or equal to 0.5 ppb. The oxygen gas supplied to the deposition chamber 26b preferably has a dew point of lower than or equal to −120° C., a water molecule content of less than or equal to 0.1 ppb, and a hydrogen molecule content of less than or equal to 0.5 ppb. The nitrogen gas supplied to the deposition chamber 26b preferably has a dew point of −120° C. or lower, a water molecule content of less than or equal to 0.04 ppb, and a hydrogen molecule content of less than or equal to 0.09 ppb.

Note that in the case where an oxygen gas is used as a deposition gas in the second step, the proportion of the oxygen gas in the whole of introduced gases (also referred to as oxygen flow rate percentage) is set high, in which case a semiconductor film with high crystallinity can be formed. In contrast, when the oxygen flow rate percentage is set low, the semiconductor film can have low crystallinity and high carrier mobility.

Specifically, in order to increase the crystallinity of the semiconductor film, the proportion of the oxygen gas in the whole of introduced gases in the second step is preferably higher than 30% and lower than or equal to 100%. By setting the oxygen flow rate percentage in the above range, a CAAC-OS to be described later can be favorably formed.

In order to decrease the crystallinity of the semiconductor film, the proportion of the oxygen gas in the whole of introduced gases in the second step is preferably higher than or equal to 0% and lower than or equal to 30%. By setting the oxygen flow rate percentage in the above range, a CAC-OS to be described later can be favorably formed.

In the case where a nitrogen gas is used as a deposition gas in the second step, the proportion of the nitrogen gas in the whole of introduced gases (also referred to as nitrogen flow rate percentage) is preferably higher than or equal to 10% and lower than or equal to 100%. By setting the nitrogen flow rate percentage in the above range, vacancies in the semiconductor film can be filled with nitrogen and the carrier density thereof can be increased in some cases.

Next, a semiconductor film is formed over the substrate (see Step S301 in FIG. 4).

In the third step, voltage is applied to the target in an atmosphere containing the deposition gas, whereby sputtered particles are deposited on the substrate.

<1-4. Deposition Model of Semiconductor Film>

Figure 5A:
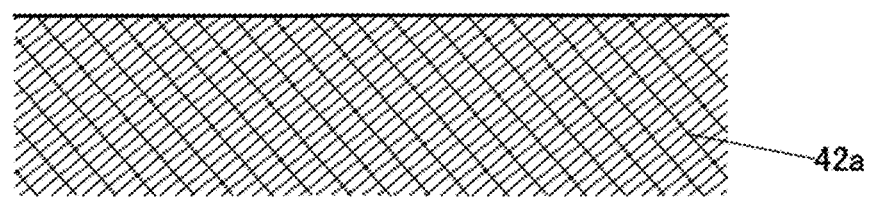
FIGS. 5A to 5C illustrate a cross section of a target and the vicinity of the target.
Figure 5B:
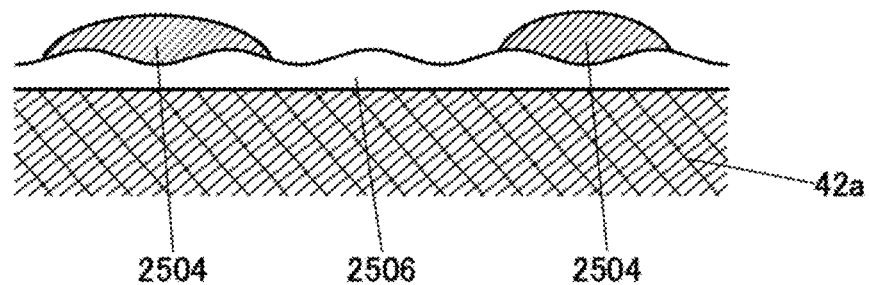
Figure 5C:
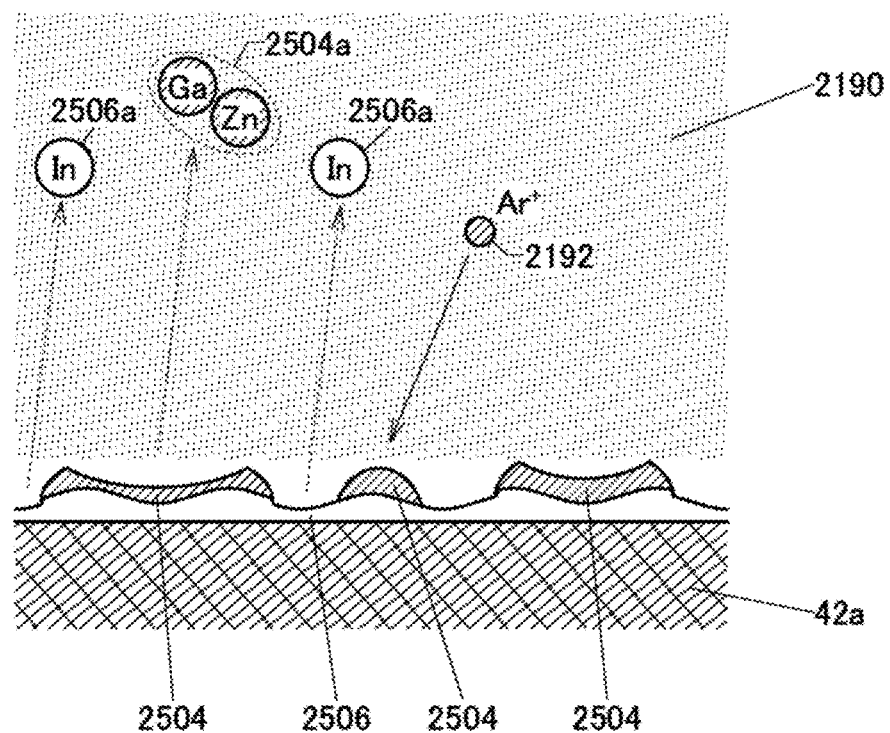

Here, a deposition model of the semiconductor film in the third step will be described with reference to FIGS. 5A to 5C. FIGS. 5A to 5C illustrate a cross section of the target and the vicinity of the target.

Note that in FIGS. 5A to 5C, the target is assumed to be an In—Ga—Zn oxide target containing In, Ga, and Zn.

FIGS. 5A to 5C are cross-sectional views of the vicinity of the target 42a illustrated in FIGS. 3A and 3B. Note that FIG. 5A shows the state of the target before use, FIG. 5B illustrates the state of the target before deposition, and FIG. 5C illustrates the state of the target during the deposition. In FIGS. 5A to 5C, the target 42a, plasma 2190, cations 2192, sputtered particles 2504a and 2506a, and the like are illustrated.

In FIG. 5A, a surface of the target 42a is relatively flat and its composition (e.g., the composition ratio between In, Ga, and Zn) is uniform. In contrast, in FIG. 5B, unevenness is formed on the surface of the target 42a by sputtering performed in advance or the like, and compositional segregation occurs. The unevenness and the segregation can occur because of plasma (e.g., Ar plasma) generated in the sputtering performed in advance. Note that FIG. 5B illustrates a segregation region 2504 and a segregation region 2506. The segregation region 2504 has a spherical or particulate shape in some cases. Here, the segregation region 2504 is a region containing a large amount of Ga (a Ga-rich region), and the segregation region 2506 is a region containing a large amount of In (an In-rich region). For example, in the case where the target 42a contains In, Ga, and Zn, the atomic proportion of Ga in the segregation region 2504 is preferably higher than the atomic proportion of Ga in the whole target 42a. Note that the segregation region 2504 is a region containing a large amount of Ga and a large amount of Zn (a Ga,Zn-rich region) in some cases.

The segregation region 2504, which contains a large amount of Ga, is formed because the melting point of Ga lower than that of In allows part of Ga to be melted by heat applied to the target 42a during the plasma treatment and aggregate. The segregation region 2504 formed in this manner sometimes has a spherical or particulate shape due to surface tension. In the process of forming the segregation region 2504 by Ga aggregation, In and/or Zn is expeled out from the segregation region 2504 and In and/or Zn segregates outside the segregation region 2504 in some cases. For example, In and/or Zn is formed in the shape of a layer on a surface of the segregation region 2504 with a particulate shape in some cases.

[Step 1]

In FIG. 5C, an argon gas or an oxygen gas is separated into the cation 2192 and an electron (not illustrated), and the plasma 2190 is created. After that, the cations 2192 in the plasma 2190 are accelerated toward the target 42a (here, an In—Ga—Zn oxide target). The cations 2192 collide with the In—Ga—Zn oxide target, whereby the sputtered particles 2504a and 2506a are generated and ejected from the In—Ga—Zn oxide target. Note that since the sputtered particles 2504a are ejected from the segregation region 2504, they form a Ga-rich (Ga,Zn-rich) cluster in some cases. Since the sputtered particles 2506a are ejected from the segregation region 2506, they form an In-rich cluster in some cases.

When an In—Ga—Zn oxide target is used, presumably, the sputtered particles 2504a are preferentially sputtered first from the segregation region 2504. This is because Ga and Zn, whose relative atomic masses are lower than the relative atomic mass of In, are preferentially ejected from the In—Ga—Zn oxide target by collision of the cation 2192 with the In—Ga—Zn oxide target.

[Step 2]

Next, as illustrated in FIG. 5C, the sputtered particles 2506a are sputtered from the segregation region 2506.

As illustrated in FIG. 5C, the target 42a is subjected to sputtering throughout the deposition; thus, generation of the segregation region 2504 and disappearance of the segregation region 2504 occur intermittently.

By repeating Step 1 and Step 2, a CAC-OS to be described later, which is a semiconductor film of one embodiment of the present invention, can be formed.

That is, the sputtered particles (2504a and 2506a) are respectively ejected from the In-rich segregation region 2506 and the Ga,Zn-rich segregation region 2504 to be deposited over the substrate. The In-rich regions are connected to each other in a cloud-like manner over the substrate, so that the CAC-OS can be formed. Due to the CAC-OS film in which the In-rich regions are connected to each other in a cloud-like manner, a transistor including the CAC-OS film has high on-state current ($I_{on}$) and high field-effect mobility (µFE).

Note that a deposition model of a CAC-OS film using an argon gas is described above as an example. In that case, a number of oxygen vacancies might be contained in the CAC-OS. In a CAC-OS containing a number of oxygen vacancies, shallow defect states (also referred to as sDOS) are formed in some cases. When sDOS is formed in the CAC-OS, the sDOS serves as a carrier trap, resulting in a reduction in on-state current and field-effect mobility.

Therefore, in the case where the CAC-OS is formed using an argon gas, oxygen is preferably supplied to the CAC-OS after the CAC-OS is formed, in which case oxygen vacancies in the CAC-OS are filled with oxygen and thus the sDOS is reduced.

In the deposition chamber 26b illustrated in FIG. 2B, the partial pressure of hydrogen molecules in the third step is preferably lower than or equal to $1\times10^{-2}$ Pa, and the partial pressure of water molecules is preferably lower than or equal to $1\times10^{-4}$ Pa.

By setting the partial pressure of hydrogen molecules and the partial pressure of water molecules in the above ranges, impurities (e.g., hydrogen or water) in the semiconductor film can be reduced.

<1-5. Total Pressure and Partial Pressures of Gases in Deposition Chamber>

Next, a total pressure and partial pressures of gases in a deposition chamber in a sputtering apparatus will be described with reference to FIG. 6 to FIG. 8.

Note that the sputtering apparatus corresponds to the sputtering apparatus 10 illustrated in FIG. 1 to FIGS. 3A and 3B. As a target disposed in the deposition chamber in the sputtering apparatus, a metal oxide target containing In, Ga, and Zn is used. The composition ratio (atomic ratio) of the metal oxide target is that In:Ga:Zn=4:2:4.1.

Figure 6:
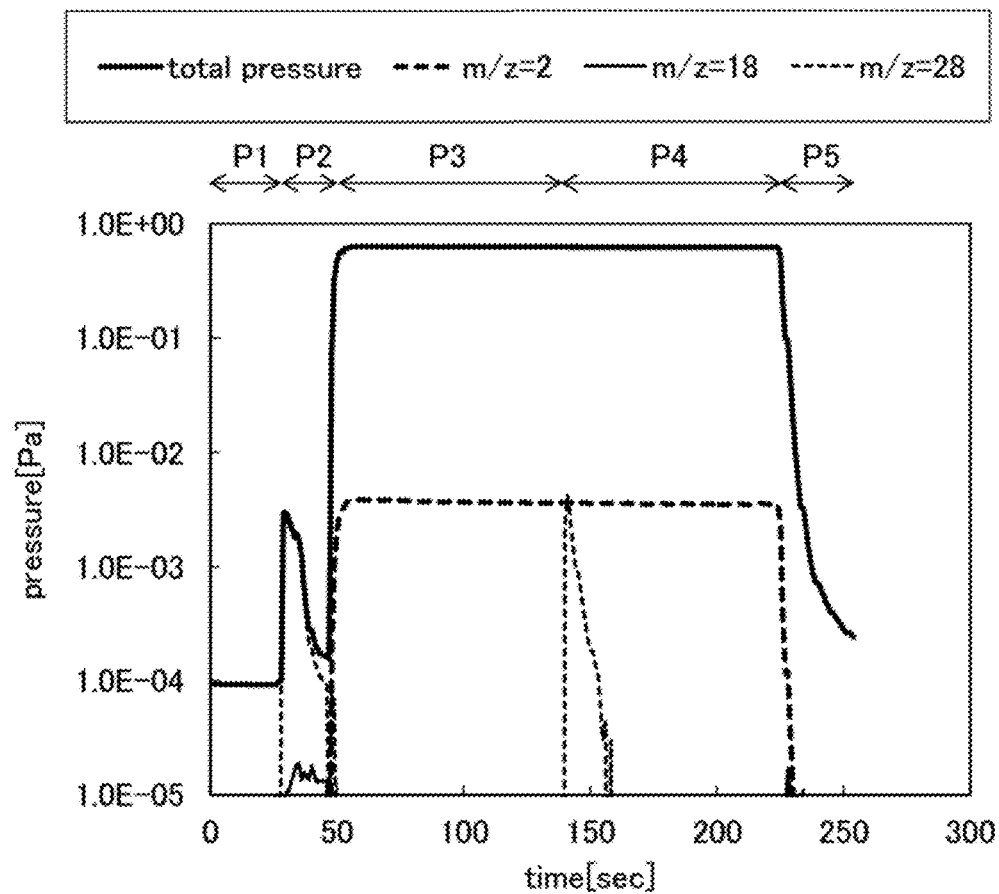
FIG. 6 shows a total pressure and partial pressures of gases in a deposition chamber in a sputtering apparatus.
Figure 7:
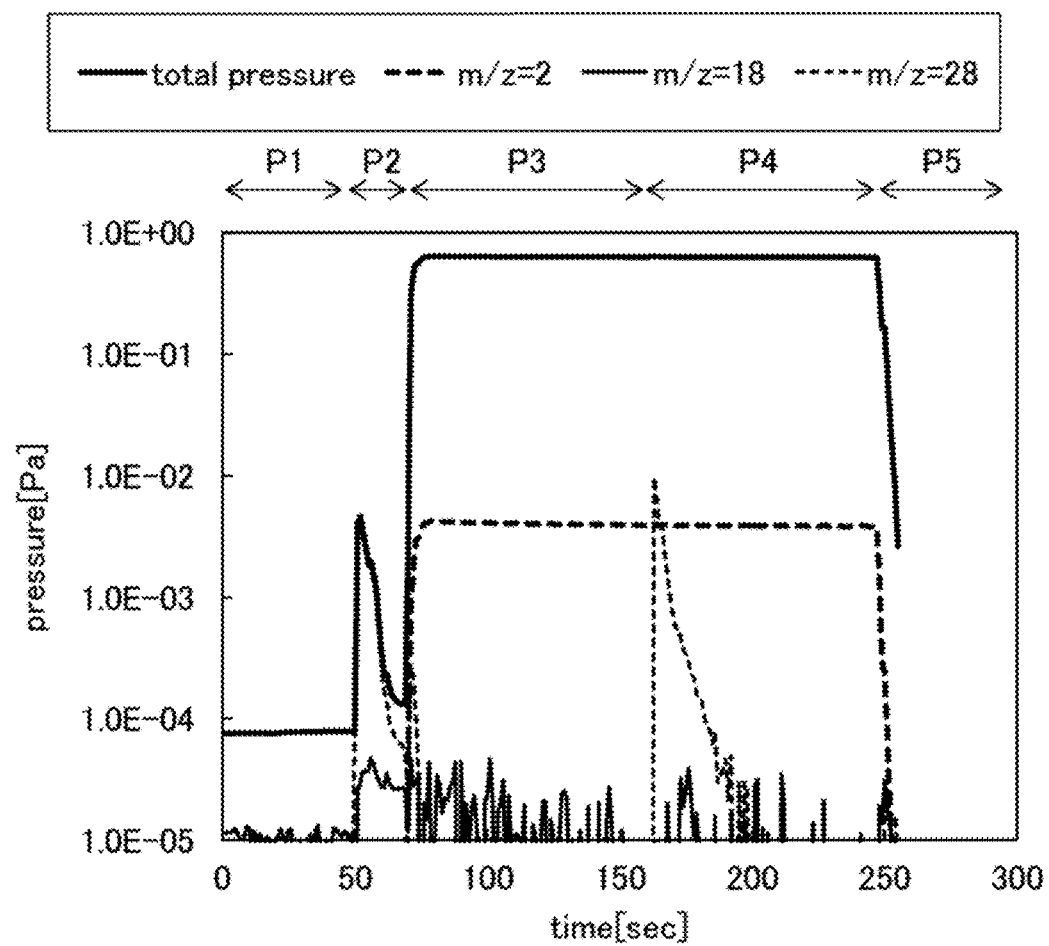
FIG. 7 shows a total pressure and partial pressures of gases in a deposition chamber in a sputtering apparatus.
Figure 8:
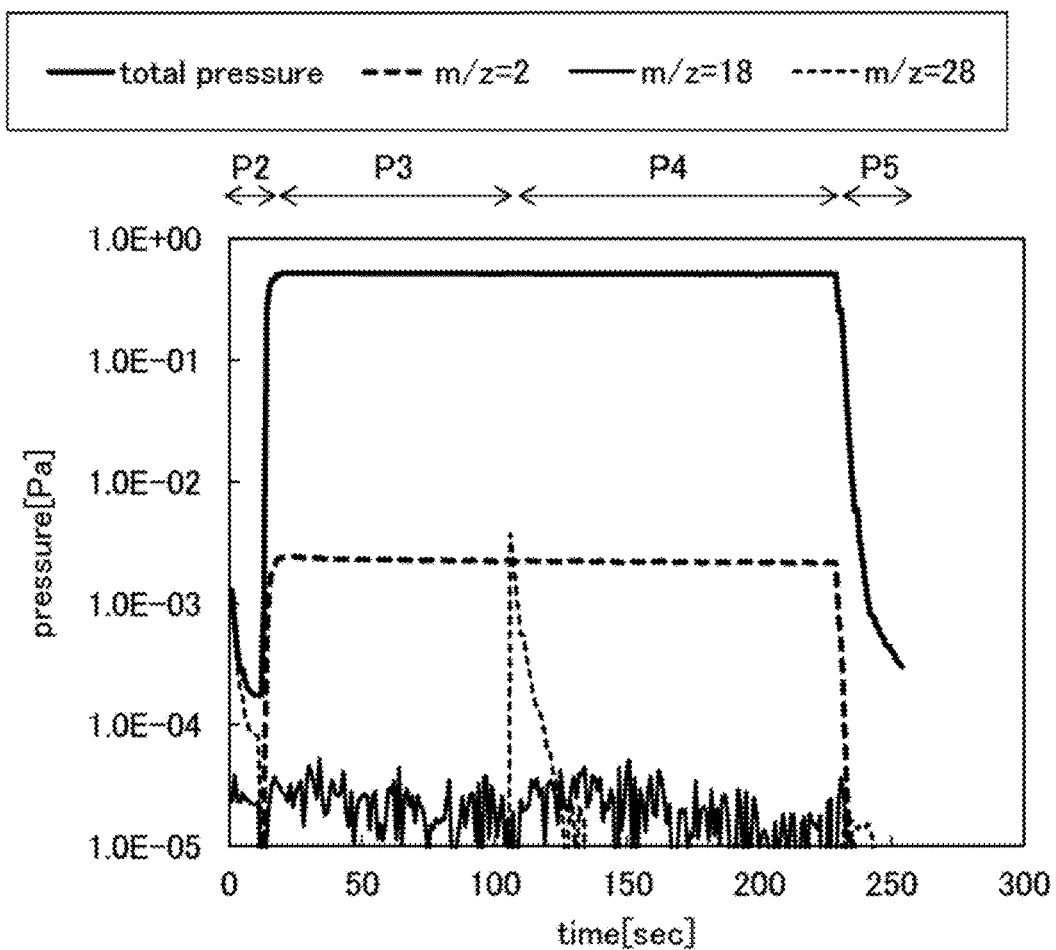
FIG. 8 shows a total pressure and partial pressures of gases in a deposition chamber in a sputtering apparatus.

FIG. 6 to FIG. 8 each show the total pressure and the partial pressures of the gases in the deposition chamber in the sputtering apparatus. Note that the measurement results of the total pressure and the partial pressures of the gases in the deposition chamber which are shown in FIG. 6 to FIG. 8 are those for forming a semiconductor film over a substrate.

The total pressure and the partial pressures of the gases in the deposition chamber are measured when a semiconductor film is formed over a substrate under conditions shown in Table 1 (Conditions 1 to 3).

TABLE 1

|  | Target [atomic ratio] | Substrate temperature [° C.] | Oxygen flow rate percentage [%] | Pressure [Pa] | Power [kW] |
| --- | --- | --- | --- | --- | --- |
| Condition 1 | In:Ga:Zn = 4:2:4.1 | R.T. | 10 | 0.6 | 2.5 |
| Condition 2 | In:Ga:Zn = 4:2:4.1 | 130 | 10 | 0.6 | 2.5 |
| Condition 3 | In:Ga:Zn = 4:2:4.1 | 170 | 30 | 0.6 | 2.5 |

FIG. 6, FIG. 7, and FIG. 8 show the total pressure and the partial pressures of the gases in the deposition chamber in the case where a semiconductor film is formed under Condition 1, Condition 2, and Condition 3, respectively, shown in Table 1. In each of FIG. 6 to FIG. 8, the vertical axis represents pressure [Pa] and the horizontal axis represents time [sec].

Note that in FIG. 6 to FIG. 8, a period P1 represents a standby state, i.e., a period before the substrate is transferred to the deposition chamber; a period P2 represents a period in which the substrate is transferred to the deposition chamber; a period P3 represents a period in which the gas is introduced into the deposition chamber and the pressure is adjusted; a period P4 represents a period in which the semiconductor film is formed over the substrate, i.e., a period in which plasma is discharged; and a period P5 represents a period in which the substrate is transferred from the deposition chamber.

The results in FIG. 6 to FIG. 8 indicate that the partial pressure of water molecules (m/z=18) in the deposition chamber is the lowest under Condition 1, that is, a condition where the substrate temperature during deposition is low. Clear tendencies of the total pressure and the partial pressures other than the partial pressure of water molecules are not observed among Conditions 1 to 3. Note that in Conditions 1 to 3, when the period P1 is changed to the period P2 and when the period P3 is changed to the period P4, that is, when the deposition chamber is opened or closed, nitrogen molecules (m/z=28) are detected.

In addition, it is found that under each of Conditions 1 to 3, the partial pressure of hydrogen molecules (m/z=2) is less than or equal to $1\times10^{-2}$ Pa and the partial pressure of water molecules (m/z=18) is less than or equal to $1\times10^{-4}$ Pa throughout the periods P1 to P5.

With the use of the sputtering apparatus of one embodiment of the present invention, the partial pressure of hydrogen molecules and the partial pressure of water molecules in deposition can be low, entry of impurities such as hydrogen and water into the semiconductor film can be inhibited, and the semiconductor film can have a low density of defect states.

At least part of this embodiment can be implemented in combination with any of the other embodiments and the other examples described in this specification as appropriate.

Embodiment 2

In this embodiment, an oxide semiconductor film that can be used as a semiconductor film of one embodiment of the present invention will be described.

An oxide semiconductor is classified into a single crystal oxide semiconductor and a non-single-crystal oxide semiconductor. Examples of the non-single-crystal oxide semiconductor include a cloud-aligned composite oxide semiconductor (CAC-OS), a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor. Among the non-single crystal structures, the amorphous structure has the highest density of defect states, whereas CAAC-OS has the lowest density of defect states.

First, the structure of the CAC-OS that is an oxide semiconductor film will be described with reference to FIG. 9 and FIG. 10. Note that FIG. 9 and FIG. 10 are schematic cross-sectional views illustrating the concept of the CAC-OS.

<2-1. Composition of CAC-OS>

Figure 9:
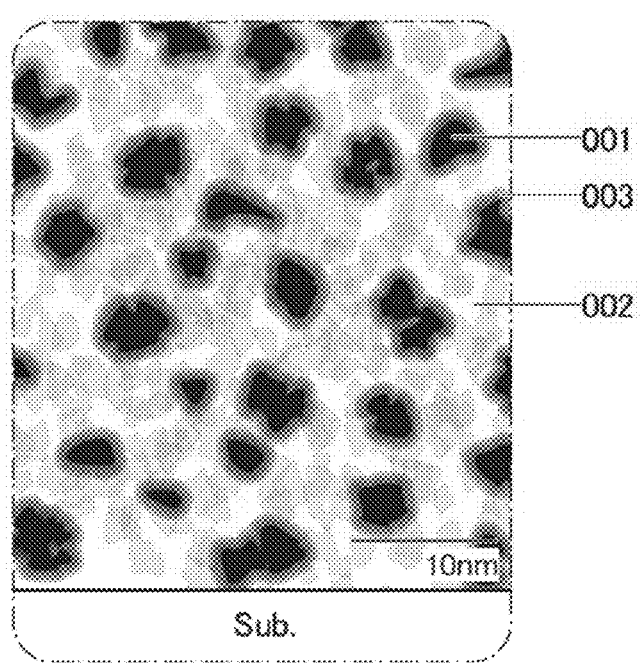
FIG. 9 is a cross-sectional view illustrating a concept of a composition of an oxide semiconductor film.
Figure 10:
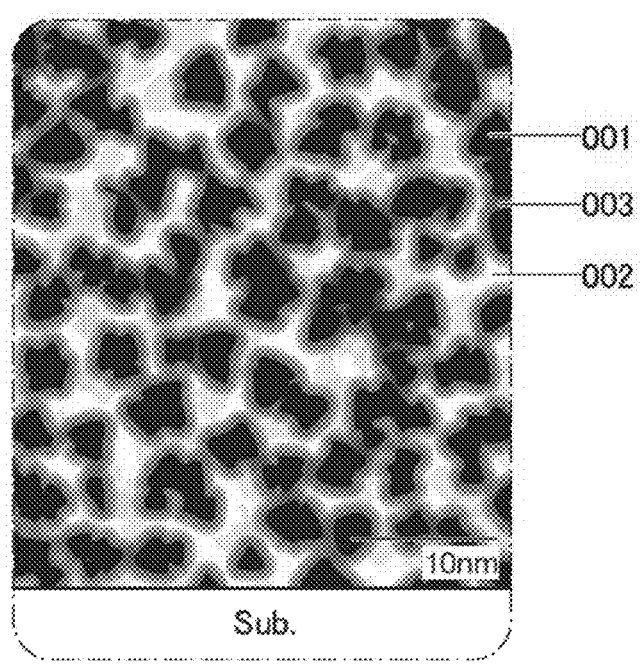
FIG. 10 is a cross-sectional view illustrating a concept of a composition of an oxide semiconductor film.

For example, in the CAC-OS, as illustrated in FIG. 9, elements included in the oxide semiconductor film are unevenly distributed to form regions 001 mainly including an element, regions 002 mainly including another element, and regions 003 mainly including another element. The regions 001, 002, and 003 are mixed to form a mosaic pattern. The CAC-OS has, for example, a composition in which elements included in an oxide semiconductor film are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor film, a state in which one or more metal elements are unevenly distributed and regions including the metal elements are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor film preferably contains at least indium. In particular, indium and zinc are preferably contained. In addition, an element M (M is one or a plurality of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) may be contained.

For example, an In-M-Zn oxide with the CAC-OS composition has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and an oxide of the element M ($MO_{X3}$, where X3 is a real number greater than 0) or an M-Zn oxide ($M_{X4}Zn_{Y4}O_{Z4}$, where X4, Y4, and Z4 are real numbers greater than 0), and a mosaic pattern is formed. $InO_{X1}$ or $In_{X2}Zn_{Y2}O_{Z2}$ forming the mosaic pattern is distributed in the film. This composition is also referred to as a cloud-like composition.

Here, let a concept in FIG. 9 illustrate an In-M-Zn oxide with the CAC-OS composition. In that case, the region 001 mainly includes $MO_{X3}$, the region 002 mainly includes $In_{X2}Zn_{Y2}O_{Z2}$ or $InO_{X1}$, and the region 003 includes at least Zn. Surrounding portions of the region mainly including $MO_{X3}$, the region mainly including $In_{X2}Zn_{Y2}O_{Z2}$ or $InO_{X1}$, and the region including at least Zn are unclear (blurred), so that boundaries are not clearly observed in some cases.

In other words, an In-M-Zn oxide with the CAC-OS composition is an oxide semiconductor film in which a region including $MO_{X3}$ as a main component and a region including $In_{X2}Zn_{Y2}O_{Z2}$ or $InO_{X1}$ as a main component are mixed. For this reason, the oxide semiconductor film is referred to as a composite oxide semiconductor film in some cases. Note that in this specification, for example, when the atomic ratio of In to the element M in the region 002 is greater than the atomic ratio of In to the element M in the region 001, the region 002 has higher In concentration than the region 001.

Note that in the oxide semiconductor film having the CAC-OS composition, a stacked-layer structure including two or more films with different atomic ratios is not included. For example, a two-layer structure of a film including In as a main component and a film including Ga as a main component is not included.

Specifically, of the CAC-OS, an In—Ga—Zn oxide with the CAC composition (such an In—Ga—Zn oxide may be particularly referred to as CAC-IGZO) is described. In the CAC-OS of an In—Ga—Zn oxide, materials are separated into $InO_{X1}$ or $In_{X2}Zn_{Y2}O_{Z2}$, and gallium oxide ($GaO_{X5}$, where X5 is a real number greater than 0) or gallium zinc oxide ($Ga_{X6}Zn_{Y6}O_{Z6}$, where X6, Y6, and Z6 are real numbers greater than 0), for example, and a mosaic pattern is formed. $InO_{X1}$ or $In_{X2}Zn_{Y2}O_{Z2}$ forming the mosaic pattern is a cloud-like oxide semiconductor film.

In other words, an In—Ga—Zn oxide including a CAC-OS is a composite oxide semiconductor film having a composition in which a region including $GaO_{X3}$ as a main component and a region including $In_{X2}Zn_{Y2}O_{Z2}$ or $InO_{X1}$ as a main component are mixed. Surrounding portions of the region including $GaO_{X3}$ as a main component and the region including $In_{X2}Zn_{Y2}O_{Z2}$ or $InO_{X1}$ as a main component are unclear (blurred), so that the boundaries are not clearly observed in some cases.

Note that the sizes of the regions 001 to 003 can be measured by EDX mapping. For example, the diameter of the region 001 is greater than or equal to 0.5 nm and less than or equal to 10 nm, or greater than or equal to 1 nm and less than or equal to 2 nm in the EDX mapping image of a cross-sectional photograph in some cases. The density of an element which is a main component is gradually lowered from the central portion of the region toward the surrounding portion. For example, when the number (abundance) of atoms of an element countable in an EDX mapping image gradually changes from the central portion toward the surrounding portion, the surrounding portion of the region is unclear (blurred) in the EDX mapping of the cross-sectional photograph. For example, from the central portion toward the surrounding portion in the region including $GaO_{X3}$ as a main component, the number of Ga atoms gradually reduces and the number of Zn atoms gradually increases, so that a region including $Ga_{X6}Zn_{Y6}O_{Z6}$ as a main component gradually appears. Accordingly, the surrounding portion of the region including $GaO_{X3}$ as a main component is unclear (blurred) in the EDX mapping image.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a layered crystal structure in which a plurality of IGZO nanocrystals have c-axis alignment and are connected in the a-b plane direction without alignment.

In contrast, of the CAC-OS in the In—Ga—Zn oxide, the crystal structure is a secondary element. In this specification, CAC-IGZO can be defined as an oxide semiconductor film containing In, Ga, Zn, and O in the state where a plurality of regions containing Ga as a main component and a plurality of regions containing In as a main component are each randomly dispersed to form a mosaic pattern.

For example, in the conceptual diagram of FIG. 9, the region 001 corresponds to the region containing Ga as a main component, the region 002 corresponds to the region containing In as a main component, and the region 003 corresponds to a region containing zinc. Note that each of the region containing Ga as a main component and the region containing In as a main component may be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that boundaries are not clearly observed in some cases.

FIG. 10 illustrates a modification example of the conceptual diagram of FIG. 9. As illustrated in FIG. 10, the region 001, the region 002, and the region 003 have different shapes or densities depending on conditions for forming the oxide semiconductor film in some cases.

The crystallinity of the In—Ga—Zn oxide including a CAC-OS can be analyzed by electron diffraction. For example, a ring-like region with high luminance is observed in an electron diffraction pattern image. Furthermore, a plurality of spots are observed in the ring-like region in some cases.

The In—Ga—Zn oxide including a CAC-OS has a structure different from that of an IGZO compound in which metal elements are evenly distributed, and has characteristics different from those of the IGZO compound. That is, in the In—Ga—Zn oxide including a CAC-OS, regions including $GaO_{X5}$ or the like as a main component and regions including $In_{X2}Zn_{Y2}O_{Z2}$ or $InO_{X1}$ as a main component are separated to form a mosaic pattern.

In the case where one or a plurality of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when an In—Ga—Zn oxide including a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$), high field-effect mobility ($\mu$), and low off-state current ($I_{off}$) can be achieved.

In the case where the CAC-OS in the In—Ga—Zn oxide is used for the semiconductor element, the conduction mechanism that achieves high on-state current ($I_{on}$), high field-effect mobility ($\mu$), and low off-state current ($I_{off}$) can be estimated on the basis of the random-resistance-network model in percolation theory.

That is, it is basically considered that electric conduction in the CAC-OS is caused when an electron serving as a carrier freely moves in the region that has high conductivity and includes $In_{X2}Zn_{Y2}O_{Z2}$ or $InO_{X1}$ as a main component.

In a region including an oxide of the $GaO_{X3}$ or the like with an excellent insulating property as a main component and in the vicinity thereof, an electron is localized. Thus, in some cases, electric conduction is caused when an electron serving as a carrier hops the region that includes $GaO_{X3}$ or the like with an excellent insulating property as a main component. Note that it is presumed that a hopping process is caused by thermal vibration of an atom, for example, and electrical conductivity increases with the increasing temperature in some cases. Alternatively, the hopping process is caused by action from the outside, such as electrical action, in some cases. Specifically, the hopping process might be caused when an electric field is applied to a CAC-OS.

A semiconductor element that includes an In—Ga—Zn oxide including a CAC-OS has high reliability. Thus, the In—Ga—Zn oxide including a CAC-OS is suitably used in a variety of semiconductor devices typified by a display.

<2-2. Analysis of CAC-OS>

Next, analysis results of CAC-OS deposited over a substrate by measurement methods will be described.

[Structure of Samples and Formation Method Thereof]

Nine samples of one embodiment of the present invention are described below. The samples are formed at different substrate temperatures and with different ratios of an oxygen gas flow rate in formation of the oxide semiconductor film. Note that each sample includes a substrate and an oxide semiconductor film over the substrate.

A method for forming the samples is described.

A glass substrate is used as the substrate. Over the glass substrate, a 100-nm-thick In—Ga—Zn oxide is formed as an oxide semiconductor film with a sputtering apparatus. The formation conditions are as follows: the pressure in a chamber is 0.6 Pa, and a metal oxide target (with an atomic ratio of In:Ga:Zn=4:2:4.1) is used as a target. The metal oxide target provided in the sputtering apparatus is supplied with an AC power of 2500 W.

As for the conditions in the formation of the oxide of the nine samples, the substrate temperature is set to a temperature without intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

[Analysis by X-Ray Diffraction]

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 11:
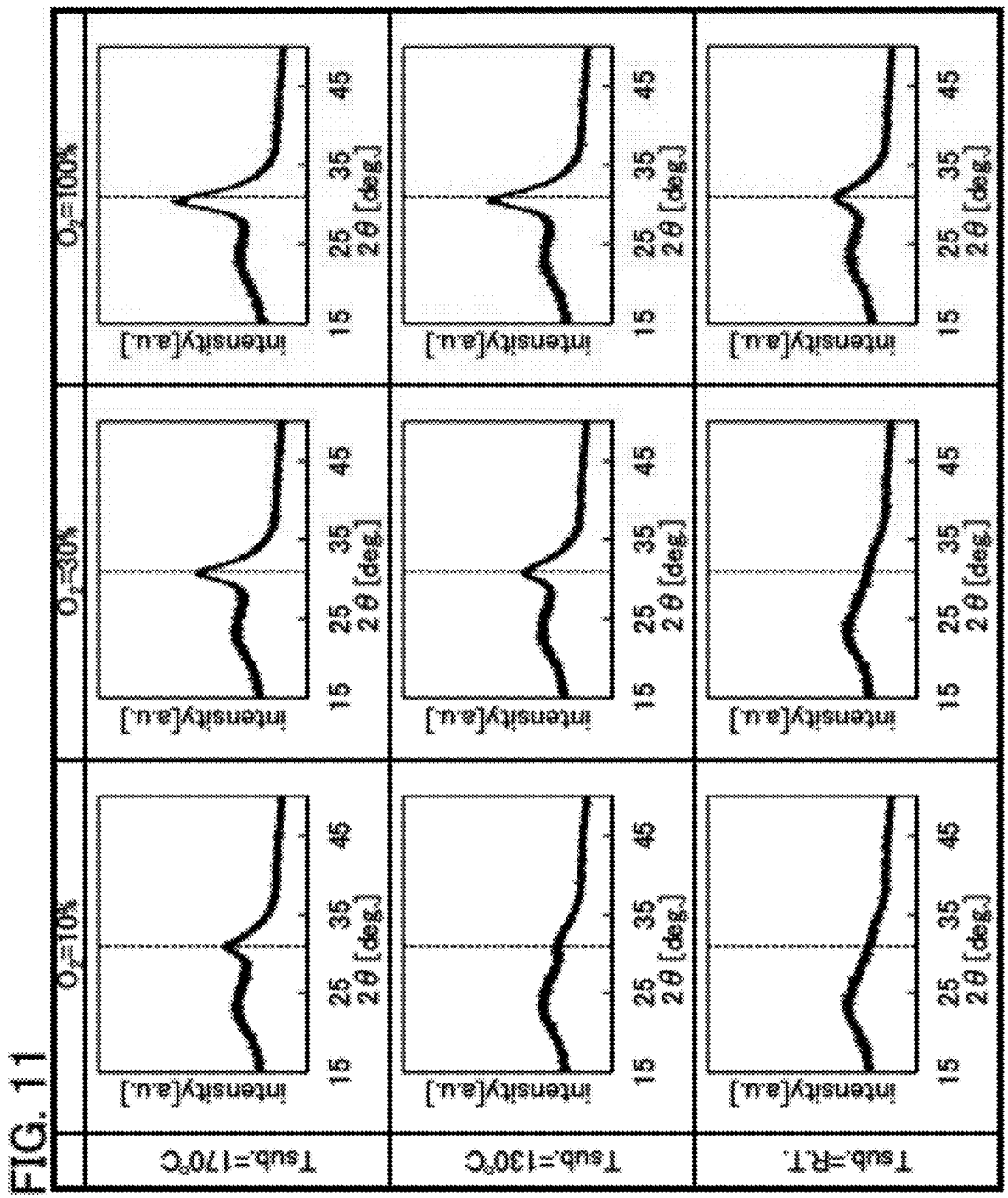
FIG. 11 shows measurement results of XRD spectra.

FIG. 11 shows XRD spectra measured by an out-of-plane method. In FIG. 11, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 11, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 11, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

[Analysis with Electron Microscope]

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nmϕ is performed.

FIG. 12A is a plan-view TEM image of the sample formed at a substrate temperature of R.T. and with an oxygen gas flow rate ratio of 10%. FIG. 12B is a cross-sectional TEM image of the sample formed at a substrate temperature of R.T. and with an oxygen gas flow rate ratio of 10%.

[Analysis of Electron Diffraction Patterns]

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 12A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 12C, 12D, 12E, 12F, and 12G show the results of the points indicated by the black dots a1, a2, a3, a4, and a5, respectively.

In FIGS. 12C, 12D, 12E, 12F, and 12G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 12B of the sample formed at a substrate temperature of R.T. and an oxygen gas flow rate ratio of 10% are observed. FIGS. 12H, 12I, 12J, 12K, and 12L show the results of the points indicated by the black dots b1, b2, b3, b4, and b5, respectively.

In FIGS. 12H, 12I, 12J, 12K, and 12L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) film is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor film formed at a low substrate temperature or with a low oxygen gas flow rate ratio is likely to have characteristics distinctly different from those of an oxide semiconductor film having an amorphous structure and an oxide semiconductor film having a single crystal structure.

[Elementary Analysis]

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 13A:
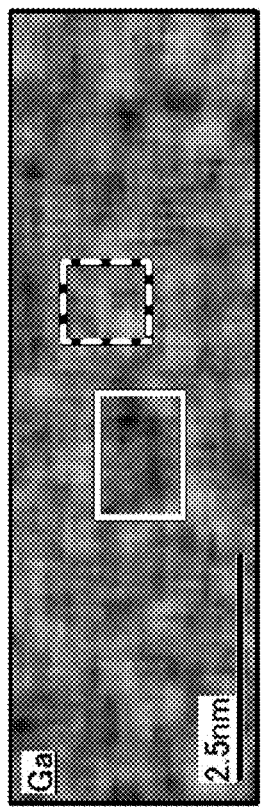
FIGS. 13A to 13C show EDX mapping images of a sample.
Figure 13B:
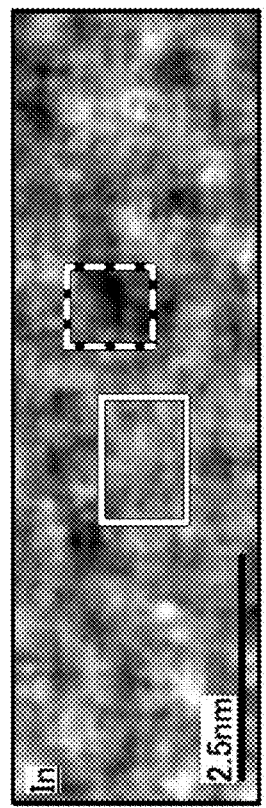
Figure 13C:
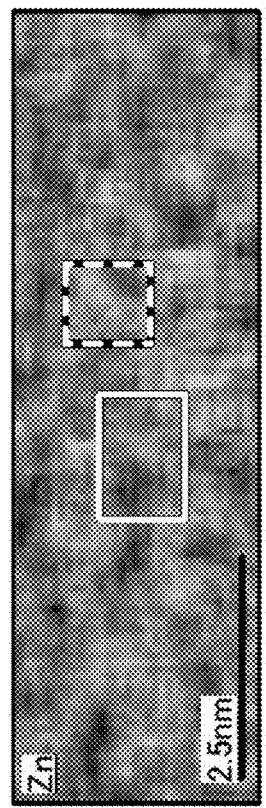

FIGS. 13A to 13C show EDX mapping images in a cross section of the sample formed at a substrate temperature of R.T. and with an oxygen gas flow rate ratio of 10%. FIG. 13A shows an EDX mapping image of Ga atoms. The proportion of the Ga atoms in all the atoms is 1.18 atomic % to 18.64 atomic %. FIG. 13B shows an EDX mapping image of In atoms. The proportion of the In atoms in all the atoms is 9.28 atomic % to 33.74 atomic %. FIG. 13C shows an EDX mapping image of Zn atoms. The proportion of the Zn atoms in all the atoms is 6.69 atomic % to 24.99 atomic %. FIGS. 13A to 13C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 13A to 13C is 7200000 times.

The EDX mapping images in FIGS. 13A to 13C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 13A to 13C are examined.

In FIG. 13A, a relatively dark region occupies a large area in the area surrounded by the solid line, while a relatively bright region occupies a large area in the area surrounded by the dashed line. In FIG. 13B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 13C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 13C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 13A to 13C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or $Ga_{X4}Zn_{Y4}O_{Z4}$ as a main component and the regions including $In_{X2}Zn_{Y2}O_{Z2}$ or $InO_{X1}$ as a main component are unevenly distributed and mixed can be referred to as a CAC-IGZO.

As shown in FIGS. 13A to 13C, each of the regions including $GaO_{X3}$ as a main component and the regions including $In_{X2}Zn_{Y2}O_{Z2}$ or $InO_{X1}$ as a main component has a size of greater than or equal to 0.5 nm and less than or equal to 10 nm, or greater than or equal to 0.3 nm and less than or equal to 3 nm. Note that it is preferable that a diameter of a region including each metal element as a main component be greater than or equal to 1 nm and less than or equal to 2 nm in the EDX mapping images.

As described above, the CAC-OS in the In—Ga—Zn oxide has a structure different from that of an IGZO compound in which metal elements are evenly distributed, and has properties different from those of the IGZO compound. That is, the CAC-OS in the In—Ga—Zn oxide includes regions including $GaO_{X3}$ or the like as a main component and regions including $In_{X2}Zn_{Y2}O_{Z2}$ or $InO_{X1}$ as a main component. Accordingly, when a CAC-OS in the In—Ga—Zn oxide is used for a semiconductor element, the property derived from $GaO_{X3}$ or the like and the property derived from $In_{X2}Zn_{Y2}O_{Z2}$ or $InO_{X1}$ complement each other, whereby high on-state current ($I_{on}$) and high field-effect mobility (μ) can be achieved.

At least part of this embodiment can be implemented in combination with any of the other embodiments and the other examples described in this specification as appropriate.

Embodiment 3

In this embodiment, an oxide semiconductor film that can be used as a semiconductor film of one embodiment of the present invention will be described. In this embodiment, the atomic ratio of elements included in the oxide semiconductor film will be described with reference to FIGS. 14A to 14C.

<3. Atomic Ratio of Oxide Semiconductor Film>

An oxide semiconductor film in this embodiment contains indium, an element M (M is one or a plurality of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like), and zinc.

Figure 14A:
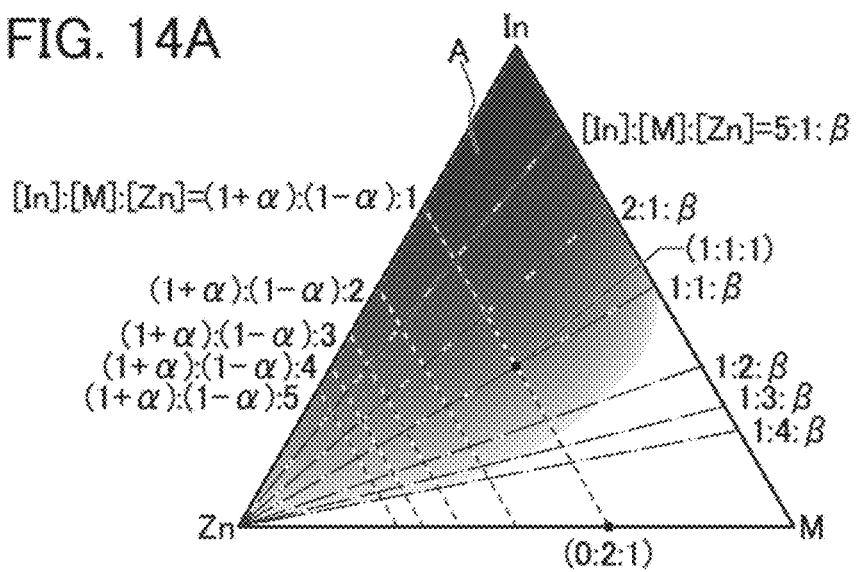
FIGS. 14A to 14C each illustrate atomic ratios of an oxide semiconductor film.
Figure 14B:
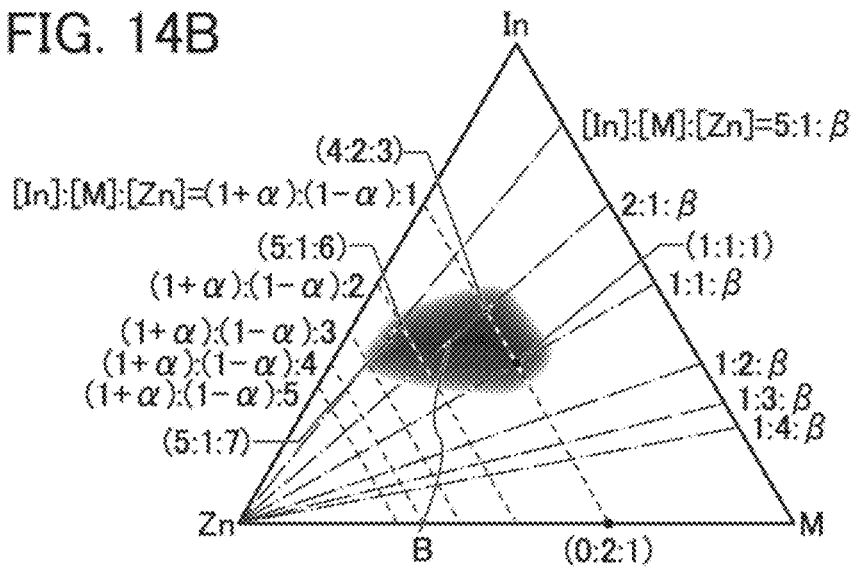
Figure 14C:
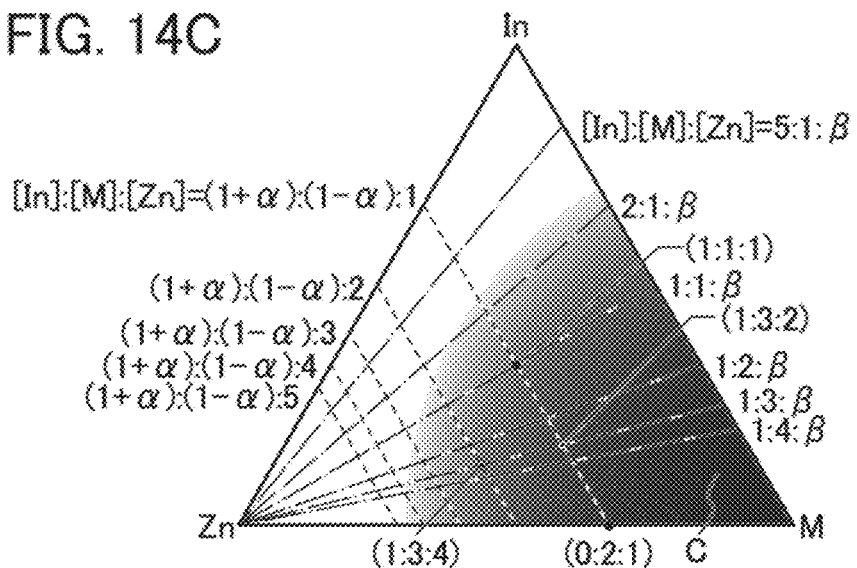

A phase diagram in FIGS. 14A to 14C can be used to show the atomic ratio of elements in the case where the region A1 in the oxide semiconductor film contains In, the element M, and Zn. The atomic ratio of In to the element M and Zn is denoted by x:y:z. This atomic ratio can be shown as coordinates (x:y:z) in FIGS. 14A to 14C. Note that the proportion of oxygen atoms is not illustrated in FIGS. 14A to 14C.

In FIGS. 14A to 14C, dashed lines correspond to a line representing the atomic ratio of $[In]:[M]:[Zn]=(1+\alpha):(1-\alpha):1$ $(-1\le\alpha\le1)$, a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Dashed-dotted lines correspond to a line representing the atomic ratio of $[In]:[M]:[Zn]=1:1:\beta$ $(\beta\ge0)$, a line representing the atomic ratio of $[In]:[M]:[Zn]=1:2:\beta$, a line representing the atomic ratio of $[In]:[M]:[Zn]=1:3:\beta$, a line representing the atomic ratio of $[In]:[M]:[Zn]=1:4:\beta$, a line representing the atomic ratio of $[In]:[M]:[Zn]=1:7:\beta$, a line representing the atomic ratio of $[In]:[M]:[Zn]=2:1:\beta$, and a line representing the atomic ratio of $[In]:[M]:[Zn]=5:1:\beta$.

An oxide semiconductor having the atomic ratio of $[In]:[M]:[Zn]=0:2:1$ or a neighborhood thereof in FIGS. 14A to 14C tends to have a spinel crystal structure.

A region A2 in FIGS. 14A to 14C represents an example of a preferred range of atomic ratios of indium to the element M and zinc contained in the region A1. Note that the region A2 includes atomic ratios on a line representing the atomic ratio of $[In]:[M]:[Zn]=(1+\gamma):0:(1-\gamma)(-1\le\gamma\le1)$.

A region B2 in FIGS. 14A to 14C represents an example of a preferred range of atomic ratios of indium to the element M and zinc contained in the region B1. Note that the region B2 includes atomic ratios from $[In]:[M]:[Zn]=4:2:3$ to $[In]:[M]:[Zn]=4:2:4.1$ and a neighborhood thereof. The neighborhood includes an atomic ratio of $[In]:[M]:[Zn]=5:3:4$. The region B2 includes an atomic ratio of $[In]:[M]:[Zn]=5:1:6$ and a neighborhood thereof.

The region A2 with high In concentrations provides a higher conductivity than the region B2 and has a function of increasing carrier mobility (field-effect mobility). Therefore, the on-state current and carrier mobility of a transistor using an oxide semiconductor film including the region A1 can be increased.

In contrast, the region B2 with low In concentrations provides a lower conductivity than the region A2 and has a function of decreasing leakage current. Therefore, the off-state current of a transistor using an oxide semiconductor film including the region B1 can be decreased.

For example, the region A1 is preferably non-single-crystal. Note that in the case where the region A1 has crystallinity, when the region A1 is formed of indium, the region A1 tends to have a tetragonal crystal structure. Furthermore, when the region A1 is formed of indium oxide ($[In]:[M]:[Zn]=x:0:0$ $(x>0)$), the region A1 tends to have a bixbyite crystal structure. When the region A1 is formed of an In—Zn oxide ($[In]:[M]:[Zn]=x:0:z$ ($x>0$, $z>0$)), the region A1 tends to have a layered crystal structure.

For example, the region B1 is preferably a non-crystal and includes a CAAC-OS. Note that the region B1 does not necessarily include only a CAAC-OS and may also include a region of a polycrystalline oxide semiconductor, an nc-OS, or the like.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, with the CAAC-OS, a composite oxide semiconductor is physically stable; thus, a composite oxide semiconductor which is resistant to heat and has high reliability can be provided.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Note that characteristics of the composite oxide semiconductor of one embodiment of the present invention are not uniquely determined by the atomic ratio. Therefore, the illustrated regions represent preferred atomic ratios of the region A1 and the region B1 of the composite oxide semiconductor; a boundary therebetween is not clear.

At least part of this embodiment can be implemented in combination with any of the other embodiments and the other examples described in this specification as appropriate.

Embodiment 4

A semiconductor device which can be manufactured with the sputtering apparatus of one embodiment of the present invention and a method for manufacturing the semiconductor device will be described with reference to FIGS. 15A to 15C to FIGS. 21A to 21C.

Note that a transistor that includes the semiconductor film formed with the sputtering apparatus of one embodiment of the present invention can have high carrier mobility and high switching characteristics. In addition, the transistor can have high reliability.

An oxide semiconductor film with a low carrier density is preferably used for the transistor. For example, an oxide semiconductor film whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

An oxide semiconductor film of one embodiment of the present invention is a highly purified intrinsic or substantially highly purified intrinsic oxide semiconductor film. A highly purified intrinsic or substantially highly purified intrinsic oxide semiconductor film has few carrier generation sources, and thus can have a low carrier density. A highly purified intrinsic or substantially highly purified intrinsic oxide semiconductor film has a low density of defect states and accordingly has a low density of trap states in some cases.

Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases.

To obtain stable electrical characteristics of the transistor, it is effective to reduce the concentration of impurities in the oxide semiconductor film. In addition, to reduce the concentration of impurities in the oxide semiconductor film, the concentration of impurities in a film that is adjacent to the oxide semiconductor film is preferably reduced. Examples of impurities include hydrogen, alkali metal, alkaline earth metal, iron, nickel, and silicon.

Here, the influence of impurities in the oxide semiconductor film will be described. Note that the concentration of impurities in the oxide semiconductor film can be measured by secondary ion mass spectrometry (SIMS).

When the oxide semiconductor film contains alkali metal or alkaline earth metal, defect states are formed and carriers are generated, in some cases. Thus, a transistor including an oxide semiconductor film which contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film, which is measured by SIMS, is lower than or equal to $1\times10^{18}$ atoms/cm$^3$, preferably lower than or equal to $2\times10^{16}$ atoms/cm$^3$.

Hydrogen contained in an oxide semiconductor film reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration measured by SIMS is set lower than $1\times10^{20}$ atoms/cm$^3$.

Note that oxygen vacancies (Vo) in the oxide semiconductor film can be reduced by introduction of oxygen into the oxide semiconductor film. That is, the oxygen vacancies (Vo) in the oxide semiconductor film disappear when the oxygen vacancies (Vo) are filled with oxygen. Accordingly, diffusion of oxygen in the oxide semiconductor film can reduce the oxygen vacancies (Vo) in a transistor and improve the reliability of the transistor.

As a method for introducing oxygen into the oxide semiconductor film, for example, an oxide in which oxygen content is higher than that in the stoichiometric composition is provided in contact with the oxide semiconductor film. That is, in the oxide, a region including oxygen in excess of that in the stoichiometric composition (hereinafter also referred to as an excess-oxygen region) is preferably formed. In particular, in the case of using an oxide semiconductor film in a transistor, an oxide including an excess-oxygen region is provided in a base film, an interlayer film, or the like in the vicinity of the transistor, whereby oxygen vacancies in the transistor are reduced, and the reliability can be improved.

When an oxide semiconductor film with sufficiently reduced impurity concentration is used for a channel formation region in a transistor, the transistor can have stable electrical characteristics.

<4-1. Structural Example 1 of Semiconductor Device>

Figure 15A:
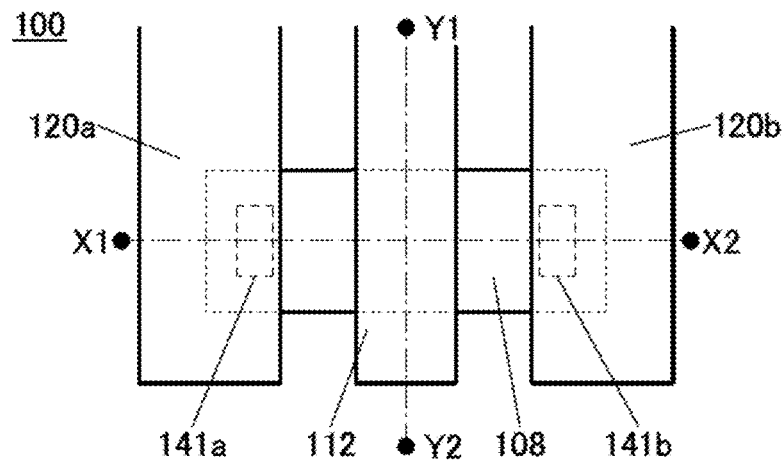
FIGS. 15A to 15C are a top view and cross-sectional views illustrating a semiconductor device.
Figure 15B:
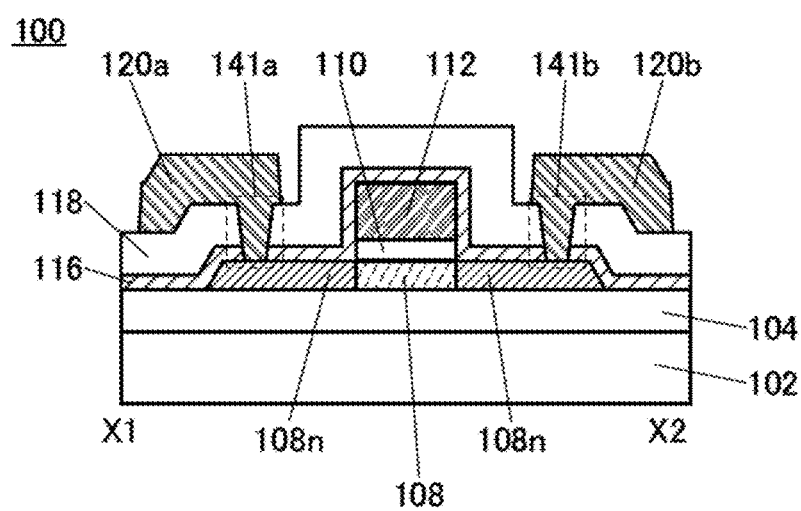
Figure 15C:
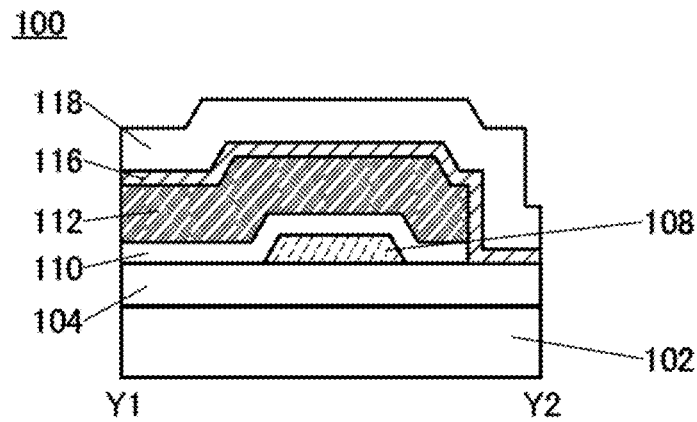

FIG. 15A is a plan view of a transistor 100 that is a semiconductor device of one embodiment of the present invention. FIG. 15B is a cross-sectional view taken along a dashed dotted line X1-X2 in FIG. 15A, and FIG. 15C is a cross-sectional view taken along a dashed dotted line Y1-Y2 in FIG. 15A. Note that in FIG. 15A, some components of the transistor 100 (e.g., an insulating film serving as a gate insulating film) are not illustrated to avoid complexity. Furthermore, the direction of the dashed dotted line X1-X2 may be referred to as a channel length direction, and the direction of the dashed dotted line Y1-Y2 may be referred to as a channel width direction. As in FIG. 15A, some components are not illustrated in some cases in plan views of transistors described below.

The transistor 100 illustrated in FIGS. 15A to 15C is what is called a top-gate transistor.

The transistor 100 includes an insulating film 104 over a substrate 102; an oxide semiconductor film 108 over the insulating film 104; an insulating film 110 over the oxide semiconductor film 108; a conductive film 112 over the insulating film 110; and an insulating film 116 over the insulating film 104, the oxide semiconductor film 108, and the conductive film 112. The oxide semiconductor film 108 can be formed with the sputtering apparatus described in Embodiment 1.

The oxide semiconductor film 108 over the insulating film 104 has a channel formation region in a region overlapping with the conductive film 112. For example, the oxide semiconductor film 108 preferably contains In, M (M represents one or a plurality of Al, Si, Y, B, Ti, Fe, Ni, Ge, Zr, Mo, La, Ce, Nd, Hf, Ta, W, Mg, V, Be, and Cu), and Zn.

The oxide semiconductor film 108 has regions 108n which do not overlap with the conductive film 112 and are in contact with the insulating film 116. The regions 108n function as a source region and a drain region. The regions 108n are regions where the oxide semiconductor film 108 described above becomes n-type. The regions 108n are in contact with the insulating film 116. The insulating film 116 contains nitrogen or hydrogen. Nitrogen or hydrogen in the insulating film 116 is added to the regions 108n to increase the carrier density, thereby making the regions 108n n-type. The oxide semiconductor film 108 has a region functioning as the channel formation region between the regions 108n. The region functioning as the channel formation region has a lower carrier density and a lower concentration of nitrogen or hydrogen than the region 108n.

Figure 31A:
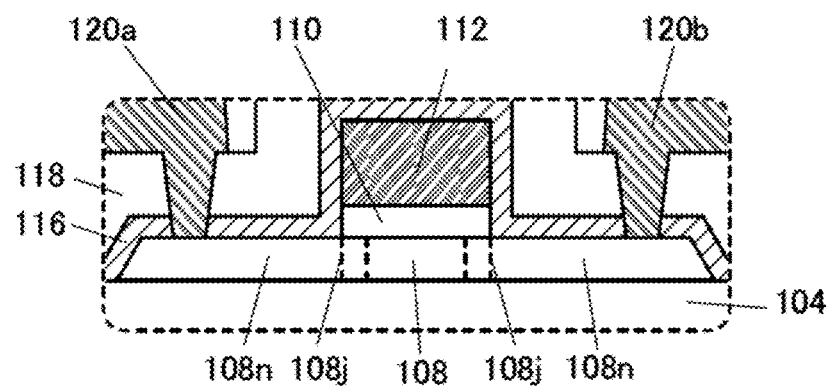
FIGS. 31A and 31B are cross-sectional views illustrating a semiconductor device.

As illustrated in FIG. 31A, the oxide semiconductor film 108 may have a region 108j between the region functioning as the channel formation region of the transistor 100 (in a top view, at least part of a region overlapping with the insulating film 110) and the region 108n functioning as a source region or a drain region.

The region 108j has a lower carrier density than the region 108n and has a higher carrier density than the region functioning as the channel formation region. That is, the region 108j functions as a junction region between the channel formation region and the source region or the drain region. The region 108j has a lower concentration of nitrogen or hydrogen than the region 108n, and a higher concentration of nitrogen or hydrogen than the region functioning as the channel formation region.

The region 108j prevents a high-resistance region from being formed between the region 108n functioning as a source region or a drain region and the region functioning as the channel formation region, thereby increasing on-state current of the transistor.

The region 108j sometimes functions as an overlap region (also referred to as an Lov region) which overlaps with the conductive film 112 that functions as a gate electrode.

In the oxide semiconductor film 108, boundaries between the region 108n functioning as a source region or a drain region and the region 108j and between the region 108j and the region functioning as the channel formation region cannot be clearly observed in some cases. The concentration of hydrogen or nitrogen may be gradually changed (also referred to as gradation) not only between the regions but also in each region. That is, the concentration of hydrogen or nitrogen decreases as closer to the region functioning as the channel formation region, from the region 108n functioning as a source region or a drain region to the region 108j and from the region 108j to the region functioning as the channel formation region.

The oxide semiconductor film 108 preferably includes a region in which the atomic proportion of In is higher than the atomic proportion of M. For example, the atomic ratio of In to M to Zn in the oxide semiconductor film 108 is preferably In:M:Zn=4:2:3 or in the neighborhood thereof.

The composition of the oxide semiconductor film 108 is not limited to the above. For example, the atomic ratio of In to M to Zn in the oxide semiconductor film 108 may be In:M:Zn=5:1:6 or in the neighborhood thereof. The term "neighborhood" includes the following: when In is 5, M is greater than or equal to 0.5 and less than or equal to 1.5, and Zn is greater than or equal to 5 and less than or equal to 7.

When the oxide semiconductor film 108 has a region in which the atomic proportion of In is higher than the atomic proportion of M, the transistor 100 can have high field-effect mobility. Specifically, the field-effect mobility of the transistor 100 can be higher than 50 $cm^2/Vs$, preferably higher than 100 $cm^2/Vs$.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Even when the oxide semiconductor film 108 has a region where the atomic proportion of In is higher than that of M, if the oxide semiconductor film 108 has high crystallinity, the transistor 100 has low field-effect mobility in some cases.

Furthermore, oxygen vacancies formed in the oxide semiconductor film 108 adversely affect the transistor characteristics and therefore cause a problem. For example, oxygen vacancies formed in the oxide semiconductor film 108 are bonded to hydrogen to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the number of oxygen vacancies in the oxide semiconductor film 108 be as small as possible.

In one embodiment of the present invention, the insulating film in the vicinity of the oxide semiconductor film 108 contains excess oxygen. Specifically, one or both of the insulating film 110 which is formed over the oxide semiconductor film 108 and the insulating film 104 which is formed under the oxide semiconductor film 108 contain excess oxygen. Oxygen or excess oxygen is transferred from the insulating film 104 and/or the insulating film 110 to the oxide semiconductor film 108, whereby oxygen vacancies in the oxide semiconductor film can be reduced.

Impurities such as hydrogen or moisture entering the oxide semiconductor film 108 adversely affect the transistor characteristics and therefore cause a problem. Therefore, it is preferable that the amount of impurities such as hydrogen or moisture in the oxide semiconductor film 108 be as small as possible.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1 \times 10^6$ μm and a channel length of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

As illustrated in FIGS. 15A to 15C, the transistor 100 may further include an insulating film 118 over the insulating film 116, a conductive film 120a electrically connected to the region 108n through an opening 141a provided in the insulating films 116 and 118, and a conductive film 120b electrically connected to the region 108n through an opening 141b provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. The insulating film 110 includes an excess oxygen region. Since the insulating film 110 includes the excess oxygen region, excess oxygen can be supplied to the oxide semiconductor film 108. As a result, oxygen vacancies that might be formed in the oxide semiconductor film 108 can be filled with excess oxygen, and the semiconductor device can have high reliability.

To supply excess oxygen to the oxide semiconductor film 108, excess oxygen may be supplied to the insulating film 104 that is formed under the oxide semiconductor film 108. In that case, excess oxygen contained in the insulating film 104 can be supplied to the region 108n, which is not preferred because the resistance of the region 108n is increased. In contrast, in the structure in which the insulating film 110 formed over the oxide semiconductor film 108 contains excess oxygen, excess oxygen can be selectively supplied only to a region overlapping with the conductive film 112.

<4-2. Components of Semiconductor Device>

Next, components of the semiconductor device of this embodiment are described in detail.

[Substrate]

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stacked-layer structure including a silicon nitride film as a lower layer and a silicon oxynitride film as an upper layer, oxygen can be efficiently introduced into the oxide semiconductor film 108.

[Conductive Film]

The conductive film 112 functioning as a gate electrode and the conductive films 120a and 120b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, the oxide conductor is obtained in the following manner. Oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

In particular, the above-described oxide conductor is favorably used as the conductive film 112 because excess oxygen can be added to the insulating film 110.

A Cu—X alloy film (X is Mn, Ni, Cr, Fe, Co, Mo, Ta, or Ti) may be used for the conductive films 112, 120a, and 120b. The use of a Cu—X alloy film results in lower manufacturing costs because the film can be processed by wet etching.

Among the above-mentioned metal elements, any one or more elements selected from titanium, tungsten, tantalum, and molybdenum are preferably included in the conductive films 112, 120a, and 120b. In particular, a tantalum nitride film is preferably used for the conductive films 112, 120a, and 120b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Second Insulating Film]

As the insulating film 110 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulator film 110 may have a two-layer stacked structure or a stacked structure including three or more layers.

The insulating film 110 that is in contact with the oxide semiconductor film 108 functioning as a channel region of the transistor 100 is preferably an oxide insulating film and preferably includes a region containing oxygen in excess of the stoichiometric composition (oxygen-excess region). In other words, the insulating film 110 is an insulating film capable of releasing oxygen. In order to provide the oxygen-excess region in the insulating film 110, the insulating film 110 is formed in an oxygen atmosphere, or the deposited insulating film 110 is subjected to heat treatment in an oxygen atmosphere, for example.

In the case of using hafnium oxide for the insulating film 110, the following effects are attained. Hafnium oxide has higher dielectric constant than silicon oxide and silicon oxynitride. Therefore, by using hafnium oxide, the thickness of the insulating film 110 can be made large as compared with the case of using silicon oxide; thus, leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

[Oxide Semiconductor Film]

For the oxide semiconductor film 108, the oxide semiconductor described in the above embodiment can be used.

[Third Insulating Film]

The insulating film 116 contains nitrogen or hydrogen. A nitride insulating film can be used as the insulating film 116, for example. The nitride insulating film can be formed using silicon nitride, silicon nitride oxide, silicon oxynitride, or the like. The hydrogen concentration in the insulating film 116 is preferably higher than or equal to $1 \times 10^{22}$ atoms/cm$^3$. The insulating film 116 is in contact with the region 108n of the oxide semiconductor film 108. Thus, the concentration of an impurity (nitrogen or hydrogen) in the region 108n in contact with the insulating film 116 is increased, leading to an increase in the carrier density of the region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

<4-3. Structural Example 2 of Semiconductor Device>

Next, a structure of a transistor different from that in FIGS. 15A to 15C will be described with reference to FIGS. 16A to 16C.

Figure 16A:
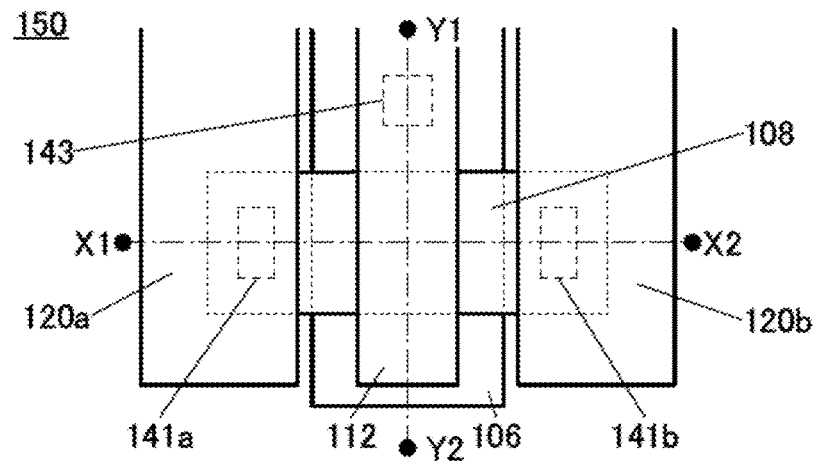
FIGS. 16A to 16C are a top view and cross-sectional views illustrating a semiconductor device.

FIG. 16A is a top view of the transistor 150. FIG. 16B is a cross-sectional view taken along a dashed-dotted line X1-X2 in FIG. 16A. FIG. 16C is a cross-sectional view taken along a dashed-dotted line Y1-Y2 in FIG. 16A.

Figure 16B:
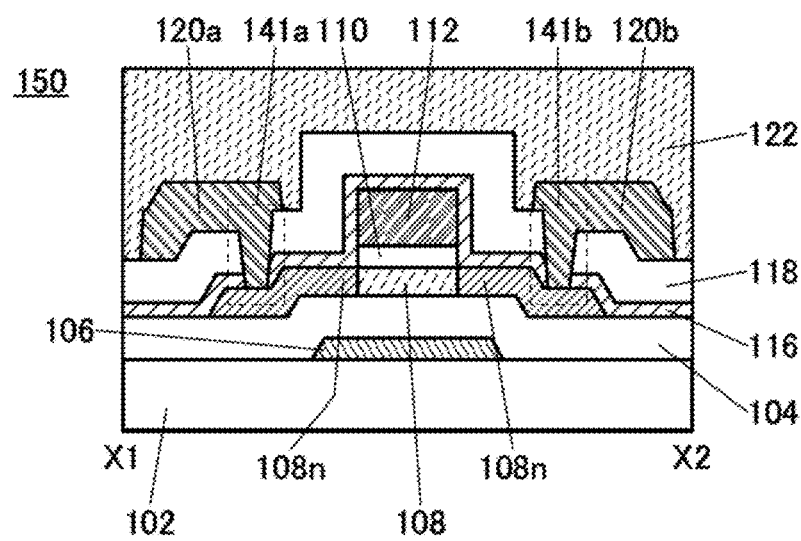
Figure 16C:
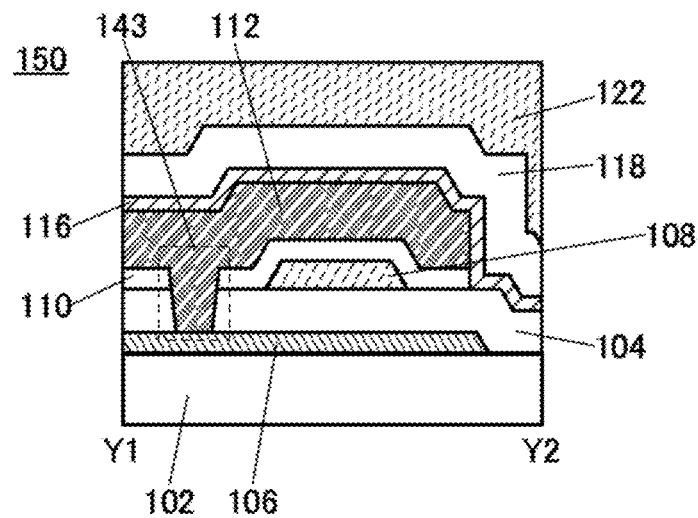

The transistor 150 illustrated in FIGS. 16A to 16C includes the conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112.

Note that the oxide semiconductor film 108 has a structure similar to that in the transistor 100 illustrated in FIGS. 15A to 15C. The transistor 150 illustrated in FIGS. 16A to 16C includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light irradiating the channel formation region of the oxide semiconductor film 108 from the bottom can be reduced.

In the case of the structure of the transistor 150, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 150 as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 150, but also as power source supply wirings, signal supply wirings, connection wirings, or the like of the display device.

In this manner, unlike the transistor 100 described above, the transistor 150 in FIGS. 16A to 16C has a structure in which a conductive film functioning as a gate electrode is provided over and under the oxide semiconductor film 108. As in the transistor 150, a semiconductor device of one embodiment of the present invention may have a plurality of gate electrodes.

As illustrated in FIGS. 16B and 16C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the oxide semiconductor film 108.

Such a structure enables the oxide semiconductor film 108 included in the transistor 150 to be electrically surrounded by electric fields of the conductive film 106 functioning as a first gate electrode and the conductive film 112 functioning as a second gate electrode. A device structure of a transistor, like that of the transistor 150, in which electric fields of the first gate electrode and the second gate electrode electrically surround the oxide semiconductor film 108 in which a channel region is formed can be referred to as a surrounded channel (S-channel) structure.

Since the transistor 150 has the S-channel structure, an electric field for inducing a channel can be effectively applied to the oxide semiconductor film 108 by the conductive film 106 or the conductive film 112; thus, the current drive capability of the transistor 150 can be improved and high on-state current characteristics can be obtained. As a result of the high on-state current, it is possible to reduce the size of the transistor 150. Furthermore, since the transistor 150 has a structure in which the oxide semiconductor film 108 is surrounded by the conductive film 106 and the conductive film 112, the mechanical strength of the transistor 150 can be increased.

When seen in the channel width direction of the transistor 150, an opening different from the opening 143 may be formed on the side of the oxide semiconductor film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The other components of the transistor 150 are similar to those of the transistor 100 described above and have similar effects.

An insulating film may further be formed over the transistor 150. The transistor 150 illustrated in FIGS. 16A to 16C includes an insulating film 122 over the conductive films 120*a* and 120*b* and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

<4-4. Manufacturing Method of Semiconductor Device>

Next, an example of a method for manufacturing the transistor 150 illustrated in FIGS. 16A to 16C is described with reference to FIGS. 17A to 17D, FIGS. 18A to 18C, and FIGS. 19A to 19C. Note that FIGS. 17A to 17D, FIGS. 18A to 18C, and FIGS. 19A to 19C are cross-sectional views in the channel length direction and the channel width direction, illustrating the method for manufacturing the transistor 150.

First, the conductive film 106 is formed over the substrate 102. Then, the insulating film 104 is formed over the substrate 102 and the conductive film 106, and an oxide semiconductor film is formed over the insulating film 104. After that, the oxide semiconductor film is processed into an island shape, whereby an oxide semiconductor film 108*a* is formed (see FIG. 17A).

The conductive film 106 can be formed using a material selected from the above-mentioned materials. In this embodiment, as the conductive film 106, a layered film of a 50-nm-thick tungsten film and a 400-nm-thick copper film is formed with a sputtering apparatus.

To process the conductive film to be the conductive film 106, a wet etching method and/or a dry etching method can be used. In this embodiment, in the processing of the conductive film into the conductive film 106, the copper film is etched by a wet etching method and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

For formation of the oxide semiconductor film 108*a*, description in the above embodiment can be referred to. Impurities (in particular, hydrogen and water) can be reduced in the oxide semiconductor film 108*a* formed with the sputtering apparatus of one embodiment of the present invention.

The thickness of the oxide semiconductor film 108*a* is greater than or equal to 3 nm and less than or equal to 200 nm, preferably greater than or equal to 3 nm and less than or equal to 100 nm, further preferably greater than or equal to 3 nm and less than or equal to 60 nm.

Note that in the case where a large-sized glass substrate (e.g., the 6th generation to the 10th generation) is used as the substrate 102 and the oxide semiconductor film 108*a* is formed at a substrate temperature higher than or equal to 200° C. and lower than or equal to 300° C., the substrate 102 might be changed in shape (distorted or warped). In the case where a large-sized glass substrate is used, the change in the shape of the glass substrate can be suppressed by forming the oxide semiconductor film 108*a* at a substrate temperature higher than or equal to room temperature and lower than 200° C.

Note that the deposited oxide semiconductor film may be processed into the oxide semiconductor film 108*a* by a wet etching method, a dry etching method, or both.

After the oxide semiconductor film 108*a* is formed, the oxide semiconductor film 108*a* may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert atmosphere containing nitrogen or a rare gas such as helium, neon, argon, xenon, or krypton. Alternatively, the heat treatment may be performed in an inert atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 17A:
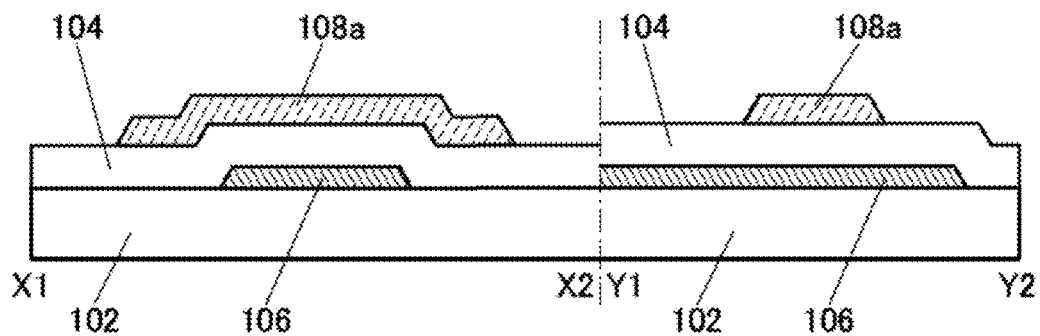
FIGS. 17A to 17D are cross-sectional views illustrating a method for manufacturing a semiconductor device.
Figure 17B:
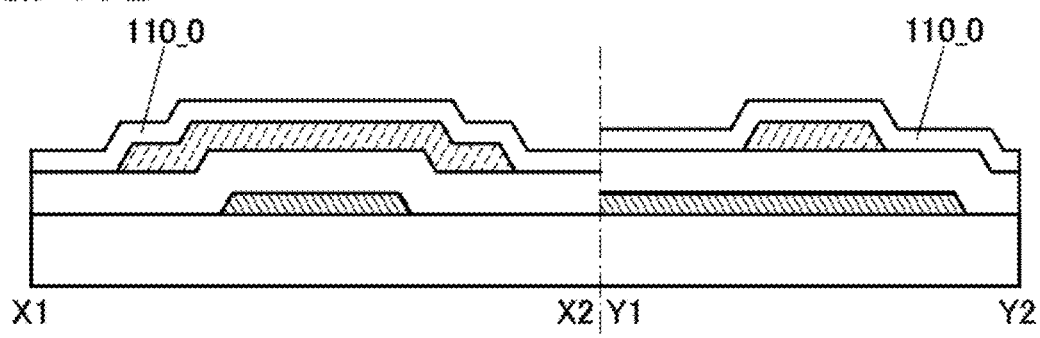

Next, an insulating film 110_0 is formed over the insulating film 104 and the oxide semiconductor film 108*a* (see FIG. 17B).

As the insulating film 110_0, a silicon oxide film or a silicon oxynitride film can be formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulating film 110_0 with a PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa, or lower than or equal to 50 Pa.

As the insulating film 110_0, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulating film 110_0 having high coverage can be formed.

In this embodiment, as the insulating film 110_0, a 100-nm-thick silicon oxynitride film is formed with a PECVD apparatus.

Figure 17C:
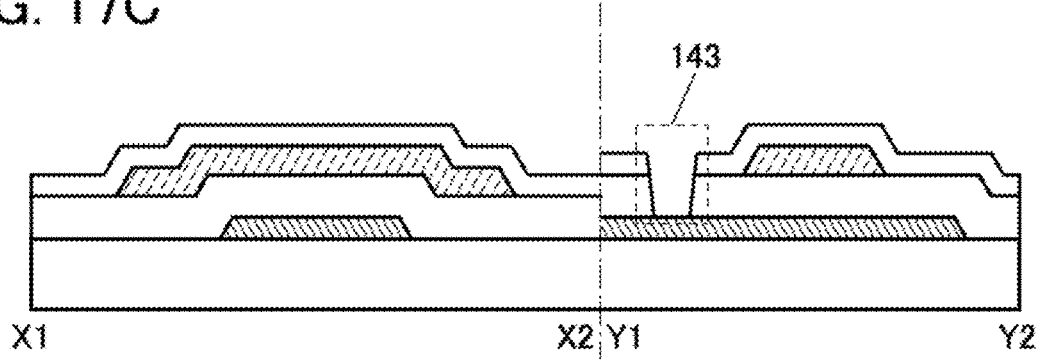

Subsequently, a mask is formed by lithography in a desired position over the insulating film 110_0, and then, the insulating film 110_0 and the insulating film 104 are partly etched, so that the opening 143 reaching the conductive film 106 is formed (see FIG. 17C).

To form the opening 143, a wet etching method and/or a dry etching method can be used. In this embodiment, the opening 143 is formed by a dry etching method.

Next, a conductive film 112_0 is formed over the conductive film 106 and the insulating film 110_0 so as to cover the opening 143. In the case where a metal oxide film is used as the conductive film 112_0, for example, oxygen might be added to the insulating film 110_0 during the formation of the conductive film 112_0 (see FIG. 17D).

Figure 17D:
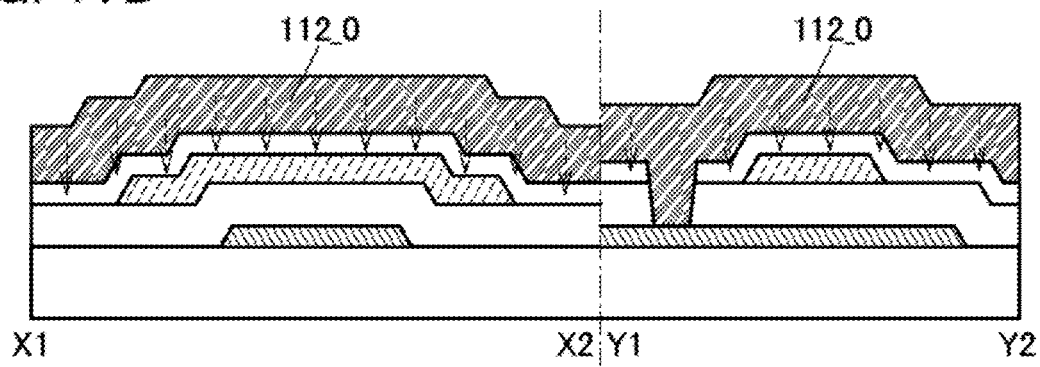

In FIG. 17D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 112_0, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and other methods such as an ALD method may be used.

In this embodiment, a 100-nm-thick IGZO film containing an In—Ga—Zn oxide (In:Ga:Zn=4:2:4.1 [atomic ratio]) is formed as the conductive film 112_0 by a sputtering method. Note that oxygen addition treatment may be performed on the insulating film 110_0 before or after the formation of the conductive film 112_0. The oxygen addition treatment can be performed in a manner similar to that of the oxygen addition treatment that can be performed after the formation of the insulating film 104.

Figure 18A:
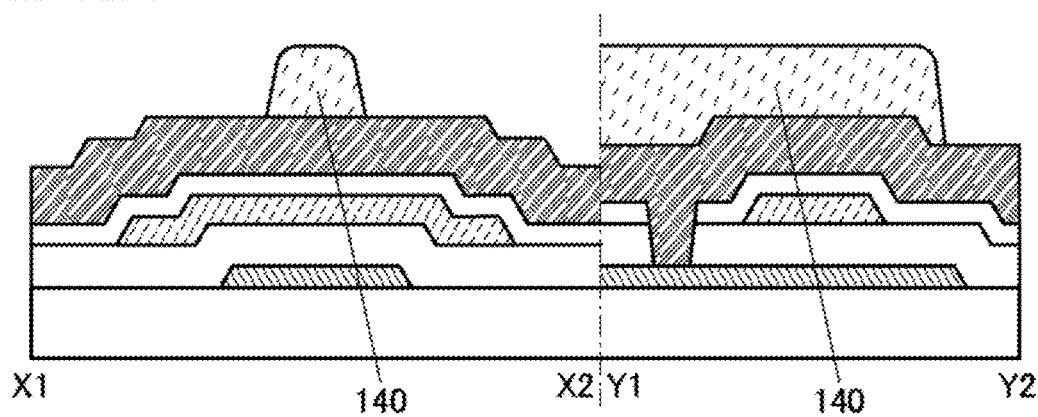
FIGS. 18A to 18C are cross-sectional views illustrating a method for manufacturing a semiconductor device.
Figure 18B:
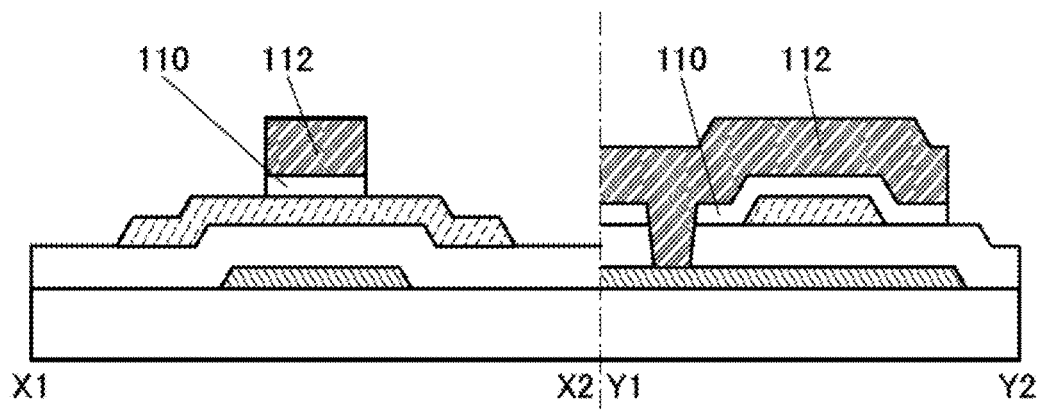
Figure 18C:
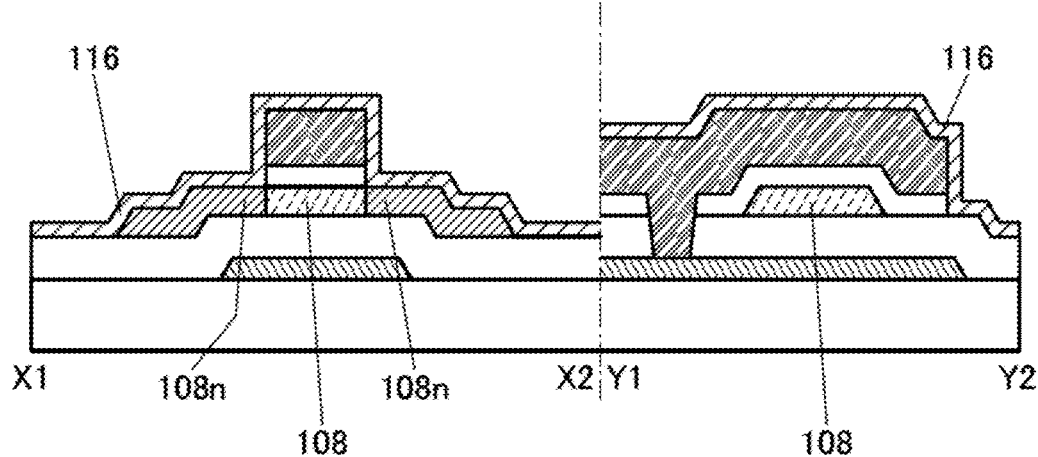

Subsequently, a mask 140 is formed by a lithography process in a desired position over the conductive film 112_0 (see FIG. 18A).

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 18B).

In this embodiment, the conductive film 112_0 and the insulating film 110_0 are processed by a dry etching method.

In the processing into the conductive film 112 and the insulating film 110, the thickness of the oxide semiconductor film 108a in a region not overlapping with the conductive film 112 is decreased in some cases. In other cases, in the processing into the conductive film 112 and the insulating film 110, the thickness of the insulating film 104 in a region not overlapping with the oxide semiconductor film 108a is decreased. In the processing of the conductive film 112_0 and the insulating film 110_0, an etchant or an etching gas (e.g., chlorine) might be added to the oxide semiconductor film 108a or the constituent element of the conductive film 112_0 or the insulating film 110_0 might be added to the oxide semiconductor film 108a.

Then, the insulating film 116 is formed over the insulating film 104, the oxide semiconductor film 108, and the conductive film 112. By forming the insulating film 116, part of the oxide semiconductor film 108a in contact with the insulating film 116 becomes the region 108n. Here, the oxide semiconductor film 108a overlapping with the conductive film 112 is the oxide semiconductor film 108 (see FIG. 18C).

The insulating film 116 can be formed using a material selected from the above-mentioned materials. In this embodiment, as the insulating film 116, a 100-nm-thick silicon nitride oxide film is formed with a PECVD apparatus. In the formation of the silicon nitride oxide film, plasma treatment and deposition treatment are performed at 220° C. The plasma treatment is performed before deposition under the following conditions: an argon gas at a flow rate of 100 sccm and a nitrogen gas at a flow rate of 1000 sccm are introduced into a chamber, the pressure in the chamber is set to 40 Pa, and power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and power of 1000 W is supplied to the RF power source (27.12 MHz).

With the use of a silicon nitride oxide film as the insulating film 116, nitrogen or hydrogen in the silicon nitride oxide film can be supplied to the region 108n in contact with the insulating film 116. Moreover, when the temperature in forming the insulating film 116 is the above-mentioned temperature, release of excess oxygen contained in the insulating film 110 to the outside can be suppressed.

Figure 19A:
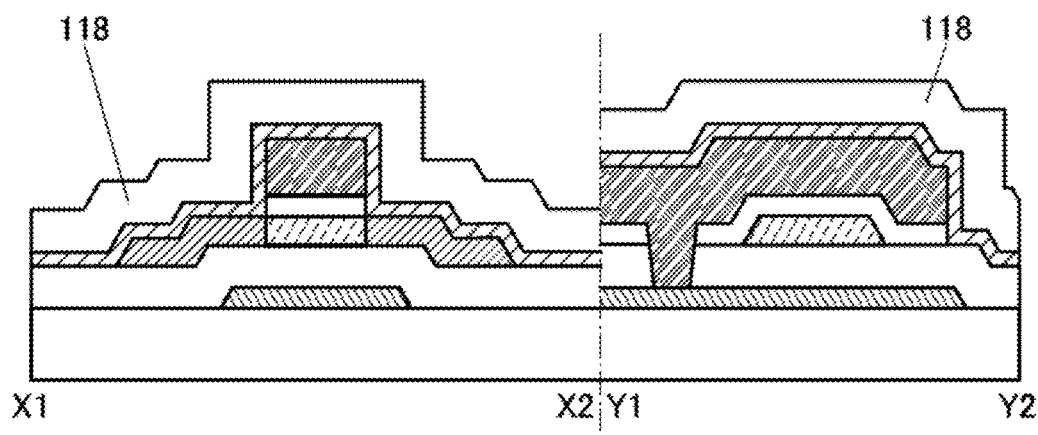
FIGS. 19A to 19C are cross-sectional views illustrating a method for manufacturing a semiconductor device.
Figure 19B:
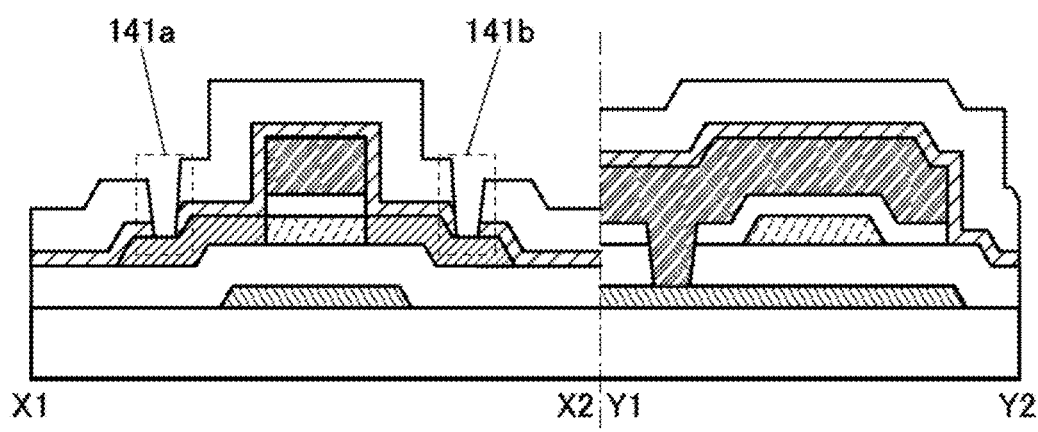

Next, the insulating film 118 is formed over the insulating film 116 (see FIG. 19A).

The insulating film 118 can be formed using a material selected from the above-mentioned materials. In this embodiment, as the insulating film 118, a 300-nm-thick silicon oxynitride film is formed with a PECVD apparatus.

Then, a mask is formed over desired positions of the insulating film 118 by lithography, and the insulating film 118 and the insulating film 116 are partly etched. Thus, the openings 141a and 141b reaching the region 108n are formed (see FIG. 19B).

To etch the insulating films 118 and 116, a wet etching method and/or a dry etching method can be used. In this embodiment, the insulating films 118 and 116 are processed by a dry etching method.

Figure 19C:
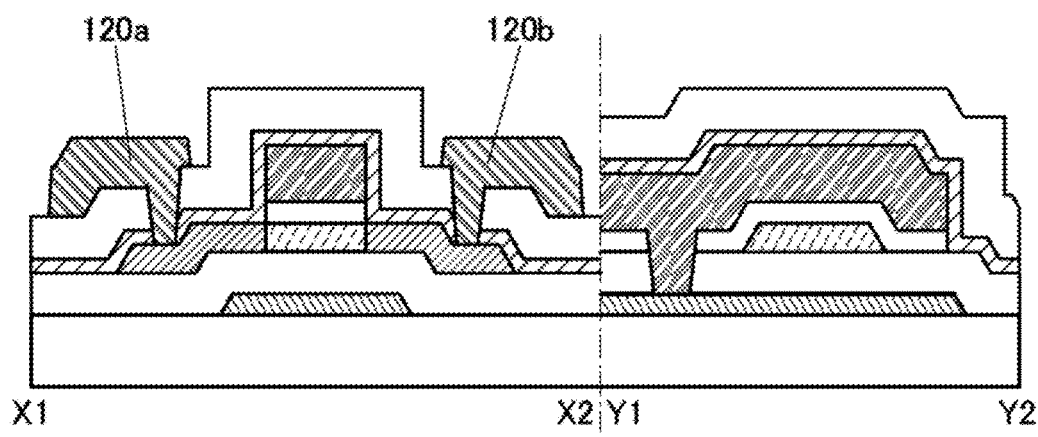

Next, a conductive film is formed over the region 108n and the insulating film 118 to cover the openings 141a and 141b, and processed into desired shapes, so that the conductive films 120a and 120b are formed (see FIG. 19C).

The conductive films 120a and 120b can be formed using a material selected from the above-mentioned materials. In this embodiment, as the conductive films 120a and 120b, a layered film including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method and then the tungsten film is etched by a dry etching method.

Next, the insulating film 122 covering the conductive films 120a and 120b and the insulating film 118 is formed.

Through the above process, the transistor 150 in FIGS. 16A to 16C can be fabricated.

<4-5. Structural Example 3 of Semiconductor Device>

Next, a structure that is different from the structures of the above-described transistors will be described with reference to FIGS. 20A to 20C and FIGS. 21A to 21C.

Figure 20A:
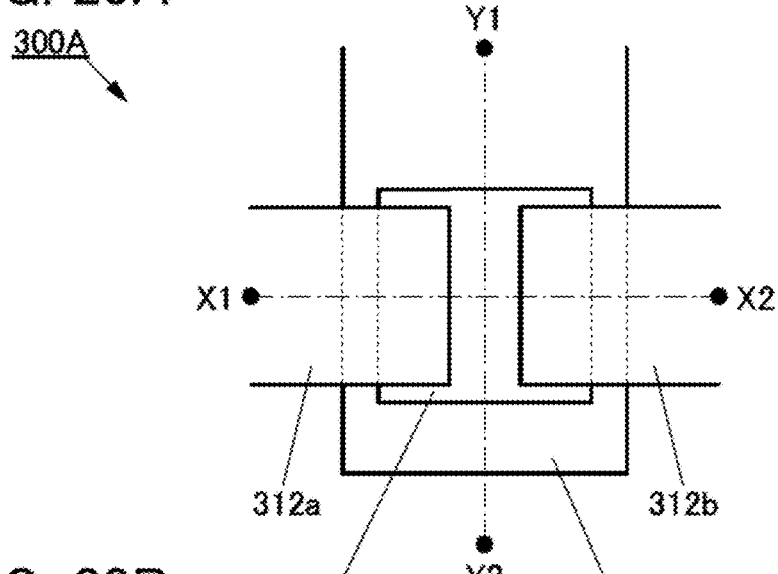
FIGS. 20A to 20C are a top view and cross-sectional views illustrating a semiconductor device.
Figure 20B:
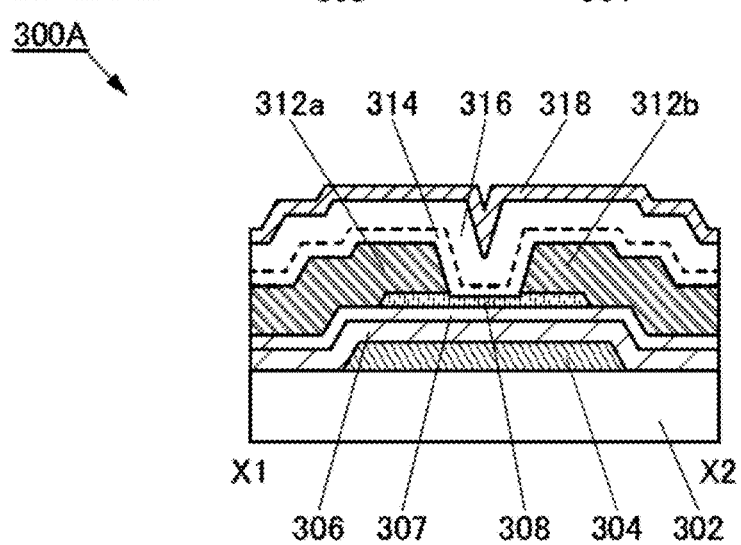
Figure 20C:
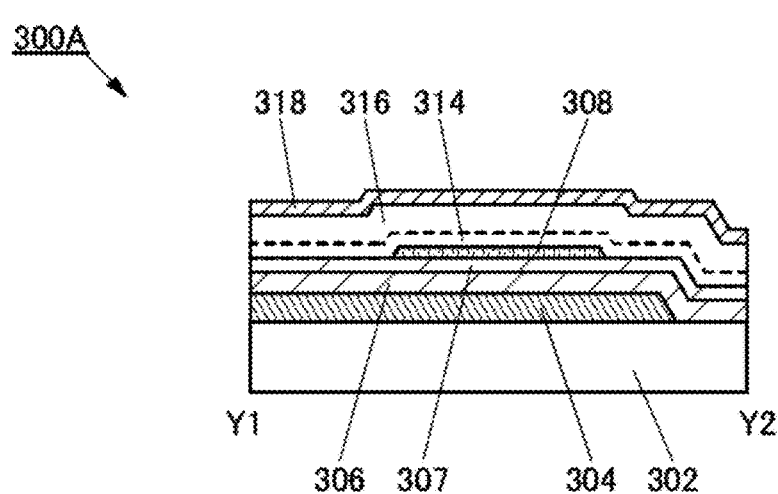

FIG. 20A is a top view of a transistor 300A. FIG. 20B is a cross-sectional view taken along a dashed-dotted line X1-X2 in FIG. 20A. FIG. 20C is a cross-sectional view taken along a dashed-dotted line Y1-Y2 in FIG. 20A. Note that in FIG. 20A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 20A, some components are not illustrated in some cases in top views of transistors described below.

The transistor 300A illustrated in FIGS. 20A to 20C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, an insulating film 314, an insulating film 316, and an insulating film 318 are provided.

In the transistor 300A, the insulating films 306 and 307 each function as the gate insulating film of the transistor 300A, and the insulating films 314, 316, and 318 each function as a protective insulating film of the transistor 300A. Furthermore, in the transistor 300A, the conductive film 304 functions as a gate electrode, the conductive film 312a functions as a source electrode, and the conductive film 312b functions as a drain electrode.

Figure 31B:
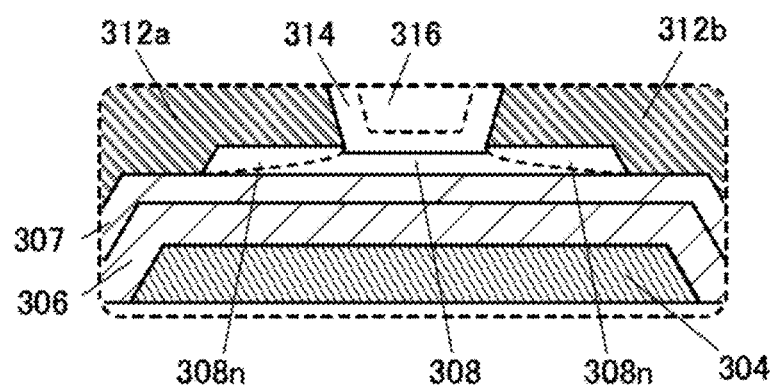

As illustrated in FIG. 31B, the oxide semiconductor film 308 may include a region 308n in a region in contact with the conductive film 312a or the conductive film 312b. The regions 308n are regions where the oxide semiconductor film 308 becomes n-type like the above-described oxide semiconductor film 108. The region 308n is formed mainly in the following manner: oxygen in the oxide semiconductor film 308 is extracted by the conductive film 312a or the conductive film 312b in contact with the oxide semiconductor film 308, or a conductive material contained in the conductive film 312a or the conductive film 312b is bonded to an element in the oxide semiconductor film 308. The region 308n can reduce the contact resistance between the conductive film 312a or the conductive film 312b and the oxide semiconductor film 308, whereby on-state current of the transistor 300A can be increased.

In the oxide semiconductor film 308, a boundary between the region 308n functioning as a source region or a drain region and the region functioning as the channel formation region cannot be clearly observed in some cases.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 20A to 20C is a channel-etched transistor. The oxide semiconductor film of one embodiment of the present invention can be used suitably for the channel-etched transistor.

<4-6. Structural Example 4 of Semiconductor Device>

Figure 21A:
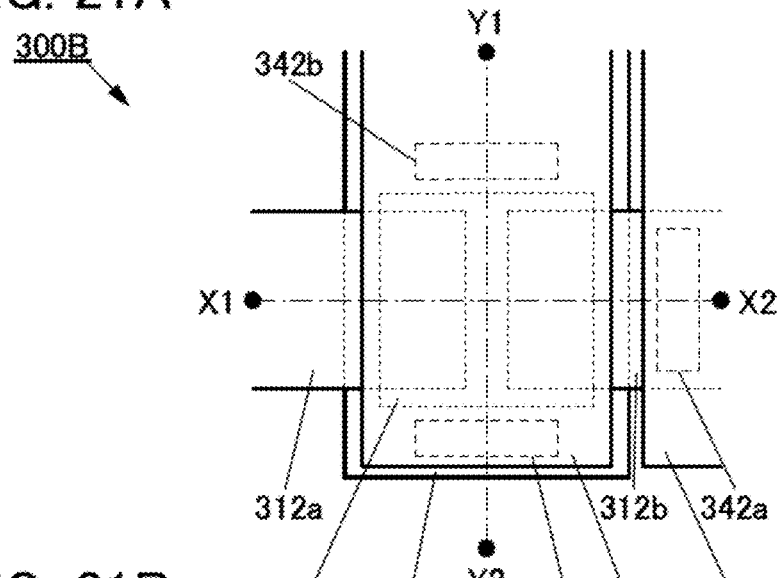
FIGS. 21A to 21C are a top view and cross-sectional views illustrating a semiconductor device.
Figure 21B:
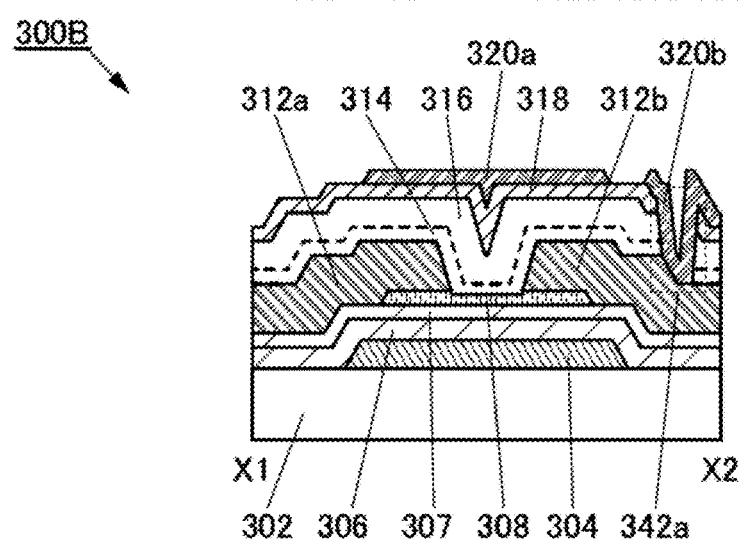
Figure 21C:
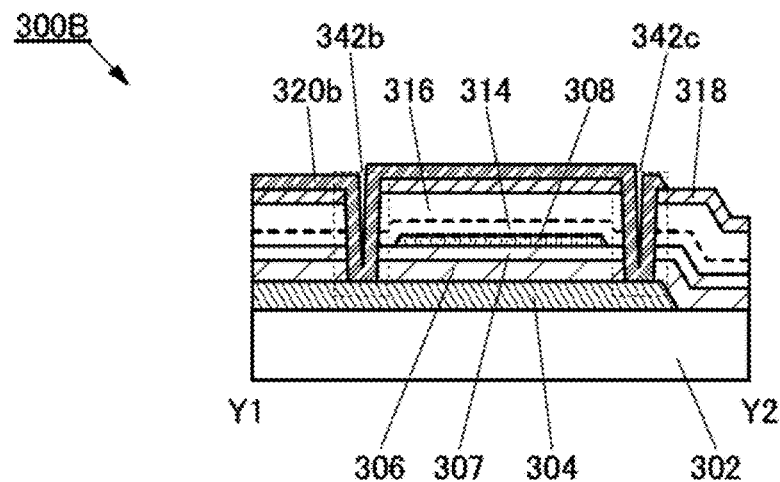

FIG. 21A is a top view of a transistor 300B. FIG. 21B is a cross-sectional view taken along a dashed-dotted line X1-X2 in FIG. 21A. FIG. 21C is a cross-sectional view taken along a dashed-dotted line Y1-Y2 in FIG. 21A.

The transistor 300B illustrated in FIGS. 21A to 21C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300B, the insulating films 306 and 307 each function as a first gate insulating film of the transistor 300B, and the insulating films 314, 316, and 318 each function as a second gate insulating film of the transistor 300B. Furthermore, in the transistor 300B, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 21C, the conductive film 320a is connected to the conductive film 304 in an opening 342b and an opening 342c provided in the insulating films 306, 307, 314, 316, and 318. Thus, the same potential is applied to the conductive film 320a and the conductive film 304.

The structure of the transistor 300B is not limited to that described above, in which the openings 342b and 342c are provided so that the conductive film 320a is connected to the conductive film 304. For example, a structure in which only one of the openings 342b and 342c is provided so that the conductive film 320a is connected to the conductive film 304, or a structure in which the openings 342b and 342c are not provided and the conductive film 320a and the conductive film 304 are not connected to each other may be employed. Note that in the case where the conductive film 320a and not connected to the conductive film 304 are not connected to each other, it is possible to apply different potentials to the conductive film 320a and the conductive film 304.

The conductive film 320b is connected to the conductive film 312b through an opening 342a provided in the insulating films 314, 316, and 318.

Note that the transistor 300B has the S-channel structure described above.

Note that the films (the insulating film, the metal oxide film, the oxide semiconductor film, the conductive film, and the like) included in the transistor described in this embodiment can be formed by a sputtering method, a chemical vapor deposition (CVD) method, a vacuum evaporation method, a pulsed laser deposition (PLD) method, or an ALD method. Alternatively, a coating method or a printing method can be used. Although the sputtering method and a plasma-enhanced chemical vapor deposition (PECVD) method are typical examples of the film formation method, a thermal CVD method may be used. As an example of a thermal CVD method, a metal organic chemical vapor deposition (MOCVD) method can be given.

At least part of this embodiment can be implemented in combination with any of the other embodiments and the other examples described in this specification as appropriate.

Embodiment 5

In this embodiment, examples of a display device that includes the transistor described in the above embodiments will be described below with reference to FIG. 22, FIG. 23, and FIG. 24.

Figure 22:
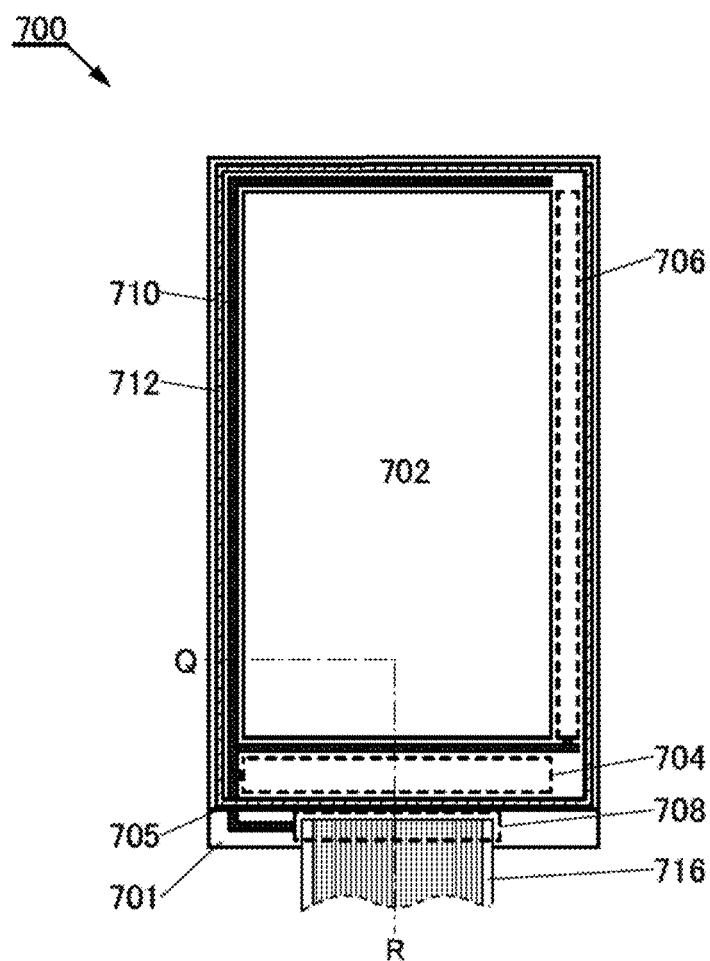
FIG. 22 is a top view illustrating one embodiment of a display device.

FIG. 22 is a top view illustrating an example of a display device. A display device 700 in FIG. 22 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 22, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element and an EL element as display elements will be described with reference to FIG. 23 and FIG. 24. FIG. 23 is a cross-sectional view taken along a dashed-dotted line Q-R in FIG. 22. In FIG. 23, an EL element is used as a display element. FIG. 24 is a cross-sectional view taken along the dashed-dotted line Q-R in FIG. 22. In FIG. 24, a liquid crystal element is used as a display element.

Portions common to FIG. 23 and FIG. 24 will be described first, and then, different portions will be described.
<5-1. Portions Common to Display Devices>
The display device 700 in FIG. 23 and FIG. 24 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 300B described above. Note that the transistor 750 and the transistor 752 may each have the structure of any of the other transistors described in the above embodiments.

The transistor used in this embodiment includes an oxide semiconductor film that is highly purified and in which formation of oxygen vacancies are suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes of the transistor 750. Between the lower electrode and the upper electrode, an insulating film formed through a step of forming an insulating film to be an insulating film functioning as a first gate insulating film of the transistor 750 are provided. That is, the capacitor 790 has a stacked-layer structure in which an insulating film functioning as a dielectric film is positioned between the pair of electrodes.

Figure 23:
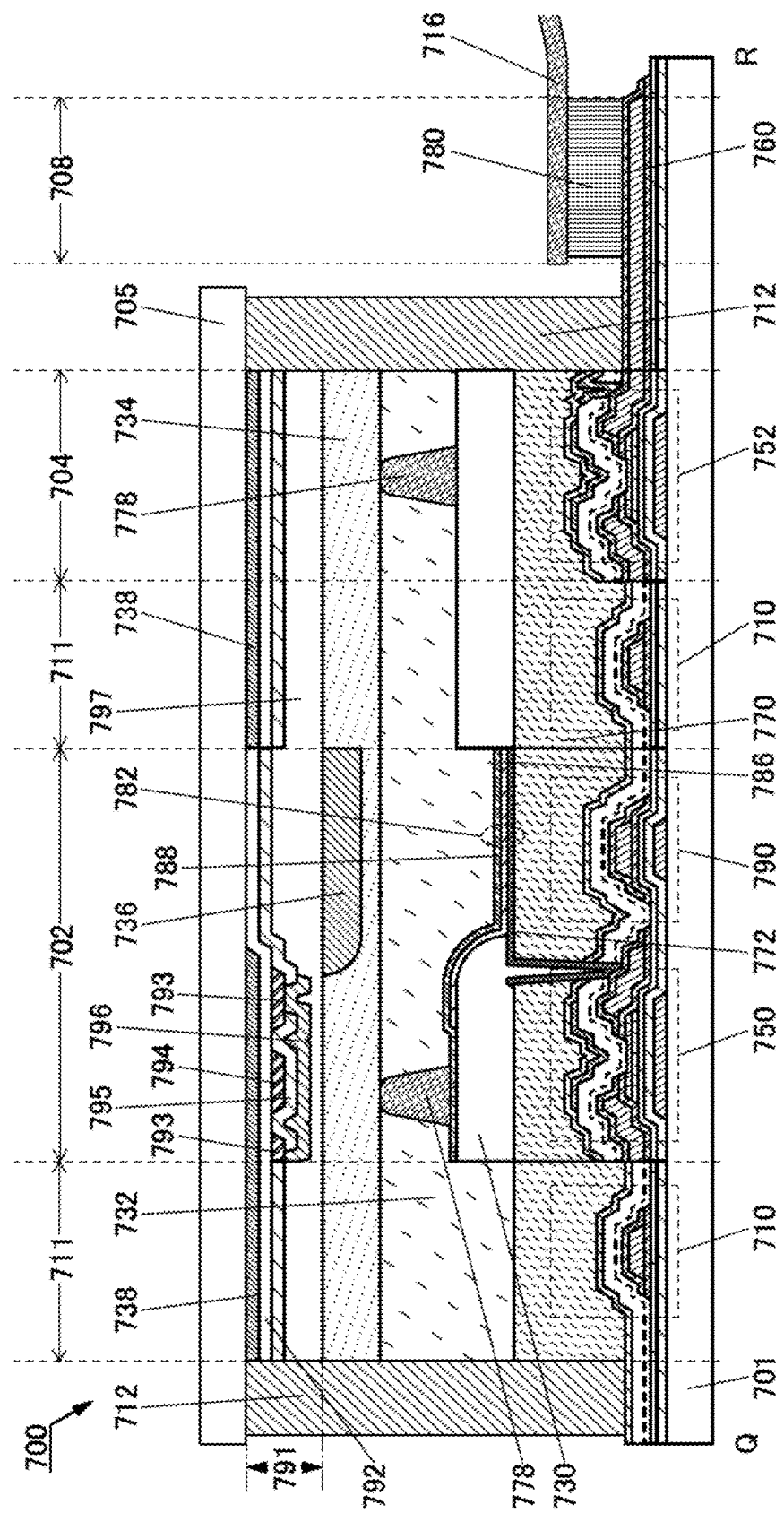
FIG. 23 is a cross-sectional view illustrating one embodiment of a display device.
Figure 24:
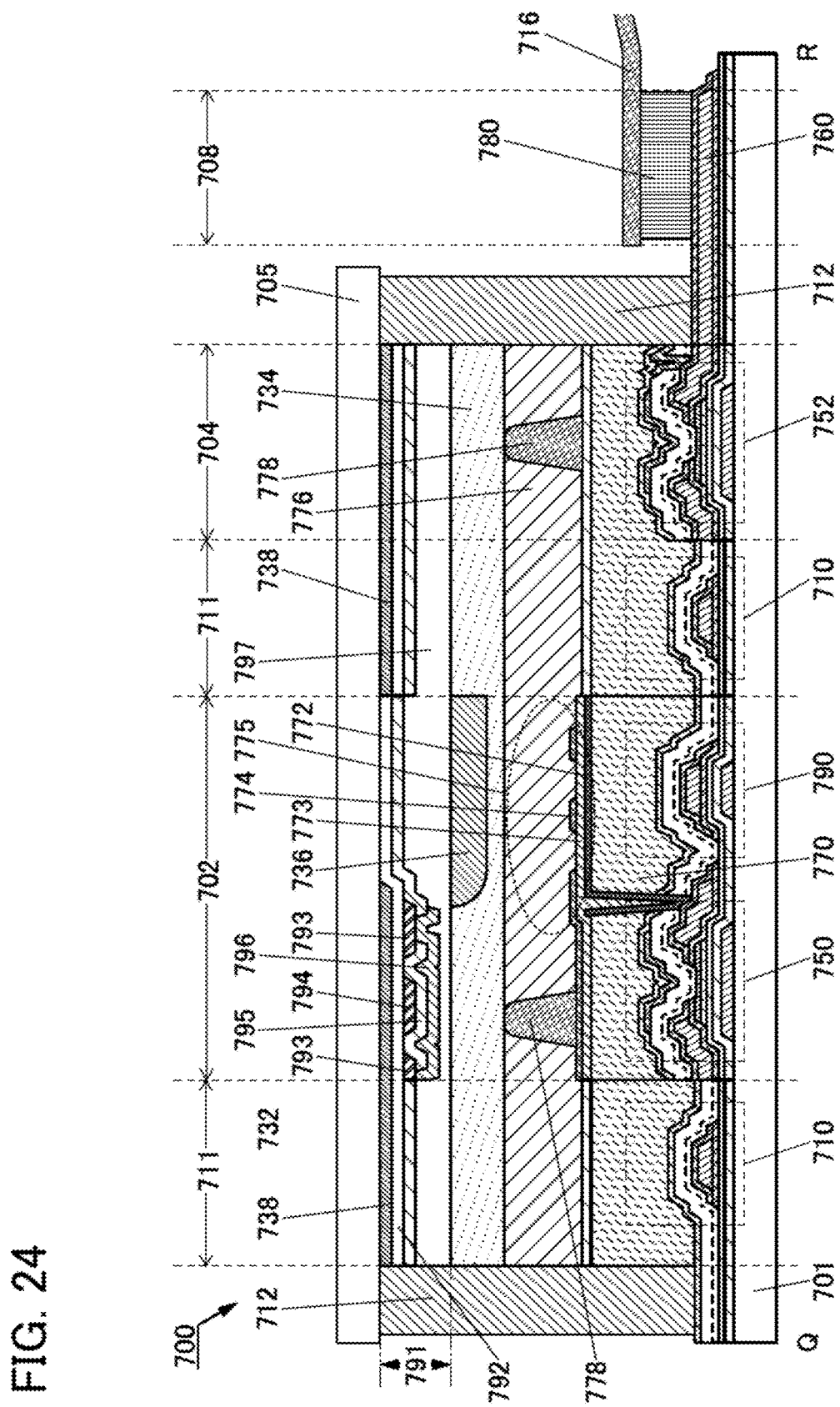
FIG. 24 is a cross-sectional view illustrating one embodiment of a display device.

In FIG. 23 and FIG. 24, a planarization insulating film 770 is provided over the transistor 750, the transistor 752, and the capacitor 790.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 23 and FIG. 24 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and the inverted staggered transistor described in Embodiment 1 is used in the source driver circuit portion 704, or a structure in which the inverted staggered transistor described in Embodiment 1 is used in the pixel portion 702 and a staggered transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material containing a copper, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<5-2. Structural Example of Input/Output Device Included in Display Device>

In the display device 700 illustrated in FIG. 23 and FIG. 24, a touch panel 791 is provided as an input/output device. Note that the display device 700 may have a structure without including the touch panel 791.

The touch panel 791 illustrated in FIG. 23 and FIG. 24 is what is called an in-cell touch panel provided between the second substrate 705 and the coloring film 736. The touch panel 791 is formed on the second substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 23 and FIG. 24. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 23 and FIG. 24 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 23, it is preferable that the electrode 793 do not overlap with the light-emitting element 782. As illustrated in FIG. 24, it is preferable that the electrode 793 do not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 $\Omega$/sq. and less than or equal to 100 $\Omega$/sq.

Although the structure of the in-cell touch panel is illustrated in FIG. 23 and FIG. 24, one embodiment of the present invention is not limited thereto. For example, a touch panel formed over the display device 700, what is called an on-cell touch panel, or a touch panel attached to the display device 700, what is called an out-cell touch panel may be used. In this manner, the display device 700 of one embodiment of the present invention can be combined with various types of touch panels.

<5-3. Display Device Including Light-Emitting Element>

The display device 700 illustrated in FIG. 23 includes a light-emitting element 782. The light-emitting element 782 includes a conductive film 772, an EL layer 786, and a conductive film 788. The display device 700 illustrated in FIG. 23 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 23, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 26, in which the coloring film 736 is provided. For example, a structure without the coloring film 736 may also be employed in the case where the EL layer 786 is formed by separate coloring.

<5-4. Structural Example of Display Device Including Liquid Crystal Element>

The display device 700 in FIG. 24 includes the liquid crystal element 775. The liquid crystal element 775 includes the conductive film 772, an insulating film 773, a conductive film 774, and a liquid crystal layer 776. The conductive film 774 functions as a common electrode, and the alignment state in the liquid crystal layer 776 can be controlled by an electric field generated between the conductive film 772 and the conductive film 774 with the insulating film 773 positioned therebetween. The display device 700 in FIG. 24 can display an image in such a manner that transmission or non-transmission of light is controlled by the alignment state in the liquid crystal layer 776 which is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light. In this embodiment, the conductive film that reflects visible light is used for the conductive film 772.

Although FIG. 24 illustrates an example in which the conductive film 772 is connected to the conductive film functioning as the drain electrode of the transistor 750, one embodiment of the present invention is not limited to this example. For example, the conductive film 772 may be electrically connected to the conductive film functioning as the drain electrode of the transistor 750 through a conductive film functioning as a connection electrode.

Although not illustrated in FIG. 24, an alignment film may be provided in a position in contact with the liquid crystal layer 776. Although not illustrated in FIG. 24, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

At least part of this embodiment can be implemented in combination with any of the other embodiments and the other examples described in this specification as appropriate.

Embodiment 6

In this embodiment, an example of a display panel which can be used for a display portion or the like in a display device including the semiconductor device of one embodiment of the present invention will be described with reference to FIG. 25 and FIG. 26. The display panel described below as an example includes both a reflective liquid crystal element and a light-emitting element and can display an image in both the transmissive mode and the reflective mode.

<6-1. Structural Example of Display Panel>

Figure 25:
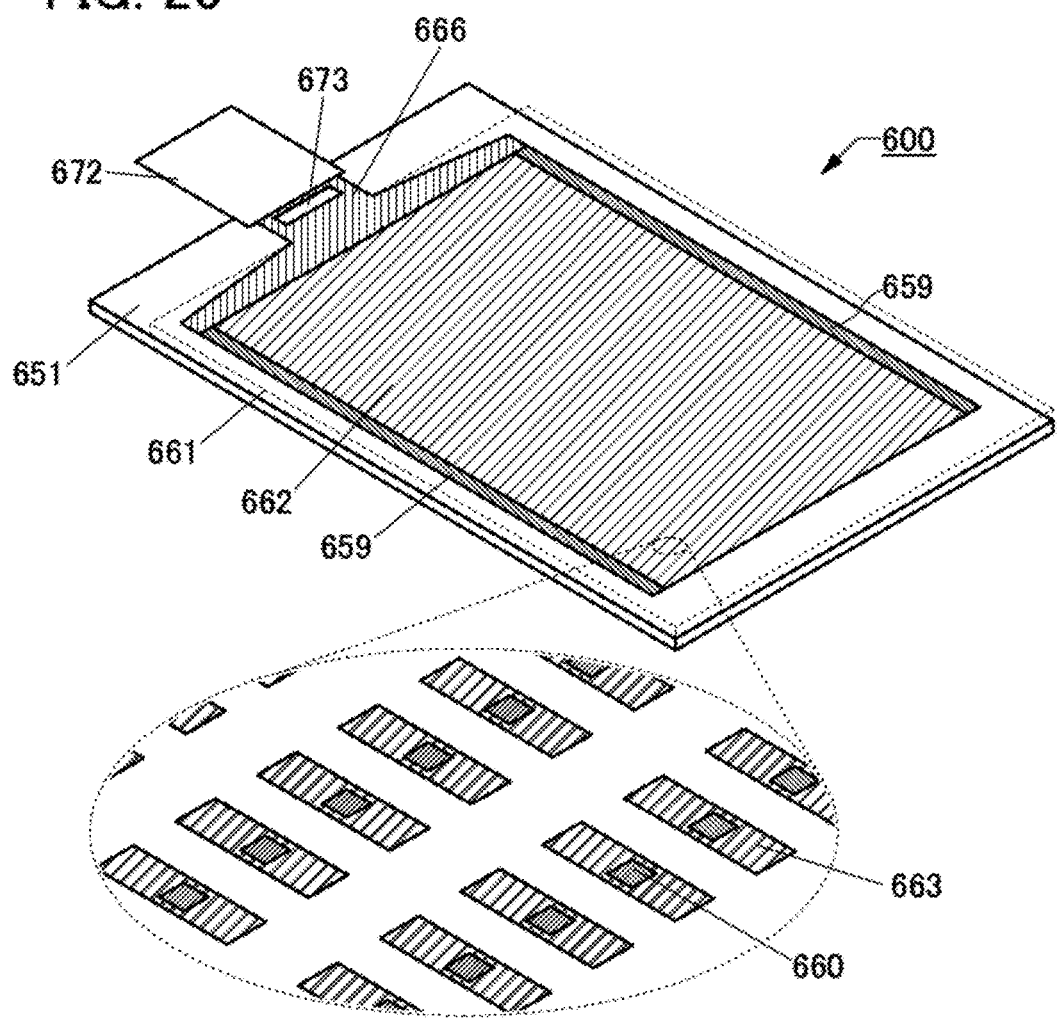
FIG. 25 illustrates a structural example of a display panel.

FIG. 25 is a schematic perspective view illustrating a display panel 600 of one embodiment of the present invention. In the display panel 600, a substrate 651 and a substrate 661 are attached to each other. In FIG. 25, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 25, an IC 673 and an FPC 672 are mounted on the substrate 651. Thus, the structure illustrated in FIG. 25 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion 662 or the circuit 659. The signal or electric power is input to the wiring 666 from the outside through the FPC 672 or from the IC 673.

FIG. 25 shows an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 25 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 25, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<6-2. Cross-Sectional Structural Example>

Figure 26:
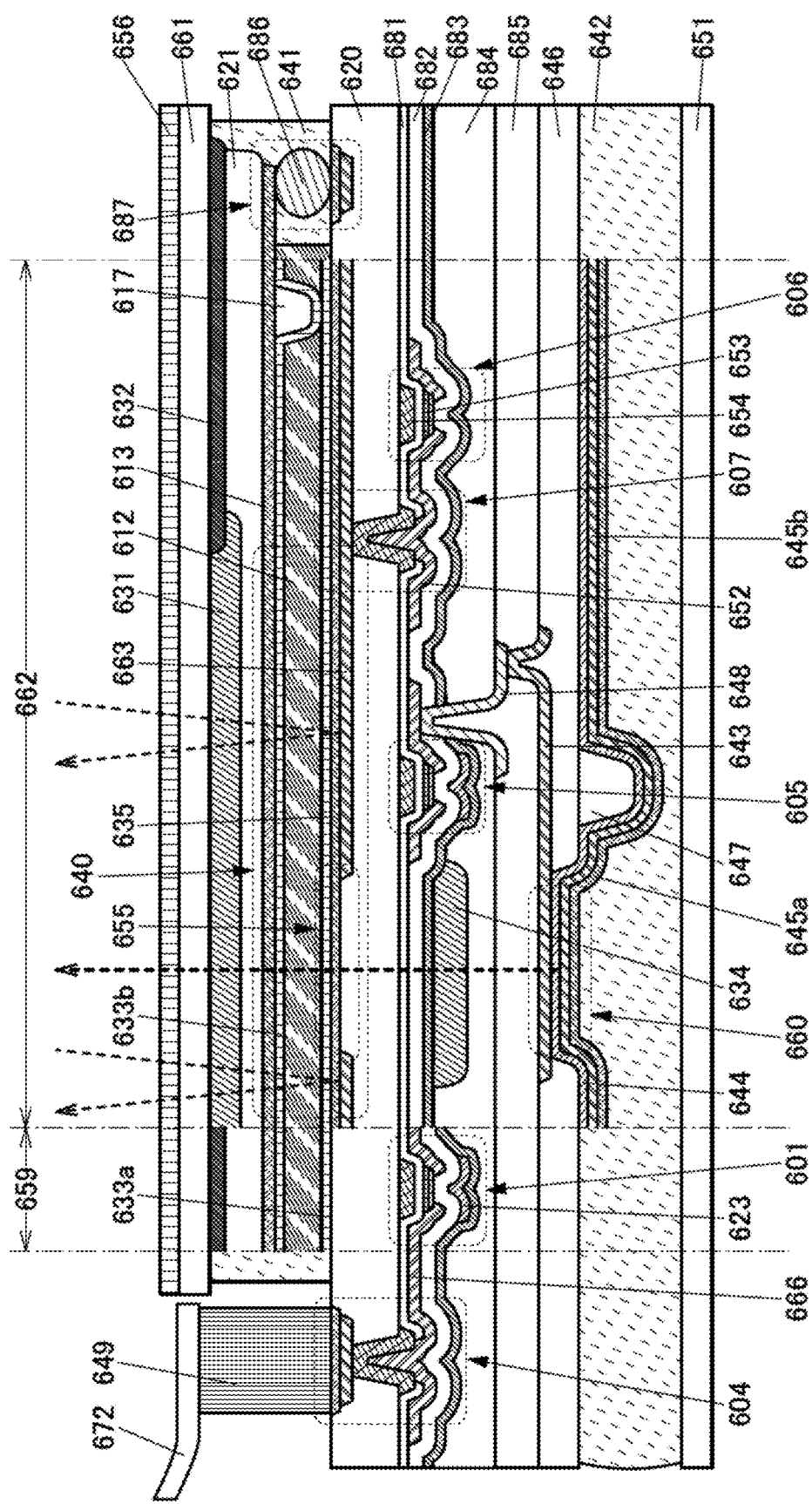
FIG. 26 illustrates a structural example of a display panel.

FIG. 26 shows an example of cross sections of part of a region including the FPC 672, part of a region including the circuit 659, and part of a region including the display portion 662 of the display panel illustrated in FIG. 25.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633a is provided between the liquid crystal layer 612 and the conductive film 635 and the alignment film 633b is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive films 663 and 635, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645*b* are stacked in this order from the insulating film 620 side. In addition, a conductive film 645*a* is provided to cover the conductive film 645*b*. The conductive film 645*b* contains a material reflecting visible light, and the conductive films 643 and 645*a* contain a material transmitting visible light. Light is emitted from the light-emitting element 660 to the substrate 661 side through the coloring layer 634, the insulating film 620, the opening 655, the conductive film 613, and the like.

Here, as illustrated in FIG. 26, the conductive film 635 transmitting visible light is preferably provided for the opening 655. Accordingly, the liquid crystal is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645*a* is formed using a blocking mask (metal mask), the insulating film 647 may have a function of preventing the blocking mask from being in contact with a surface on which the EL layer 644 or the conductive film 645*a* is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrate 651 and the substrate 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 26, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 26 illustrates an example of the circuit 659 in which the transistor 601 is provided.

The structure in which the semiconductor film 653 where a channel is formed is provided between two gates is used as an example of the transistors 601 and 605 in FIG. 26. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, the liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive film 635.

<6-3. Components>

The above components will be described below. Note that description of structures having functions similar to those in the above embodiments is omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

<6-4. Manufacturing Method Example>

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

At least part of this embodiment can be implemented in combination with any of the other embodiments and the other examples described in this specification as appropriate.

Embodiment 7

In this embodiment, a display device including a semiconductor device of one embodiment of the present invention will be described with reference to FIGS. 27A to 27C.

<7. Circuit Configuration of Display Device>

A display device illustrated in FIG. 27A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504*b* has a function of supplying an initialization signal. Without being limited thereto, another signal can be supplied from the source driver 504*b*.

The source driver 504*b* includes a plurality of analog switches, for example. The source driver 504*b* can output, as data signals, time-divided image signals obtained by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504*a*. For example, to the pixel circuit 501 in the m-th row and the n-th column (m is a natural number of X or less, and n is a natural number of Y or less), a pulse signal is input from the gate driver 504*a* through the scan line GL_m, and a data signal is input from the source driver 504*b* through the data line DL_n in accordance with the potential of the scan line GL_m.

Figure 27A:
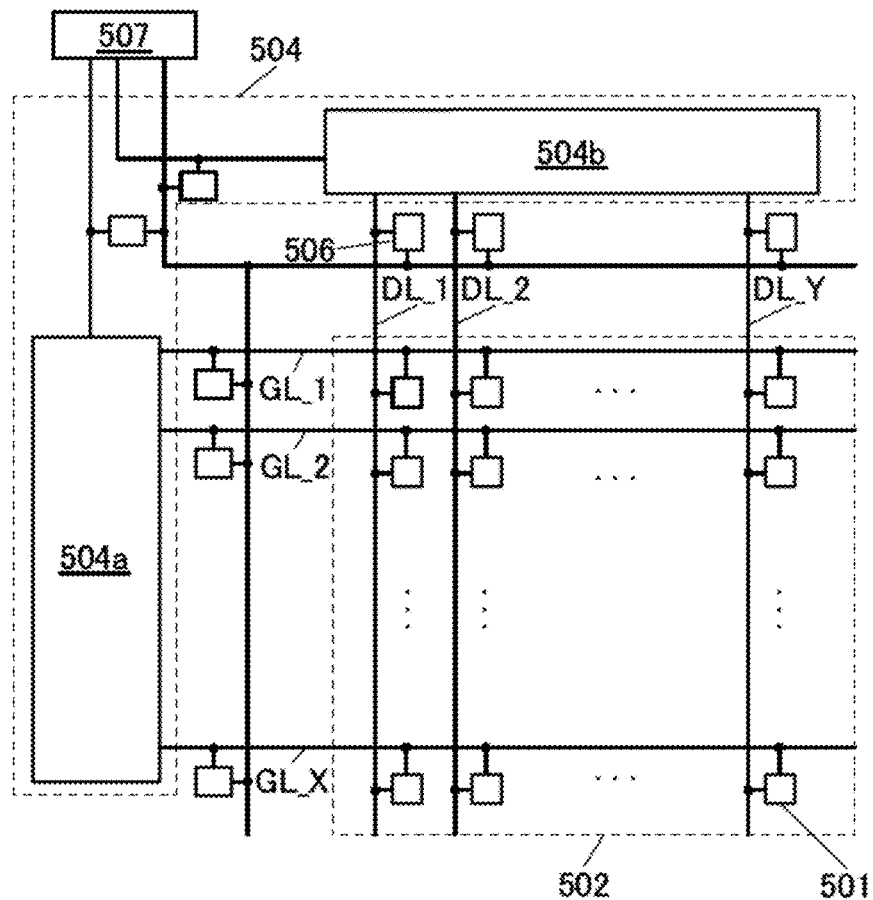
FIGS. 27A to 27C are a block diagram and circuit diagrams illustrating a display device.

The protection circuit 506 in FIG. 27A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 27A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504*a* or the source driver 504*b*. Alternatively, the protection circuit 506 can be connected to the terminal portion 507.

One embodiment of the present invention is not limited to the example in FIG. 27A, in which the driver circuit portion 504 includes the gate driver 504*a* and the source driver 504*b*. For example, only the gate driver 504*a* may be formed, and a separately prepared substrate over which a source driver circuit is formed (e.g., a driver circuit board formed using a single-crystal semiconductor film or a polycrystalline semiconductor film) may be mounted.

Figure 27B:
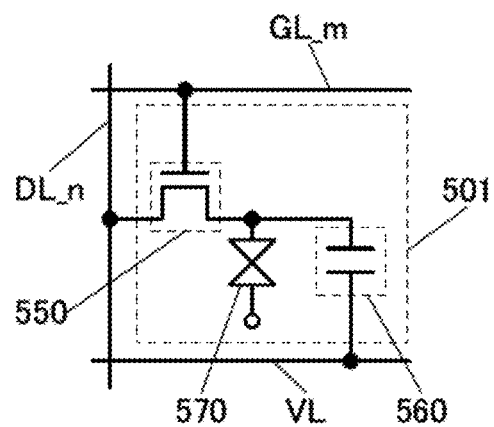

Each of the plurality of pixel circuits 501 in FIG. 27A can have the configuration illustrated in FIG. 27B, for example.

The pixel circuit 501 in FIG. 27B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 27B, the gate driver 504*a* in FIG. 27A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 27C:
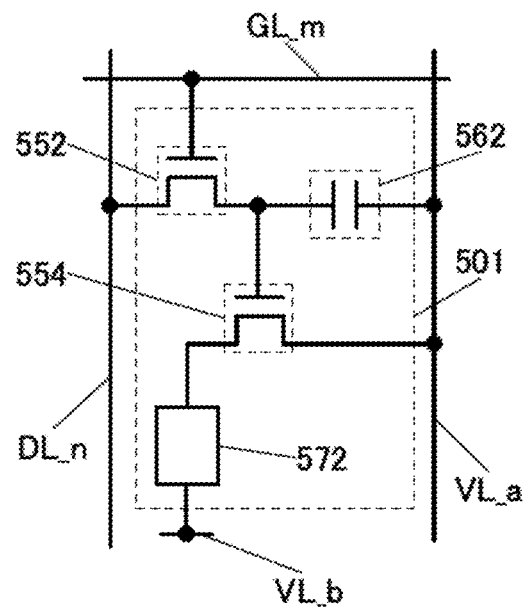

Alternatively, each of the plurality of pixel circuits 501 in FIG. 27A can have the configuration illustrated in FIG. 27C, for example.

The pixel circuit 501 in FIG. 27C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 27C, the gate driver 504a in FIG. 27A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments and the other examples described in this specification as appropriate.

Embodiment 8

In this embodiment, a display module and electronic devices, each of which includes a semiconductor device of one embodiment of the present invention, will be described with reference to FIG. 28, FIGS. 29A to 29E, and FIGS. 30A to 30G.

<8-1. Display Module>

Figure 28:
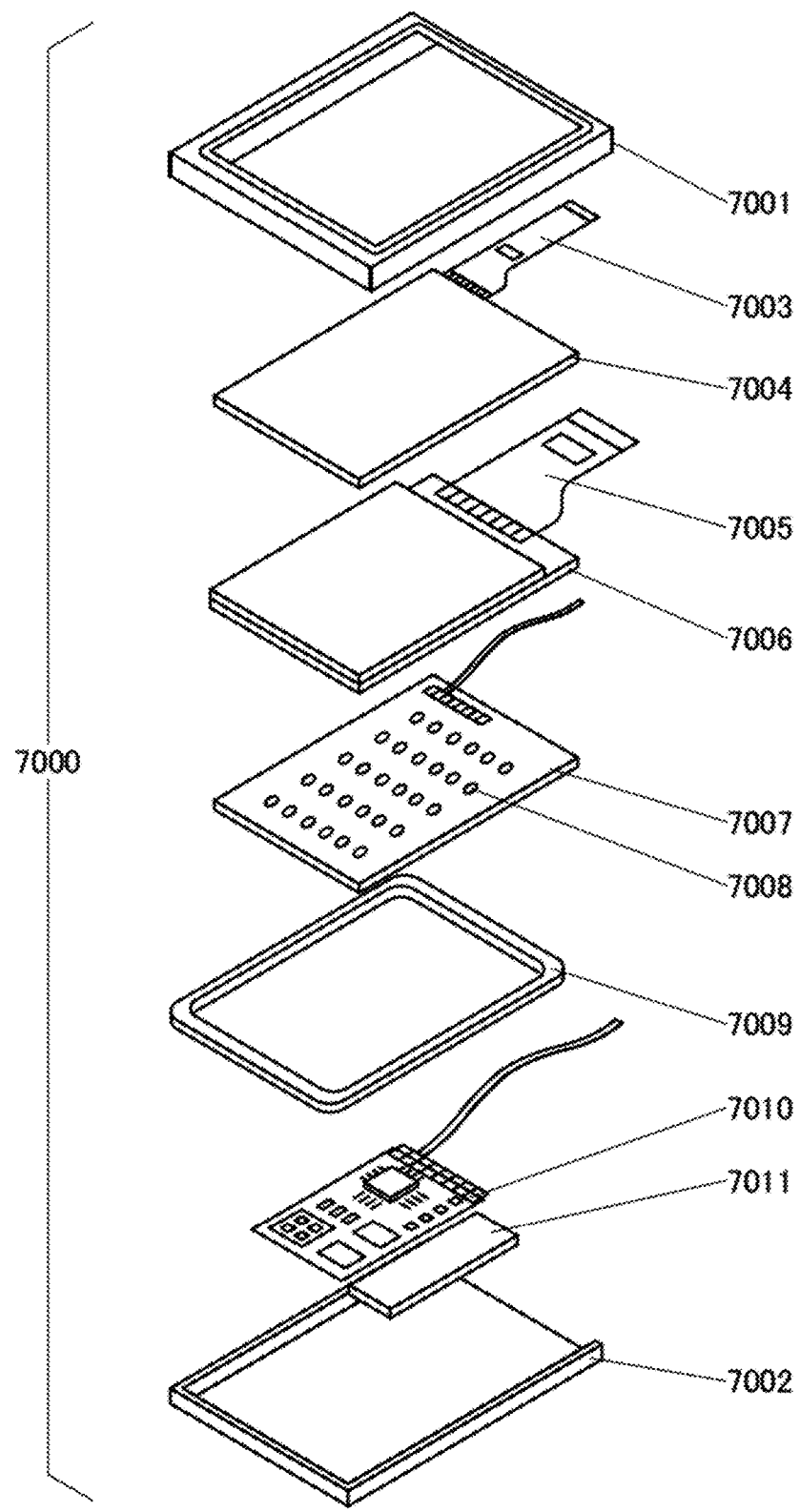
FIG. 28 illustrates a display module.

In a display module 7000 illustrated in FIG. 28, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 28, in which the light source 7008 is provided over the backlight 7007. For example, a structure in which the light source 7008 is provided at an end portion of the backlight 7007 and a light diffusion plate is further provided may be employed. Note that the backlight 7007 is not necessarily provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<8-2. Electronic Device 1>

Next, FIGS. 29A to 29E illustrate examples of electronic devices.

Figure 29A:
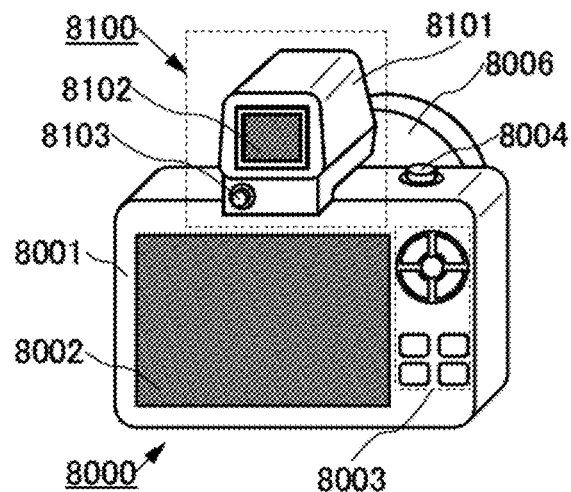
FIGS. 29A to 29E illustrate electronic devices.

FIG. 29A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 29A, the housing 8001 of the camera 8000 may include a finder having a display device.

Figure 29B:
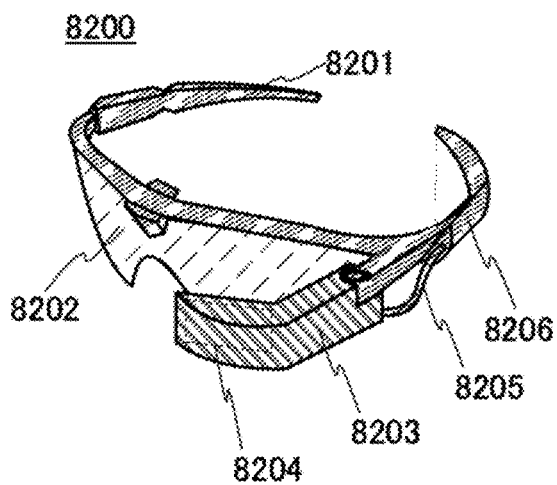

FIG. 29B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 29C:
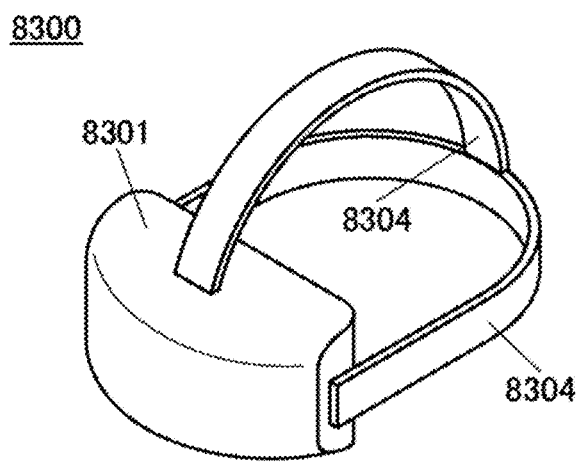
Figure 29D:
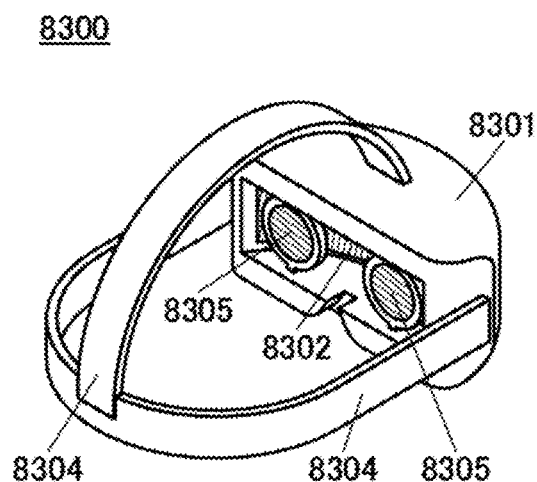
Figure 29E:
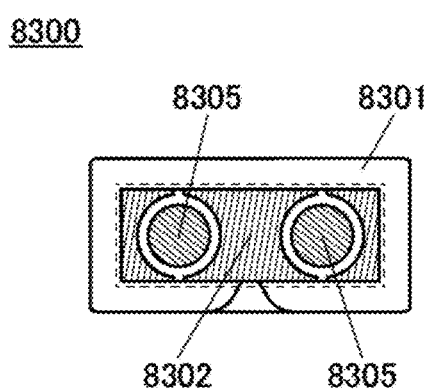

FIGS. 29C to 29E are external views of a head-mounted display 8300. The head-mounted display 8300 includes a housing 8301, a display portion 8302, a fixing band 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 29E, the user does not perceive pixels, and thus a more realistic image can be displayed.

<8-3. Electronic Device 2>

Next, FIGS. 30A to 30G illustrate examples of electronic devices that are different from those illustrated in FIGS. 29A to 29E.

Electronic devices illustrated in FIGS. 30A to 30G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 30A to 30G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 30A to 30G are not limited thereto, and the electronic devices can have a variety of functions. Although not illustrated in FIGS. 30A to 30G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 30A to 30G will be described in detail below.

Figure 30A:
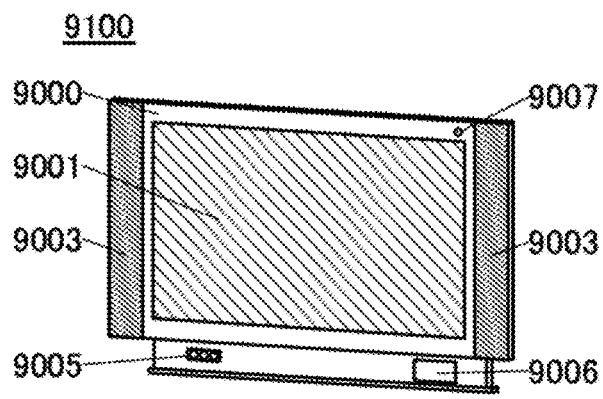
FIGS. 30A to 30G illustrate electronic devices.

FIG. 30A is a perspective view illustrating a television device 9100. The television device 9100 can include the display portion 9001 having a large screen size of, for example, 50 inches or more, or 100 inches or more.

Figure 30D:
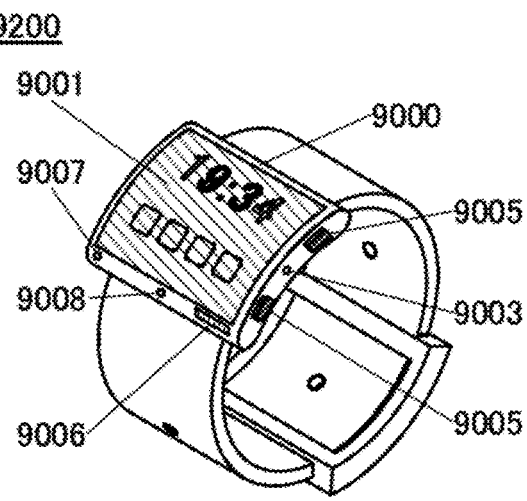
Figure 30B:
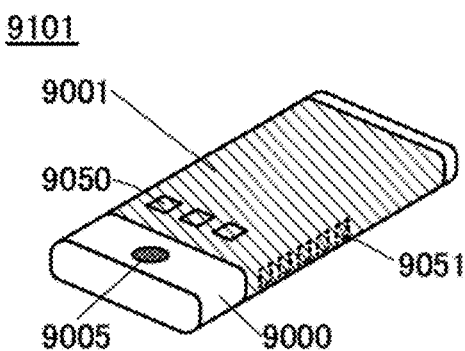

FIG. 30B is a perspective view of a portable information terminal 9101. The portable information terminal 9101 functions as, for example, one or a plurality of a telephone set, a notebook, and an information browsing system. Specifically, the portable information terminal 9101 can be used as a smartphone. Note that the portable information terminal 9101 may include the speaker 9003, the connection terminal 9006, the sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 30E:
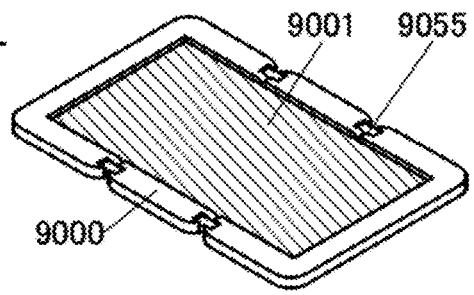
Figure 30C:
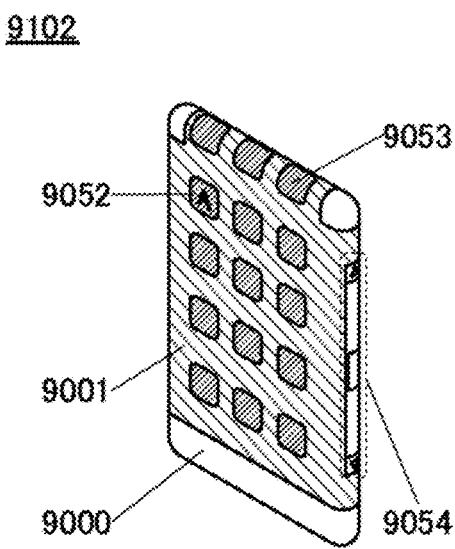

FIG. 30C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 30D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 30F:
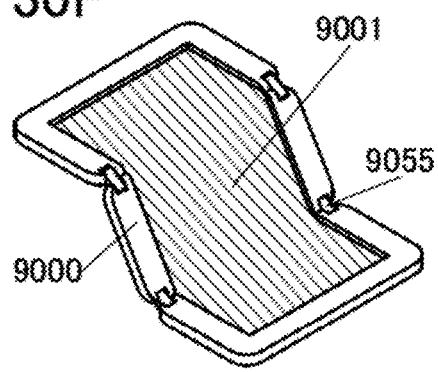
Figure 30G:
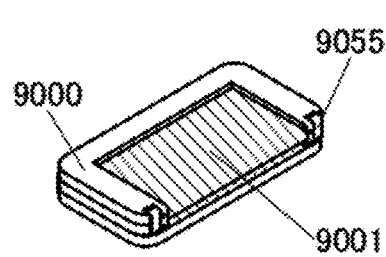

FIGS. 30E, 30F, and 30G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Electronic devices described in this embodiment are characterized by having a display portion for displaying some sort of information. Note that the semiconductor device of one embodiment of the present invention can also be used for an electronic device that does not have a display portion.

At least part of this embodiment can be implemented in combination with any of the other embodiments and the other examples described in this specification as appropriate.

Example 1

In this example, the impurity concentration in a semiconductor film formed with the sputtering apparatus of one embodiment of the present invention, here, an oxide semiconductor film containing In, Ga, and Zn, was measured.

Note that the impurity concentration in the oxide semiconductor film was measured by secondary ion mass spectrometry (SIMS).

In this example, a 100-nm-thick oxide semiconductor film was formed under Condition 2 shown in Table 1 in Embodiment 1. FIGS. 32A to 32D show the results of the impurity concentration in the oxide semiconductor film.

Figure 32A:
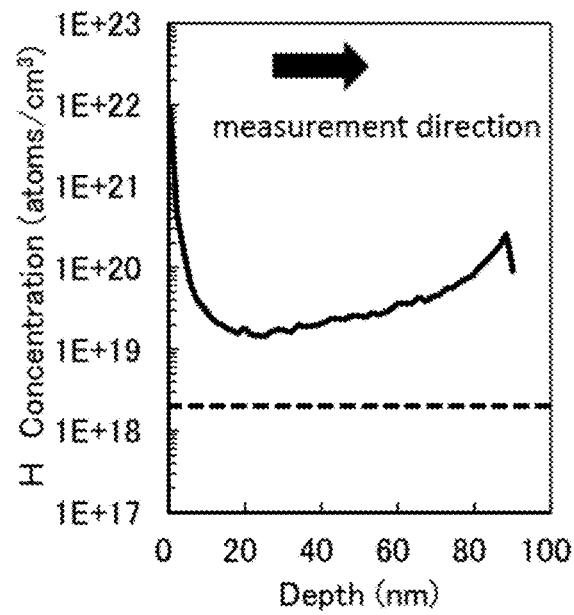
FIGS. 32A to 32D each show the concentration of an impurity in a semiconductor film.
Figure 32B:
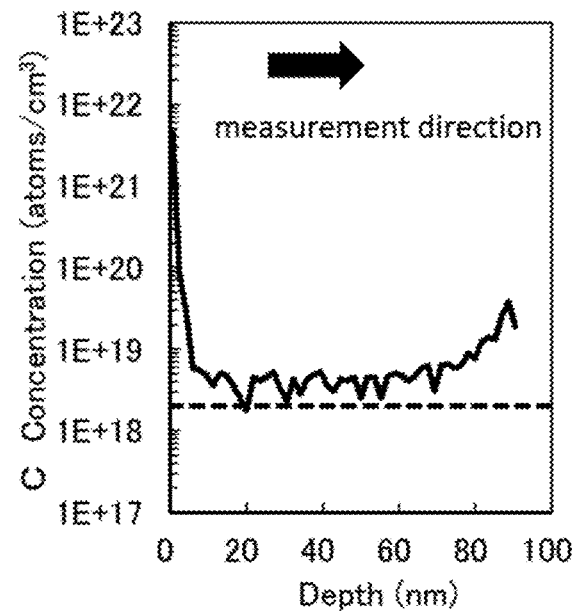
Figure 32C:
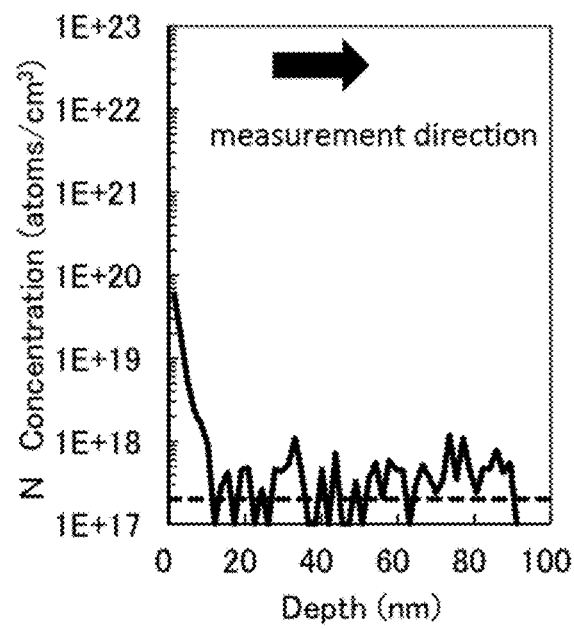
Figure 32D:
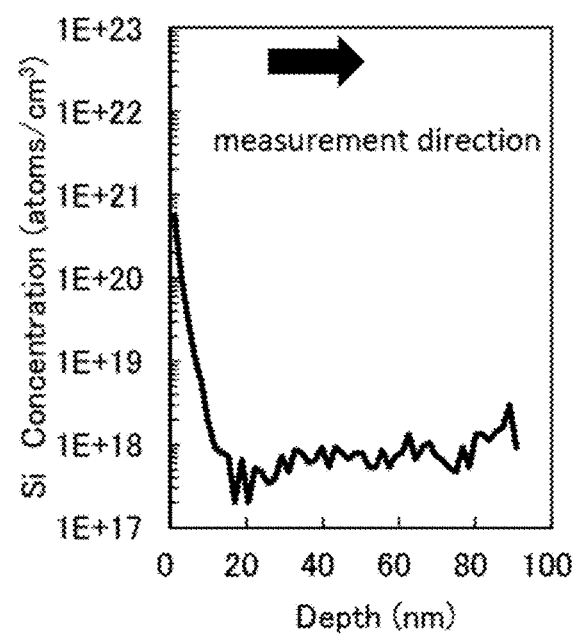

FIG. 32A shows the hydrogen concentration, FIG. 32B shows the carbon concentration, FIG. 32C shows the nitrogen concentration, and FIG. 32D shows the silicon concentration in the oxide semiconductor film. In each of FIGS. 32A to 32D, the vertical axis represents concentration and the horizontal axis represents depth. In each of FIGS. 32A to 32C, a broken line represents the lower measurement limit of an element, and an arrow represents the measurement direction.

As shown in FIGS. 32A to 32D, it was found that the semiconductor film formed with the sputtering apparatus of one embodiment of the present invention has a region with a hydrogen concentration of less than $5\times10^{19}$ atoms/cm$^3$, a region with a carbon concentration of less than $1\times10^{19}$ atoms/cm$^3$, a region with a nitrogen concentration of less than $1\times10^{18}$ atoms/cm$^3$, and a region with a silicon concentration of less than $1\times10^{18}$ atoms/cm$^3$.

Thus, the semiconductor film formed with the sputtering apparatus of one embodiment of the present invention, here, the oxide semiconductor film, has a low impurity concentration.

The structure described in this example can be used in combination with any of the structures described in the other embodiments and examples as appropriate.

Example 2

In this example, sputtering was performed using a target for the sputtering apparatus of one embodiment of the present invention, under conditions capable of forming a CAC-OS film. The target was observed with a scanning electron microscope (SEM), and was subjected to elemental analysis by energy dispersive X-ray spectroscopy (EDX).

In this example, an In—Ga—Zn oxide (atomic ratio, In:Ga:Zn=4:2:3) was used as a target A, a target B, and a target C. The sputtering was performed for an hour under conditions that the pressure was controlled to be 0.4 Pa and a direct current power of 200 W was applied.

In this example, different gases were used in sputtering using the target A, sputtering using the target B, and sputtering using the target C. In the sputtering using the target A, 30 sccm of an argon gas was used. In the sputtering using the target B, 3 sccm of an oxygen gas and 27 sccm of an argon gas were used. In the sputtering using the target C, 30 sccm of an oxygen gas was used.

In other words, the sputtering using the target A was performed in a 100% argon (0% oxygen) atmosphere, the sputtering using the target B was performed in a 10% oxygen atmosphere, and the sputtering using the target C was performed in a 100% oxygen atmosphere. In this example, a condition of the sputtering using the target A or target B was that the proportion of an oxygen gas in the total gases was lower than or equal to 30%, which satisfies the condition capable of favorably forming the CAC-OS described in the above embodiment.

SEM images of the target A, the target B, and the target C used in sputtering were taken. The SEM images were taken with an ultimate field emission scanning electron microscope SU8240 manufactured by Hitachi High-Technologies Corporation at an acceleration voltage of 5 kV and at a magnification of 2000 times.

Figure 33A:
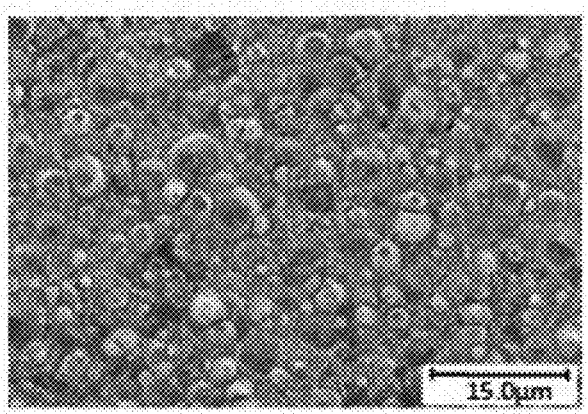
FIGS. 33A to 33C are SEM images of surfaces of targets in Example.
Figure 33B:
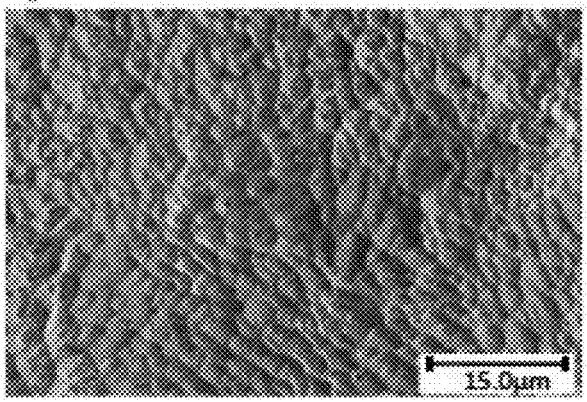
Figure 33C:
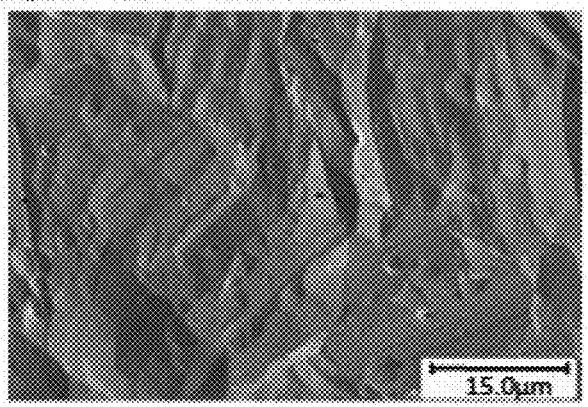

FIG. 33A is the SEM image of the target A, FIG. 33B is the SEM image of the target B, and FIG. 33C is the SEM image of the target C.

As shown in FIGS. 33A and 33B, a number of particulate structure bodies were observed on surfaces of the target A and the target B. Some larger structure bodies were formed on the target A than on the target B. In contrast, as shown in FIG. 33C, structure bodies with high planarity were observed on a surface of the target C as compared with the surfaces of the target A and the target B. Therefore, particulate structure bodies are likely to be formed on the surface of the target with a lower proportion of an oxygen gas in the total sputtering gases.

Furthermore, EDX analysis was performed on the particulate structure bodies of the target A. In the EDX analysis, an energy dispersive X-ray spectrometer EX-370 manufactured by HORIBA, Ltd. was used as an elemental analysis apparatus, and the acceleration voltage was 15 kV.

In the EDX analysis, an EDX spectrum of a point is obtained in such a manner that electron beam irradiation is performed on the point in an analysis target region of a sample, and the energy of characteristic X-rays of the sample generated by the irradiation and its frequency are measured. In this example, peaks of an EDX spectrum of the point were attributed to electron transition to the L shell in an In atom, electron transition to the L shell in a Ga atom, and electron transition to the L shell in a Zn atom, and the proportions of the atoms in the point were calculated.

Figure 34:
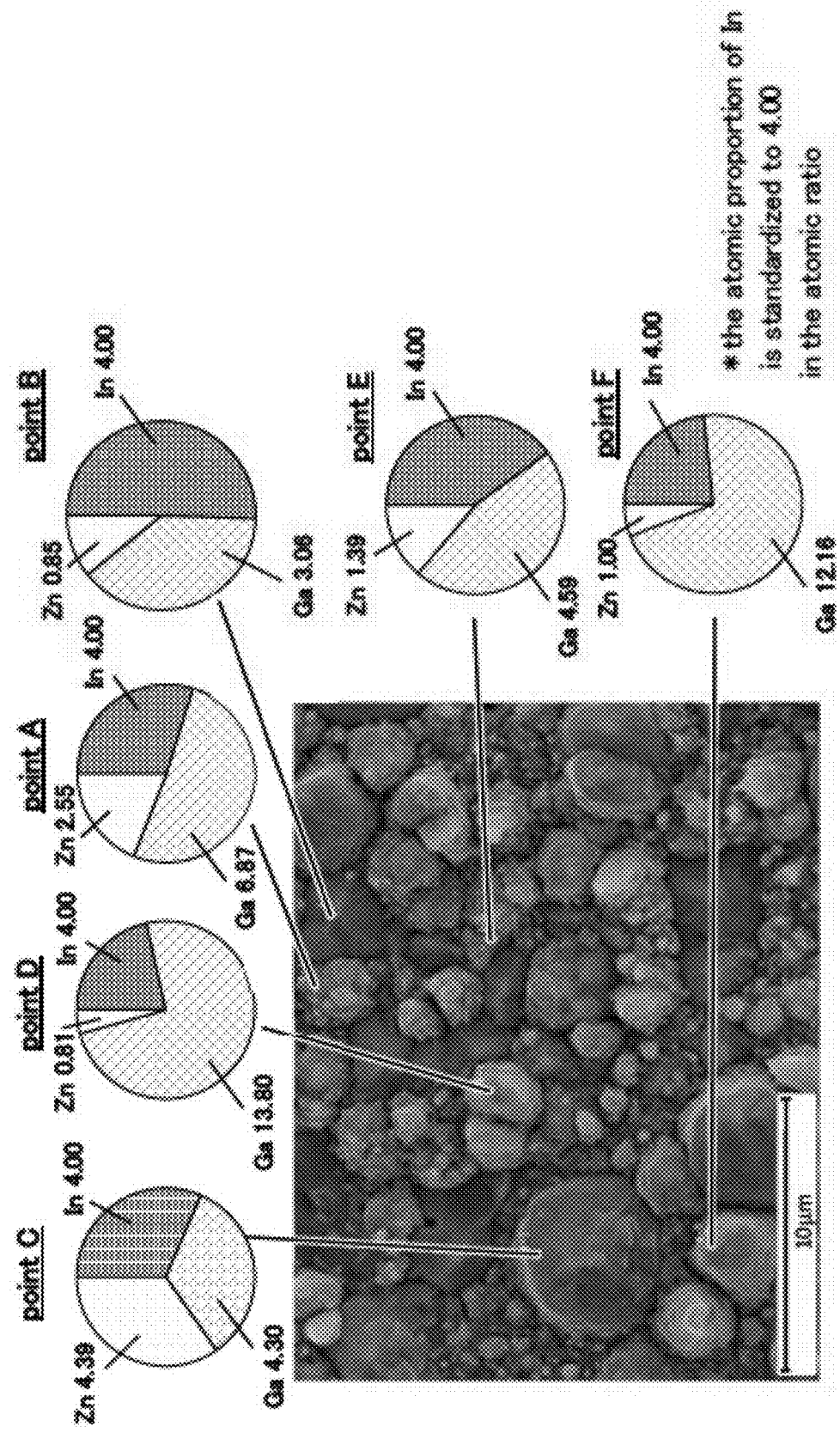
FIG. 34 shows an SEM image of a surface of a target in Example and graphs showing EDX measurement results of the target.

FIG. 34 shows the results of the EDX analysis performed on points A to F on the surface of the target A. Each pie chart in FIG. 34 shows an atomic ratio of an In atom, a Ga atom, and a Zn atom. Note that in the atomic ratio, the atomic proportion of In is standardized to 4.00. As shown in FIG. 34, the atomic proportion of Ga is relatively large in each of the particulate structure bodies on the surface of the target A.

Figure 35:
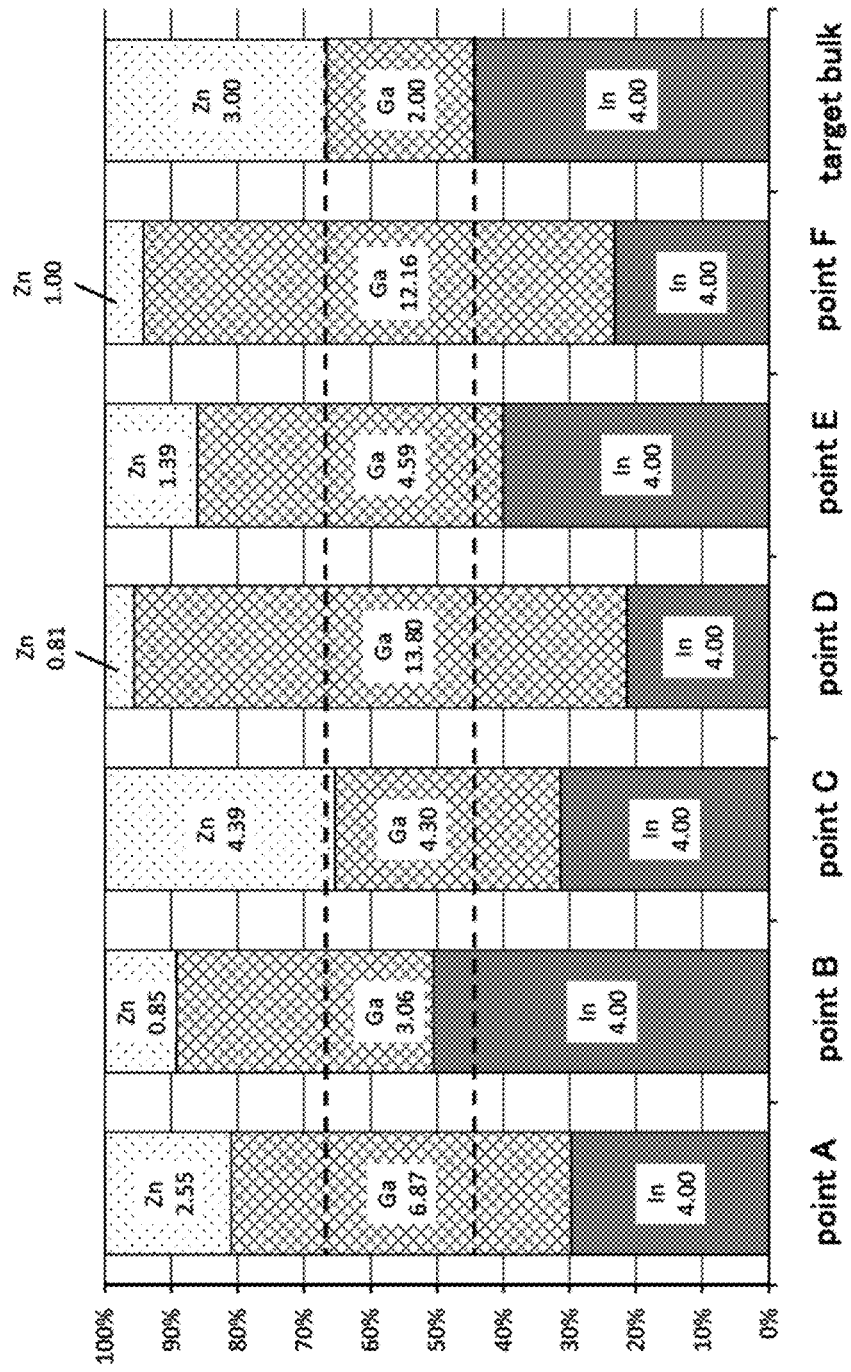
FIG. 35 is a graph showing EDX measurement results of a target in Example.

FIG. 35 is a graph comparing the atomic ratio of an In atom, a Ga atom, and a Zn atom in each of the points A to F and the atomic ratio in the entire target bulk. In the atomic ratio shown in each bar chart in FIG. 35, as in the pie chart in FIG. 34, the atomic proportion of In is standardized to 4.00.

As shown in FIG. 35, the atomic proportion of Ga in each particulate structure body on the surface of the target A is larger than that in the entire target bulk. Accordingly, particulate structure bodies containing a number of Ga atoms are formed on the surface of the target A. These correspond to the segregation regions 2504 containing a number of Ga atoms shown in FIGS. 5B and 5C in the above embodiment.

Figure 36:
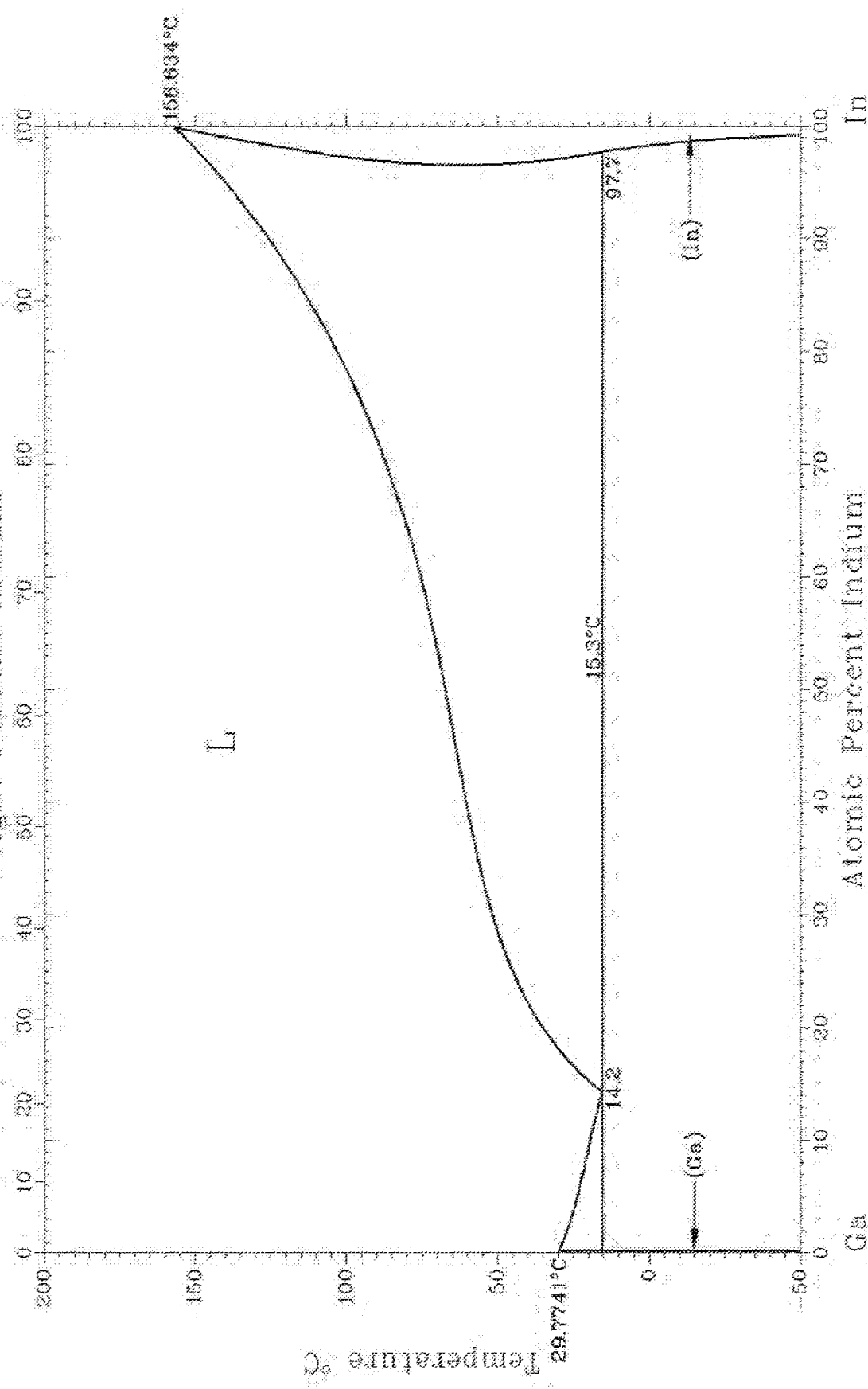
FIG. 36 is a Ga—In equilibrium diagram.
Figure 37:
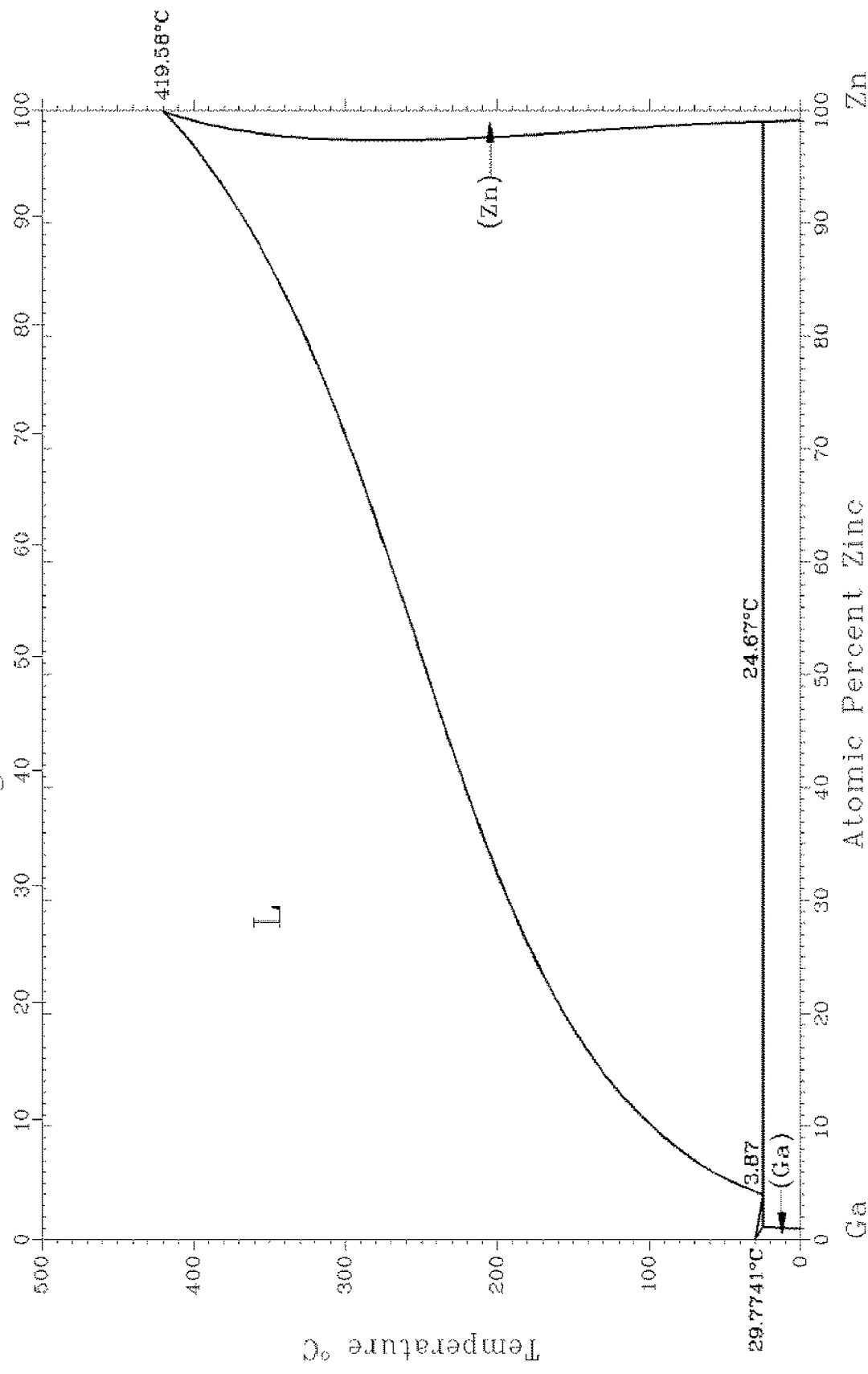
FIG. 37 is a Ga—Zn equilibrium diagram.

Here, FIG. 36 is a Ga—In equilibrium diagram, and FIG. 37 is a Ga—Zn equilibrium diagram. The Ga—In equilibrium diagram in FIG. 36 was obtained by designating Ga and In in a CD-ROM (Binary alloy phase diagrams, Second Edition, Plus Updates on CD-ROM Version 1.0). The Ga—Zn equilibrium diagram in FIG. 37 was obtained by designating Ga and Zn in the CD-ROM.

As shown in FIG. 36, In solubility is significantly small in the Ga—In system having an atomic percentage of Ga of approximately 100 atomic %. In addition, as shown in FIG. 37, Zn solubility is approximately 1 atomic % in the Ga—Zn system having an atomic percentage of Ga of approximately 100 atomic %. In other words, Ga in a Ga-based solid solution forms a solid solution only with a very small amount of In and/or Zn.

This indicates that, as described in the above embodiment, in the process of forming the segregation region 2504 by dissolution of part of the target and Ga aggregation, In and/or Zn is expeled out from the segregation region 2504 and In and/or Zn segregates outside the segregation region 2504.

As described above, the target used in sputtering under conditions suitable for forming a CAC-OS film agreed with the model illustrated in FIGS. 5A to 5C described in the above embodiment.

The structure described in this example can be used in combination with any of the structures described in the other embodiments and examples as appropriate.

REFERENCE NUMERALS

10: sputtering apparatus, 12: cassette port, 14: alignment port, 16: atmosphere-side substrate supply chamber, 18: atmosphere-side substrate transfer chamber, 20a: load lock chamber, 20b: unload lock chamber, 22: transfer chamber, 24: substrate heating chamber, 26a: deposition chamber, 26b: deposition chamber, 26c: deposition chamber, 28: gate valve, 30: transfer robot, 32: heating stage, 34: vacuum pump, 36: gas supply device, 38: gas refining device, 40: cryopump, 42: target, 42a: target, 42b: target, 44: deposition shield, 46: substrate stage, 48: substrate, 50: gas heating mechanism, 52: turbo molecular pump, 54: cryotrap, 56: stage, 60: backing plate, 60a: backing plate, 60b: backing plate, 62a: magnet unit, 62b: magnet unit, 64a: target holder, 64b: target holder, 66: member, 68N1: magnet, 68N2: magnet, 68S: magnet, 70a: magnet holder, 72: cathode, 72a: line of magnetic force, 72b: line of magnetic force, 100: transistor, 102: substrate, 104: insulating film, 106: conductive film, 108: oxide semiconductor film, 108a: oxide semiconductor film, 108n: region, 108j: region, 110: insulating film, 110_0: insulating film, 112: conductive film, 112_0: conductive film, 116: insulating film, 118: insulating film, 120a: conductive film, 120b: conductive film, 122: insulating film, 140: mask, 141a: opening, 141b: opening, 143: opening, 150: transistor, 300A: transistor, 300B: transistor, 302: substrate, 304: conductive film, 306: insulating film, 307: insulating film, 308: oxide semiconductor film, 308n: region, 312a: conductive film, 312b: conductive film, 314: insulating film, 316: insulating film, 318: insulating film, 320a: conductive film, 320b: conductive film, 342a: opening, 342b: opening, 342c: opening, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 600: display panel, 601: transistor, 604: connection portion, 605: transistor, 606: transistor, 607: connection portion, 612: liquid crystal layer, 613: conductive film, 617: insulating film, 620: insulating film, 621: insulating film, 623: conductive film, 631: coloring layer, 632: light-blocking film, 633a: alignment film, 633b: alignment film, 634: coloring layer, 635: conductive film, 640: liquid crystal element, 641: adhesive layer, 642: adhesive layer, 643: conductive film, 644: EL layer, 645a: conductive film, 645b: conductive film, 646: insulating film, 647: insulating film, 648: conductive film, 649: connection layer, 651: substrate, 652: conductive film, 653: semiconductor film, 654: conductive film, 655: opening, 656: polarizing plate, 659: circuit, 660: light-emitting element, 661: substrate, 662: display portion, 663: conductive film, 666: wiring, 672: FPC, 673: IC, 681: insulating film, 682: insulating film, 683: insulating film, 684: insulating film, 685: insulating film, 686: connector, 687: connection portion, 700: display device, 701: substrate, 702: pixel portion, 704: source driver circuit portion, 705: substrate, 706: gate driver circuit portion, 708: FPC terminal portion, 710: signal line, 711: wiring portion, 712: sealing material, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure, 780: anisotropic conductive film, 782: light-emitting element, 786: EL layer, 788: conductive film, 790: capacitor, 791: touch panel, 792: insulating film, 793: electrode, 794: electrode, 795: insulating film, 796: electrode, 797: insulating film, 2190: plasma, 2192: cation, 2504: segregation region, 2504a: sputtered particle, 2506: segregation region, 2506a: sputtered particle, 6651: substrate, 7000: display module, 7001: upper cover, 7002: lower cover, 7003: FPC, 7004: touch panel, 7005: FPC, 7006: display panel, 7007: backlight, 7008: light source, 7009: frame, 7010: printed board, 7011: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing band, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal.

This application is based on Japanese Patent Application Serial No. 2016-113023 filed with Japan Patent Office on Jun. 6, 2016 and Japanese Patent Application Serial No. 2017-018825 filed with Japan Patent Office on Feb. 3, 2017, the entire contents of which are hereby incorporated by reference.

The invention claimed is:

1. A method for forming an oxide semiconductor film, comprising:
    setting a sputtering target and a substrate in a deposition chamber;
    introducing a deposition gas into the deposition chamber; and
    applying voltage to the sputtering target so as to form the oxide semiconductor film over the substrate,
    wherein the sputtering target comprises indium, gallium, and zinc,
    wherein the sputtering target comprises a first region and a second region,
    wherein an atomic proportion of gallium of the first region is higher than an atomic proportion of gallium of the whole sputtering target,
    wherein an atomic proportion of indium of the second region is higher than an atomic proportion of indium of the whole sputtering target,
    wherein the first region has a spherical shape, and
    wherein a proportion of the oxygen gas in the deposition gas is higher than 30% and lower than or equal to 100%.

2. The method for forming an oxide semiconductor film according to claim 1,
    wherein the first region is between a surface of the sputtering target and the second region.

3. The method for forming an oxide semiconductor film according to claim 1,
    wherein one or both of the first region and the second region comprises a cluster.

4. The method for forming an oxide semiconductor film according to claim 1,
    wherein setting the sputtering target and the substrate, introducing the deposition gas, and applying voltage to the sputtering target are performed at a temperature without intentional heating.

5. The method for forming an oxide semiconductor film according to claim 1, further comprising introducing nitrogen molecules to the deposition chamber after introducing the deposition gas and before applying voltage to the sputtering target.

6. A method for forming an oxide semiconductor film, comprising:
    setting a sputtering target and a substrate in a deposition chamber;
    introducing a deposition gas into the deposition chamber; and
    applying voltage to the sputtering target so as to form the oxide semiconductor film over the substrate,
    wherein the sputtering target comprises indium, gallium, and zinc,
    wherein the sputtering target comprises a first region and a second region,
    wherein the first region is a region where gallium is segregated and is a Ga-rich region,
    wherein the second region is a region where indium is segregated and is an In-rich region,
    wherein the first region has a spherical shape, and
    wherein a proportion of the oxygen gas in the deposition gas is higher than 30% and lower than or equal to 100%.

7. The method for forming an oxide semiconductor film according to claim 6,
    wherein the first region is between a surface of the sputtering target and the second region.

8. The method for forming an oxide semiconductor film according to claim 6,
    wherein one or both of the first region and the second region comprises a cluster.

9. The method for forming an oxide semiconductor film according to claim 6,
    wherein setting the sputtering target and the substrate, introducing the deposition gas, and applying voltage to the sputtering target are performed at a temperature without intentional heating.

10. The method for forming an oxide semiconductor film according to claim 6, further comprising introducing nitrogen molecules to the deposition chamber after introducing the deposition gas and before applying voltage to the sputtering target.

11. A method for forming an oxide semiconductor film, comprising:
    setting a sputtering target and a substrate in a deposition chamber;
    introducing a deposition gas into the deposition chamber; and
    applying voltage to the sputtering target so as to form the oxide semiconductor film over the substrate,
    wherein the sputtering target comprises indium, gallium, and zinc,
    wherein the sputtering target comprises a first region and a second region,
    wherein an atomic proportion of gallium of the first region is higher than an atomic proportion of gallium of the whole sputtering target,
    wherein an atomic proportion of indium of the second region is higher than an atomic proportion of indium of the whole sputtering target,
    wherein the first region has a spherical shape, and
    wherein a proportion of the oxygen gas in the deposition gas is higher than or equal to 0% and lower than or equal to 30%.

12. The method for forming an oxide semiconductor film according to claim 11, wherein the first region is between a surface of the sputtering target and the second region.

13. The method for forming an oxide semiconductor film according to claim 11,
wherein one or both of the first region and the second region comprises a cluster.

14. The method for forming an oxide semiconductor film according to claim 11,
wherein setting the sputtering target and the substrate, introducing the deposition gas, and applying voltage to the sputtering target are performed at a temperature without intentional heating.

15. The method for forming an oxide semiconductor film according to claim 11, further comprising introducing nitrogen molecules to the deposition chamber after introducing the deposition gas and before applying voltage to the sputtering target.

16. A method for forming an oxide semiconductor film, comprising:
setting a sputtering target and a substrate in a deposition chamber;
introducing a deposition gas into the deposition chamber; and
applying voltage to the sputtering target so as to form the oxide semiconductor film over the substrate,
wherein the sputtering target comprises indium, gallium, and zinc,
wherein the sputtering target comprises a first region and a second region,
wherein the first region is a region where gallium is segregated and is a Ga-rich region,
wherein the second region is a region where indium is segregated and is an In-rich region,
wherein the first region has a spherical shape, and
wherein a proportion of the oxygen gas in the deposition gas is higher than or equal to 0% and lower than or equal to 30%.

17. The method for forming an oxide semiconductor film according to claim 16,
wherein the first region is between a surface of the sputtering target and the second region.

18. The method for forming an oxide semiconductor film according to claim 16,
wherein one or both of the first region and the second region comprises a cluster.

19. The method for forming an oxide semiconductor film according to claim 16,
wherein setting the sputtering target and the substrate, introducing the deposition gas, and applying voltage to the sputtering target are performed at a temperature without intentional heating.

20. The method for forming an oxide semiconductor film according to claim 16, further comprising introducing nitrogen molecules to the deposition chamber after introducing the deposition gas and before applying voltage to the sputtering target.

* * * * *